US009583630B2

(12) United States Patent
Masuoka et al.

(10) Patent No.: US 9,583,630 B2
(45) Date of Patent: Feb. 28, 2017

(54) METHOD FOR PRODUCING SEMICONDUCTOR DEVICE AND SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/228,052

(22) Filed: Aug. 4, 2016

(65) Prior Publication Data

US 2016/0343871 A1 Nov. 24, 2016

Related U.S. Application Data

(63) Continuation of application No. PCT/JP2014/069611, filed on Jul. 24, 2014.

(51) Int. Cl.
*H01L 21/8234* (2006.01)
*H01L 29/786* (2006.01)
(Continued)

(52) U.S. Cl.
CPC .. *H01L 29/78618* (2013.01); *H01L 29/42392* (2013.01); *H01L 29/66545* (2013.01);
(Continued)

(58) Field of Classification Search
CPC ......... H01L 21/823828; H01L 27/0886; H01L 29/785
(Continued)

(56) References Cited

U.S. PATENT DOCUMENTS 5,258,635 A 11/1993 Nitayama et al.
8,178,399 B1 5/2012 Masuoka et al.
(Continued)

FOREIGN PATENT DOCUMENTS

JP 02071556 A 3/1990
JP H02188966 A 7/1990
(Continued)

OTHER PUBLICATIONS

Wu C.C., et al., "High Performance 22/20nm FinFET CMOS Devices with Advanced High-K/Metal Gate Scheme", 2010 IEEE International Electron Devices Meeting, San Francisco, CA, 2010; pp. 27.1.1-27.1.4.
(Continued)

*Primary Examiner* — George Fourson, III
(74) *Attorney, Agent, or Firm* — Brinks Gilson & Lione

(57) ABSTRACT

A method for producing a semiconductor device includes a first step of forming a fin-shaped semiconductor layer on a semiconductor substrate, and forming a first insulating film; a second step of forming a second insulating film, and forming a pillar-shaped semiconductor layer, a first dummy gate, and a first hard mask; a third step of forming a second hard mask on a side wall of the first hard mask, and etching a second polysilicon so as to be left on side walls of the first dummy gate and the pillar-shaped semiconductor layer to form a second dummy gate; and a fourth step of forming a fifth insulating film around the second dummy gate, etching the fifth insulating film so as to have a sidewall shape to form a sidewall formed of the fifth insulating film, and forming a first epitaxially grown layer on the fin-shaped semiconductor layer.

10 Claims, 47 Drawing Sheets

(51) Int. Cl.
*H01L 29/423* (2006.01)
*H01L 29/66* (2006.01)
*H01L 29/78* (2006.01)
*H01L 27/088* (2006.01)
*H01L 21/8238* (2006.01)

(52) U.S. Cl.
CPC ........ *H01L 29/66666* (2013.01); *H01L 29/78* (2013.01); *H01L 29/78642* (2013.01); *H01L 29/78696* (2013.01); H01L 21/823828 (2013.01); H01L 27/0886 (2013.01); H01L 29/785 (2013.01)

(58) Field of Classification Search
USPC .......................................... 257/288; 438/284
See application file for complete search history.

(56) References Cited

U.S. PATENT DOCUMENTS

| | | |
|---|---|---|
| 8,188,537 B2 | 5/2012 | Masuoka et al. |
| 8,647,947 B2 | 2/2014 | Masuoka et al. |
| 9,064,899 B2 | 6/2015 | Godo et al. |
| 2005/0161739 A1* | 7/2005 | Anderson ............... H01L 21/84 257/347 |
| 2006/0011994 A1 | 1/2006 | Lin et al. |
| 2016/0190317 A1* | 6/2016 | Liu ..................... H01L 29/7848 257/192 |
| 2016/0225791 A1* | 8/2016 | Zang ................. H01L 29/66795 |

FOREIGN PATENT DOCUMENTS

| | | |
|---|---|---|
| JP | H03145761 A | 6/1991 |
| JP | 2009182317 A | 8/2009 |
| JP | 2010258345 A | 11/2010 |
| JP | 2013258427 A | 12/2013 |
| JP | 2014060286 A | 4/2014 |
| WO | 2014073103 A1 | 5/2014 |

OTHER PUBLICATIONS

Mistry, K., et al., "A 45nm Logic Technology with High-k+Metal Gate Transistors, Strained Silicon, 9 Cu Interconnect Layers, 193nm Dry Patterning, and 100% Pb-free Packaging", 2007 IEEE International Electron Devices Meeting, Washington, DC, 2007, pp. 247-250.

* cited by examiner

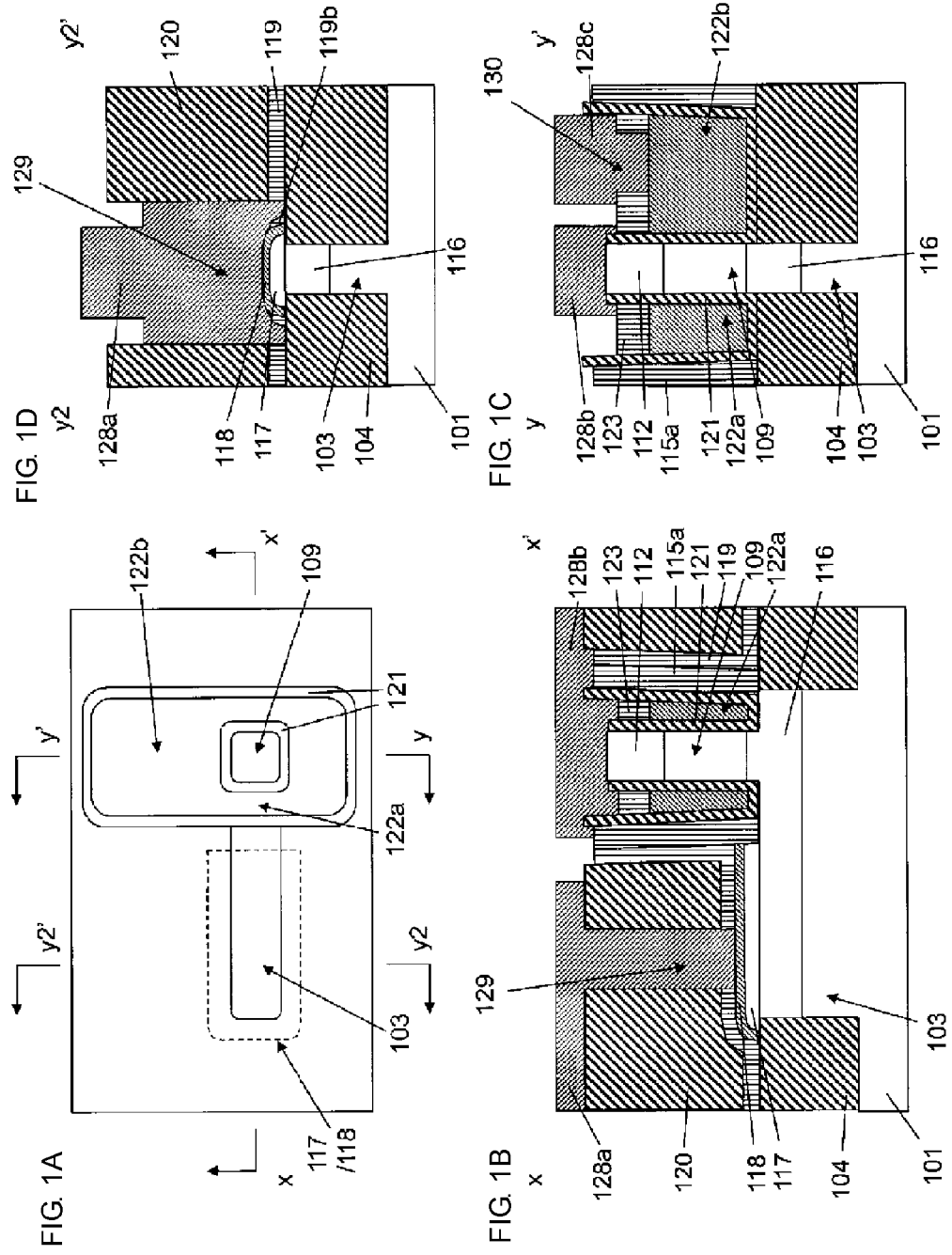

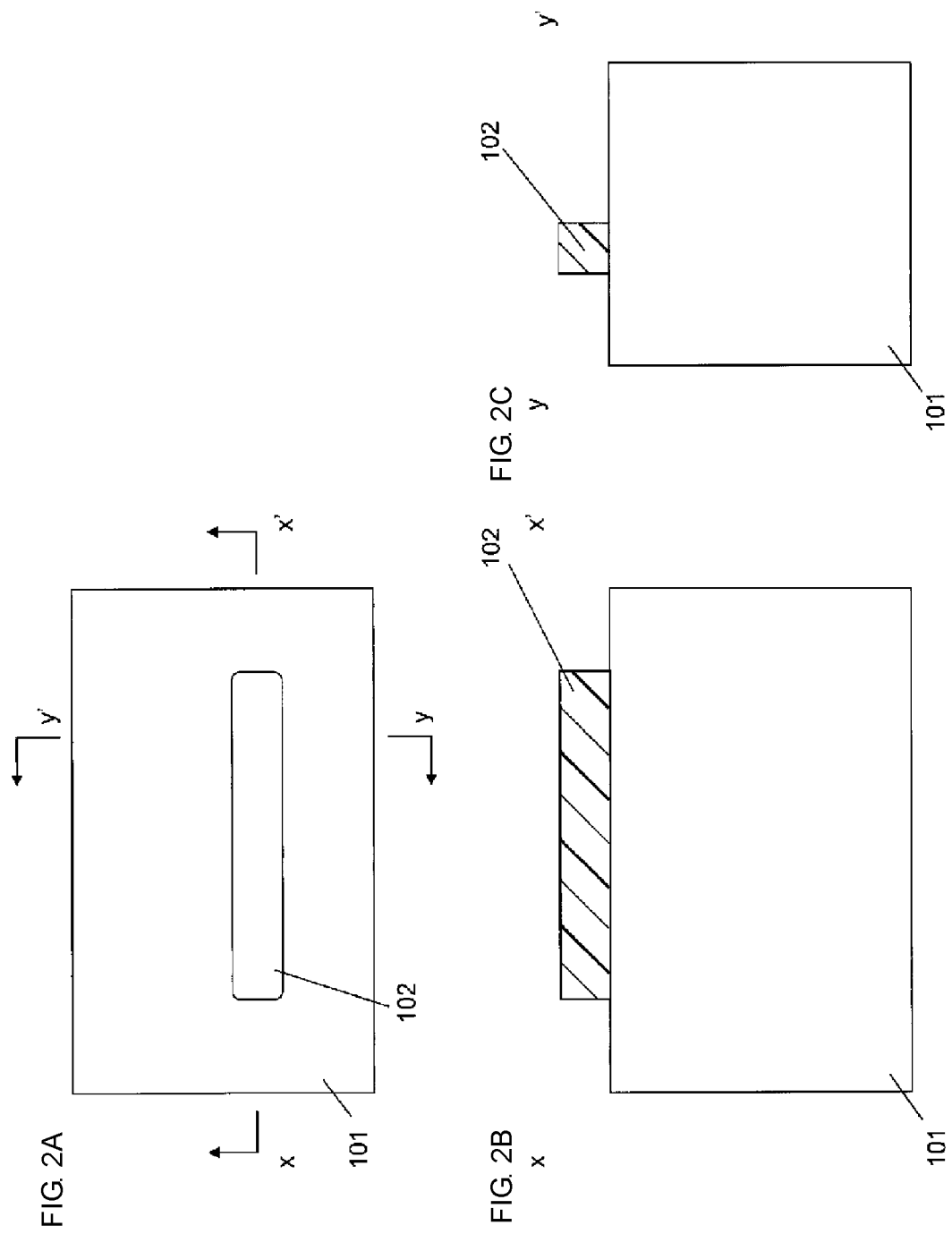

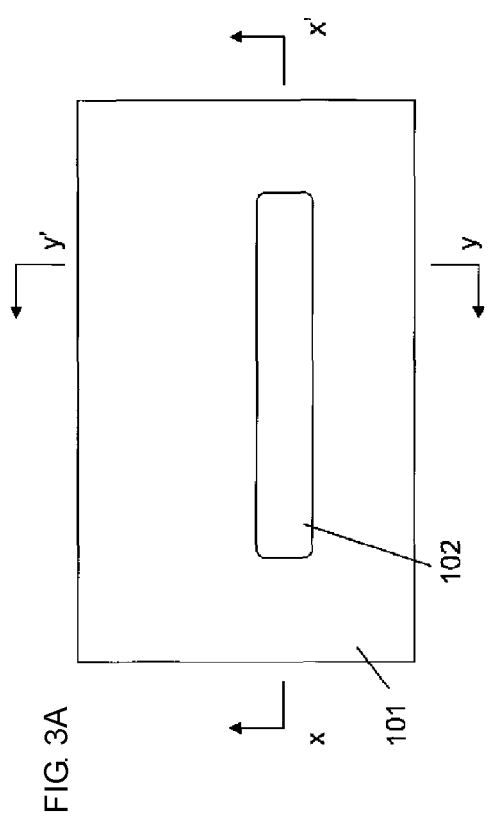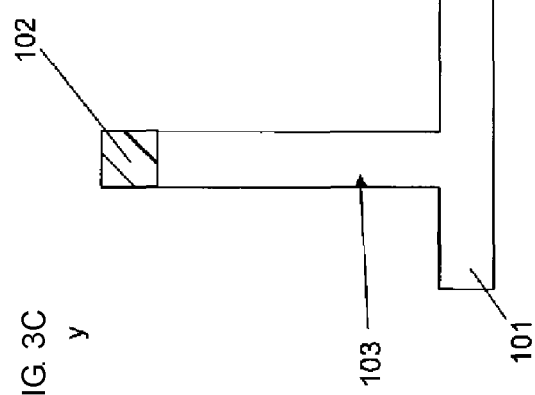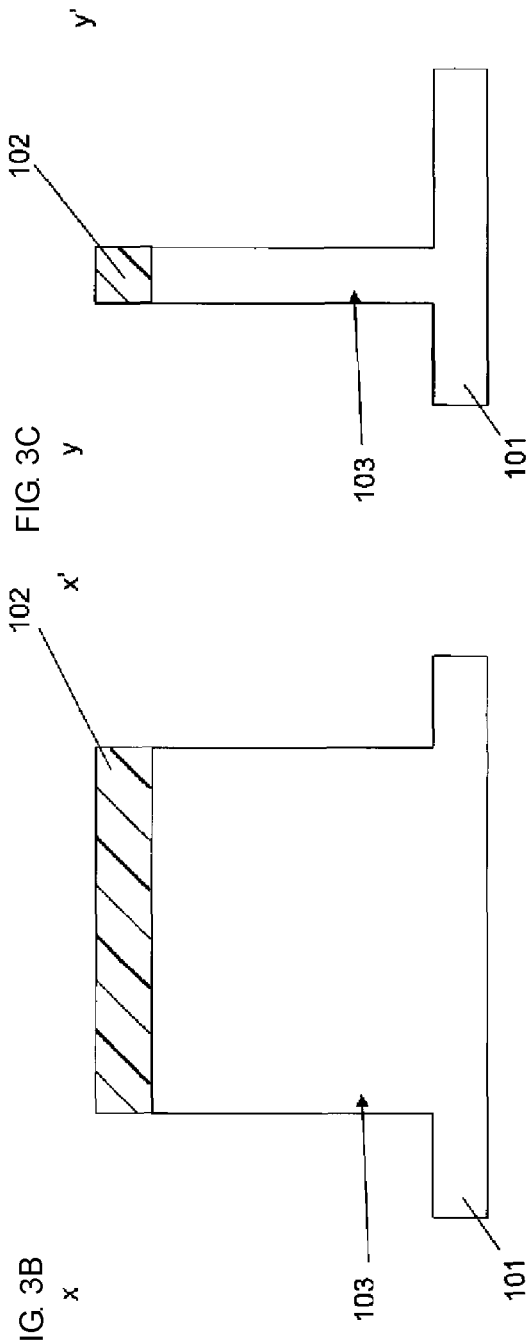

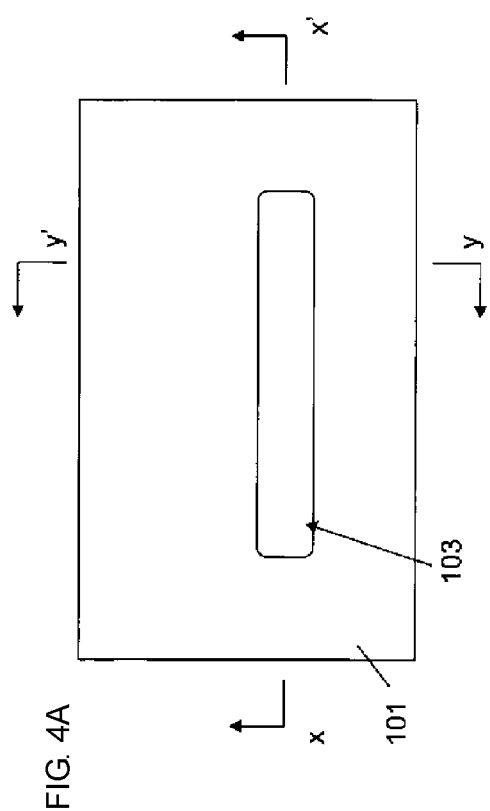
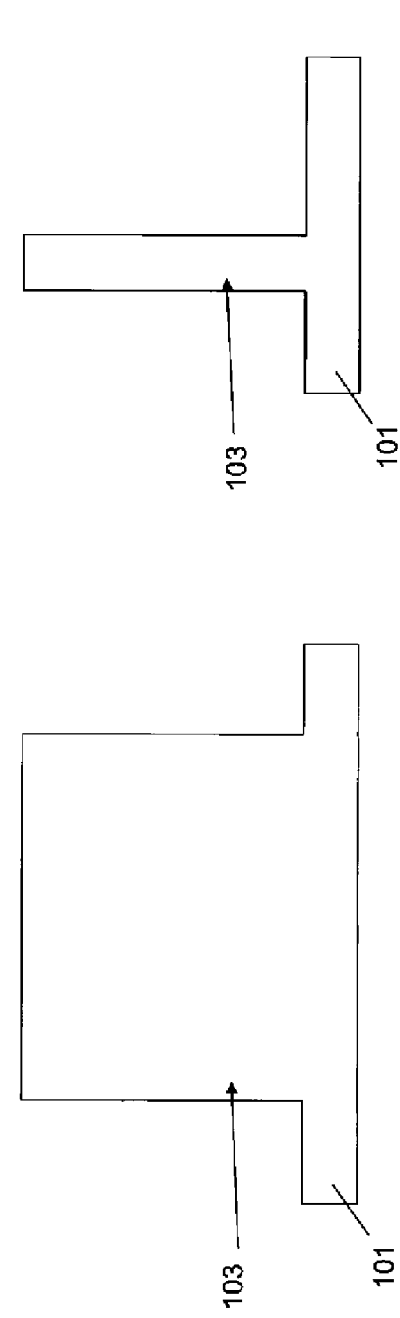

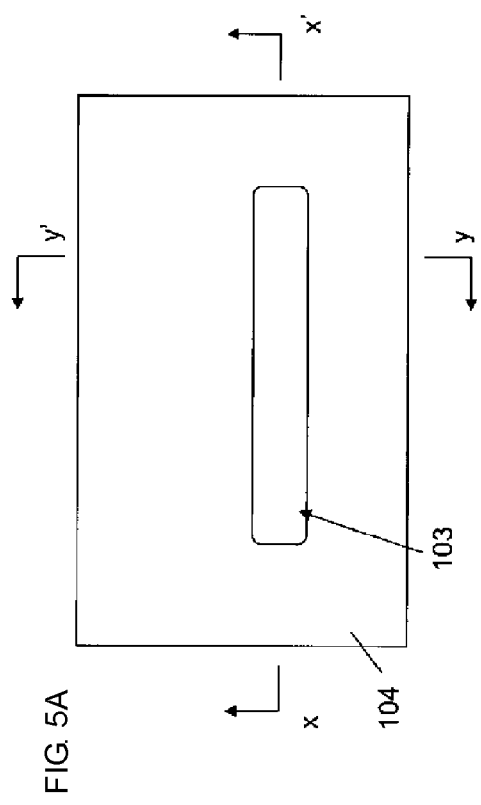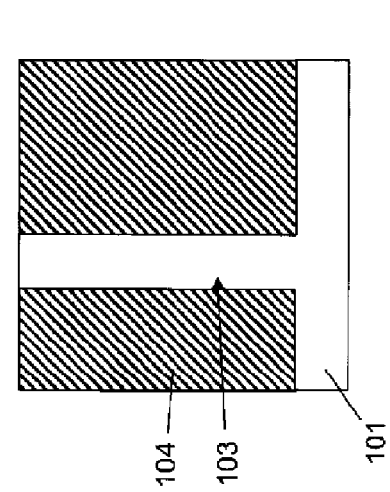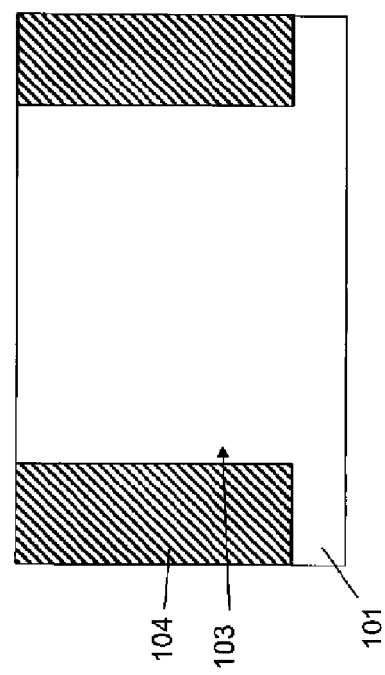
FIG. 5A
FIG. 5B
FIG. 5C

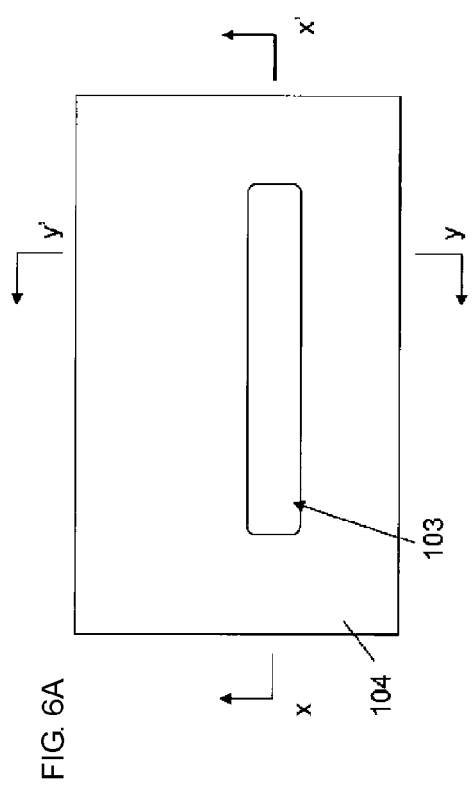
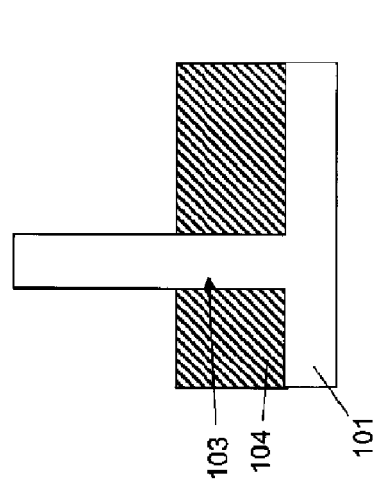
FIG. 6A
FIG. 6B
FIG. 6C

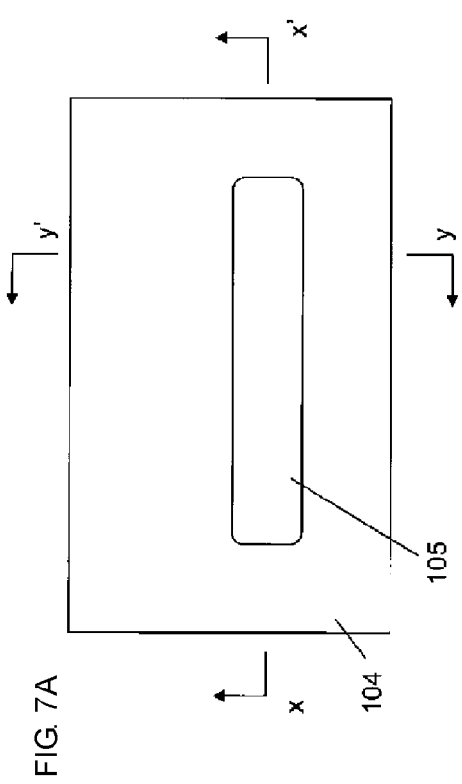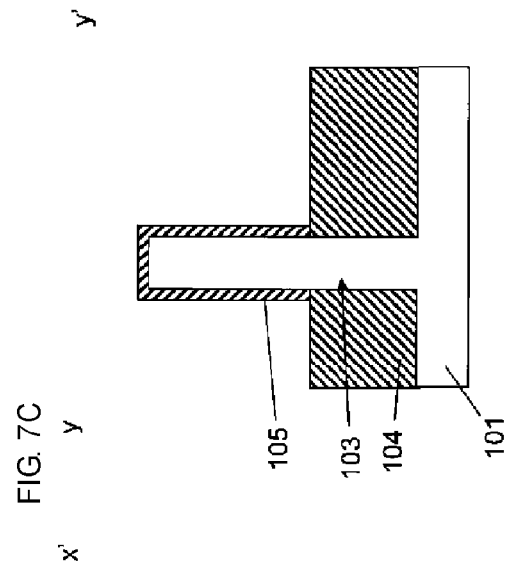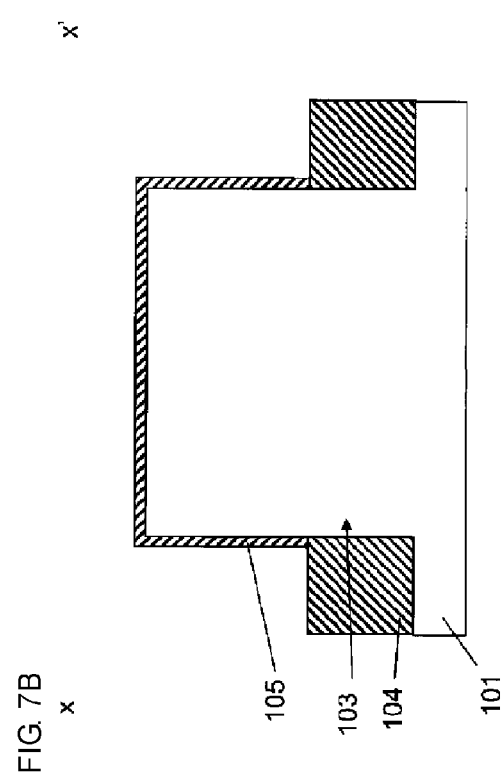

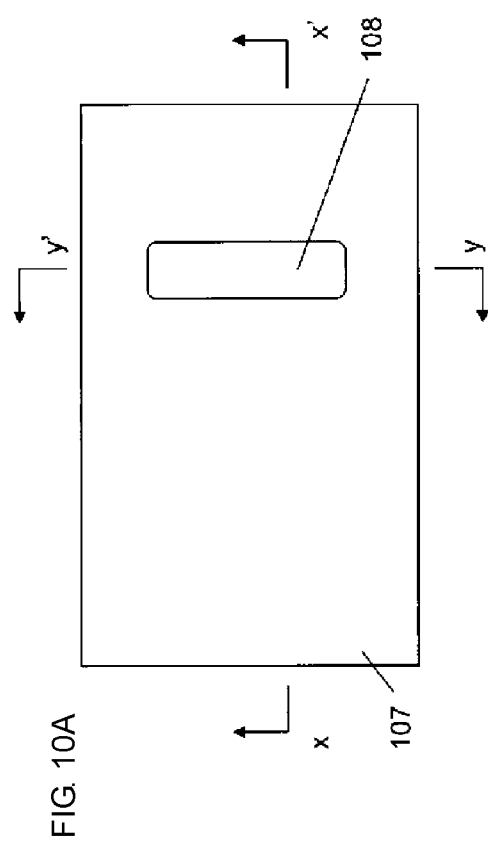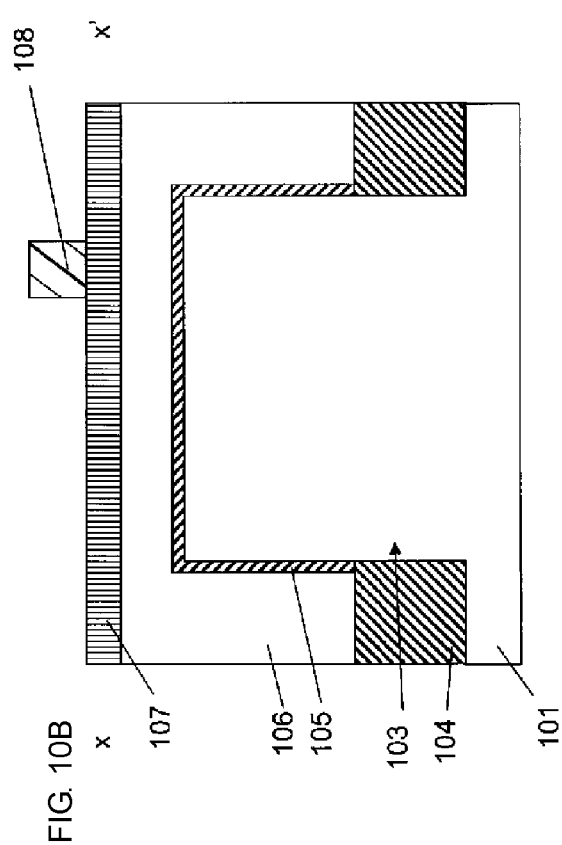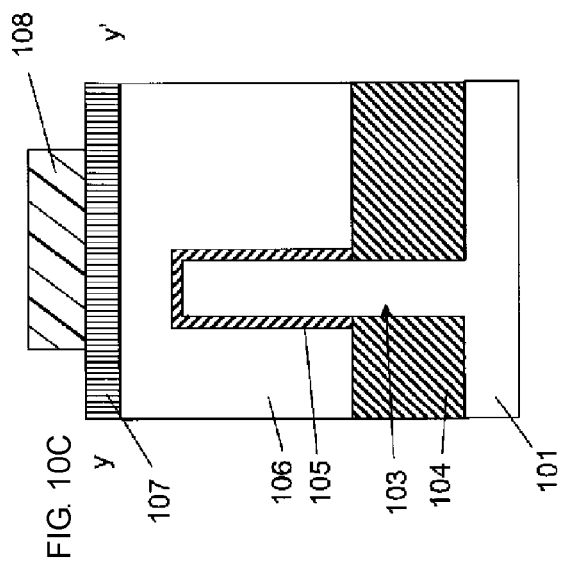

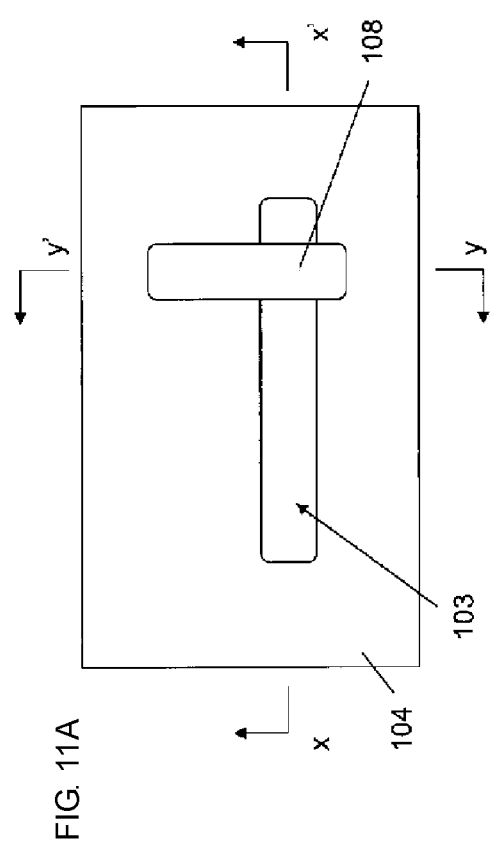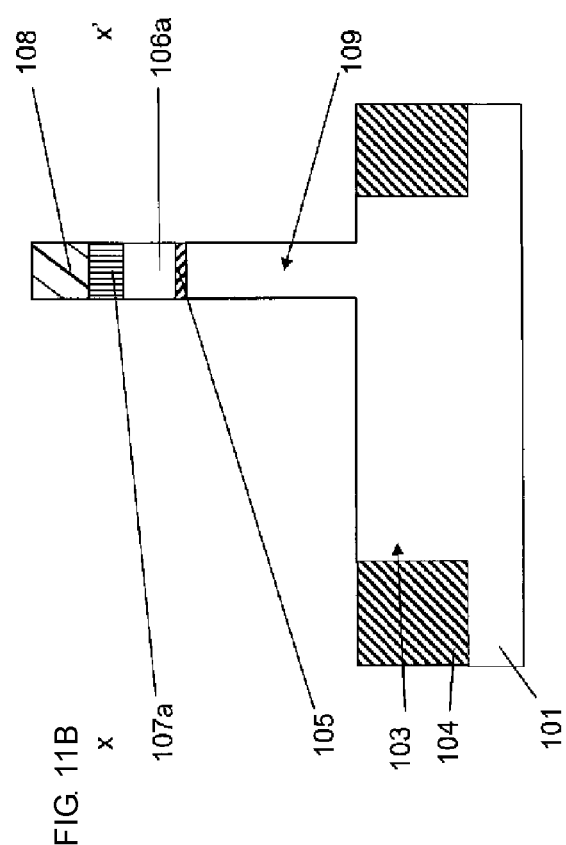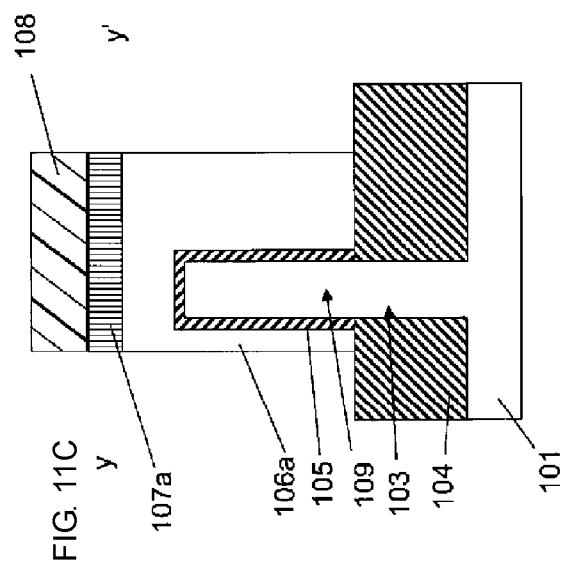

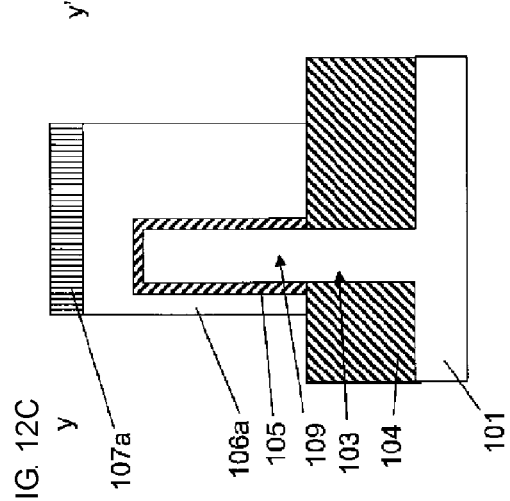
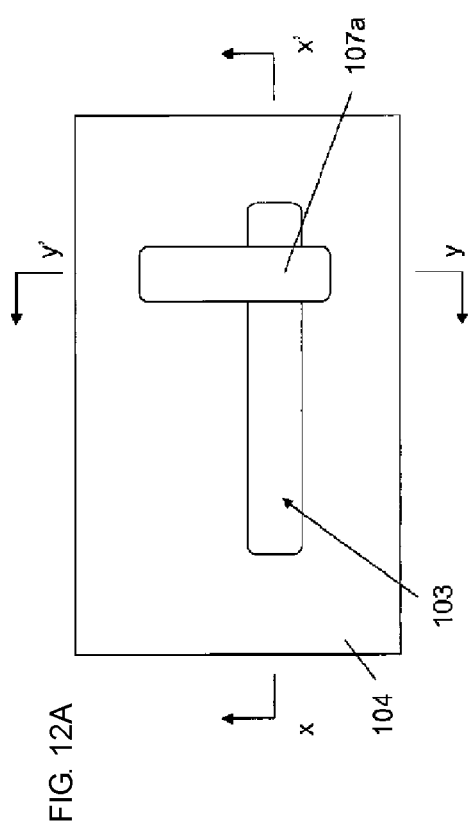
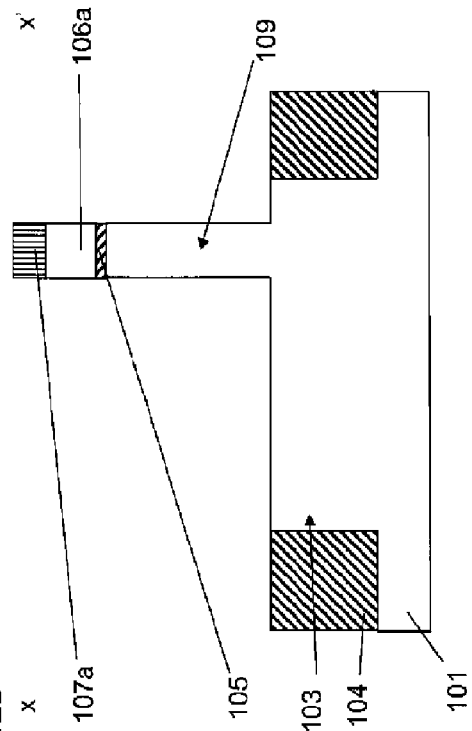

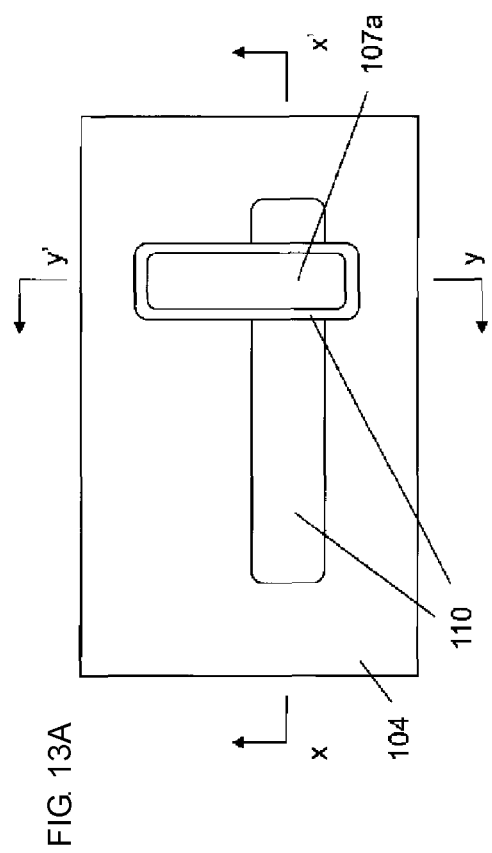
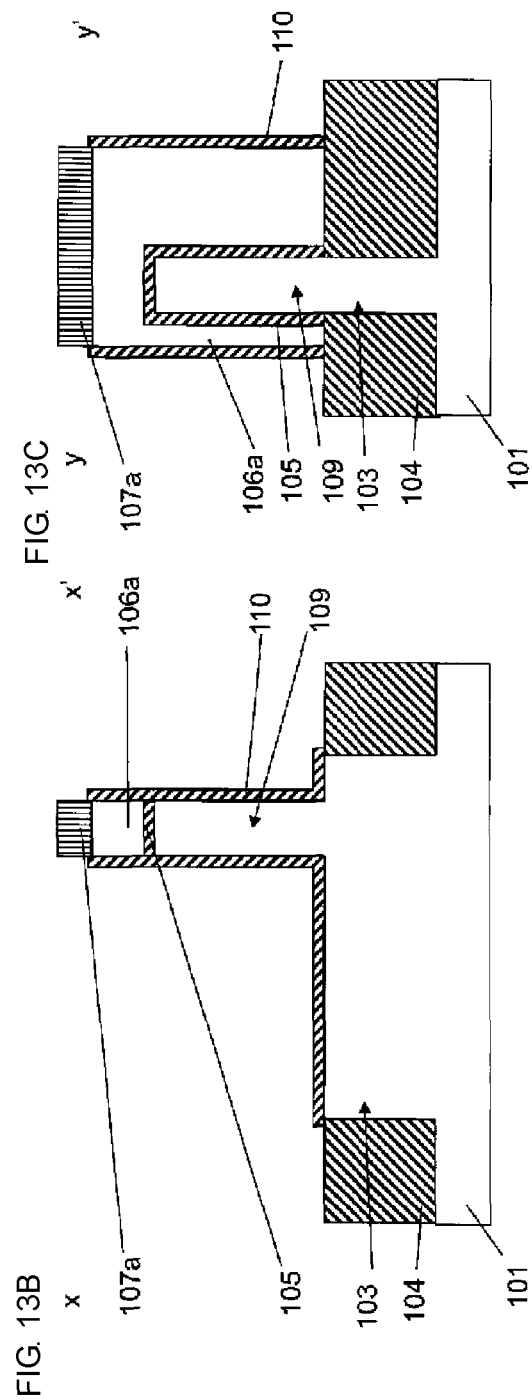

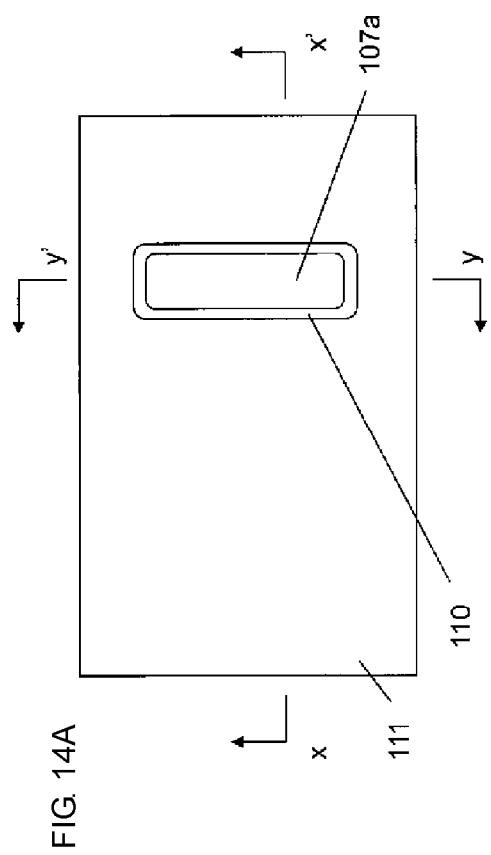
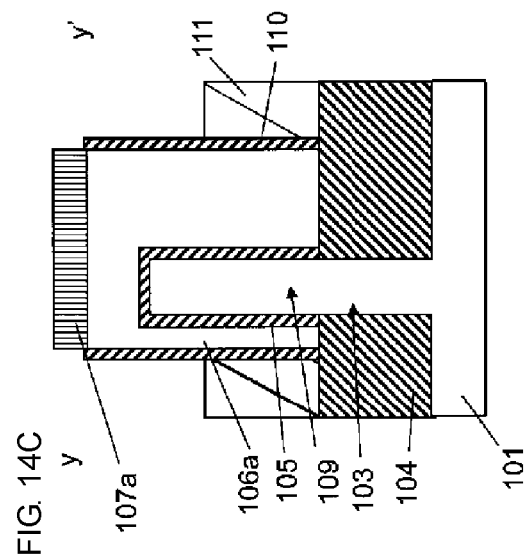
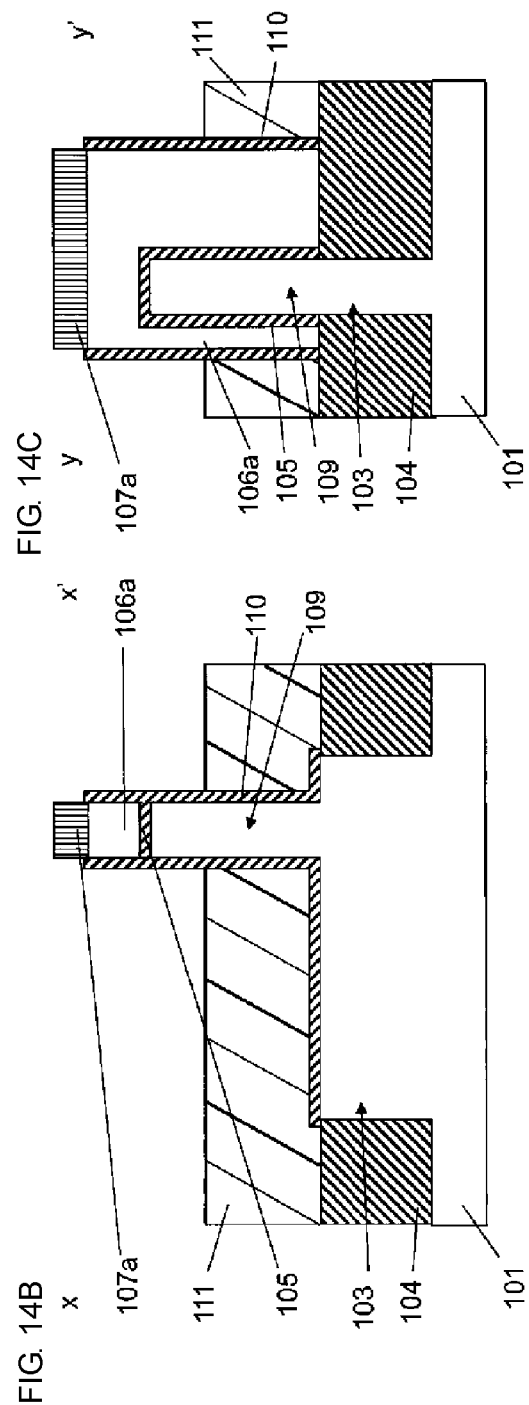
FIG. 14A
FIG. 14B
FIG. 14C

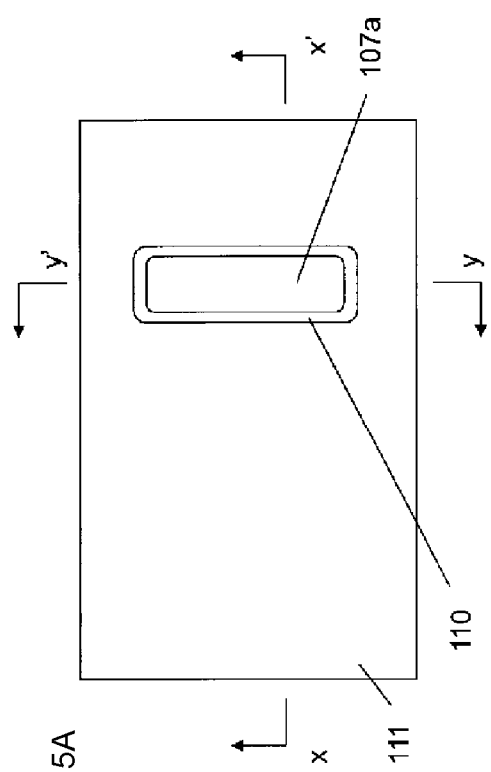
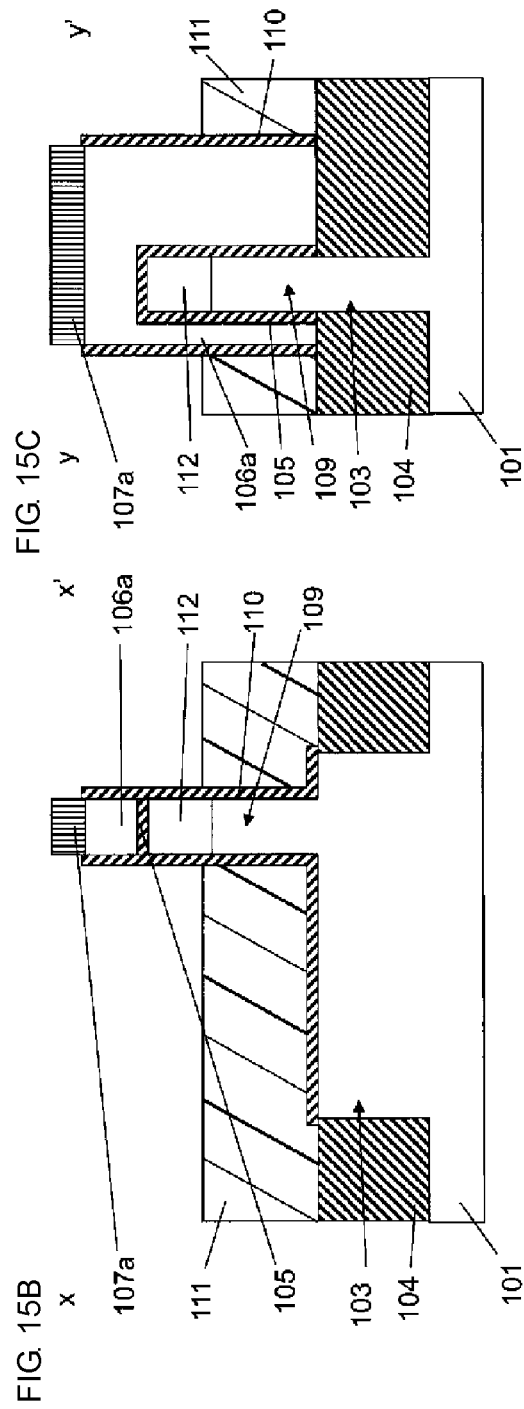
FIG. 15A
FIG. 15B
FIG. 15C

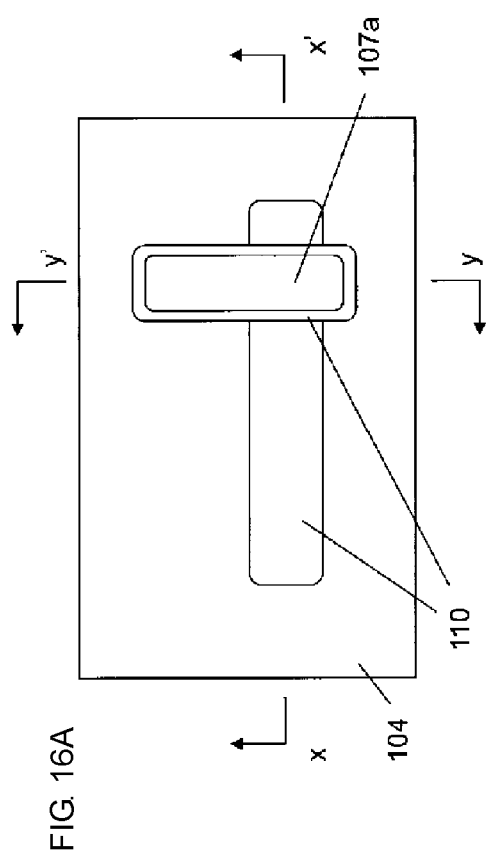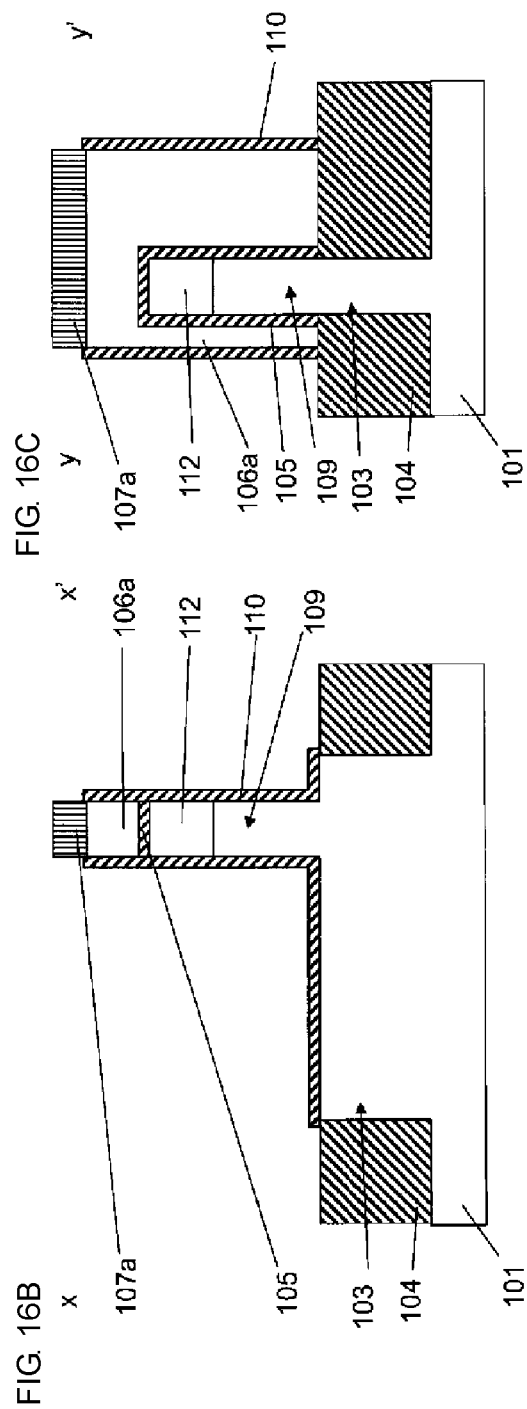

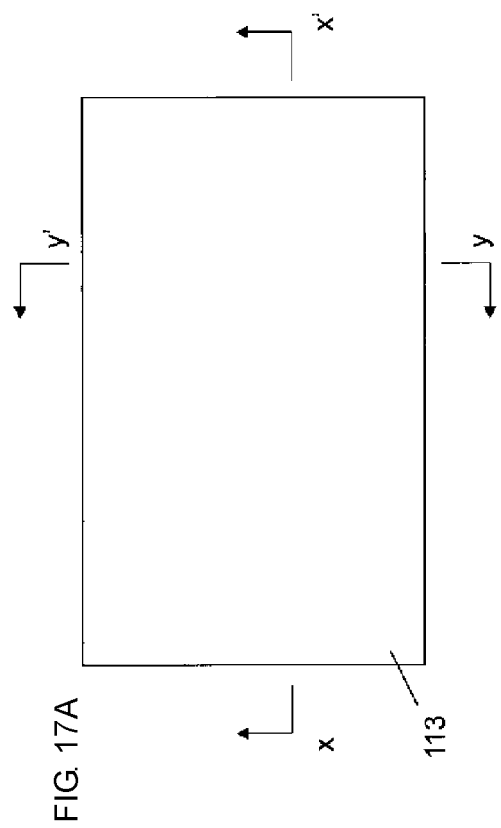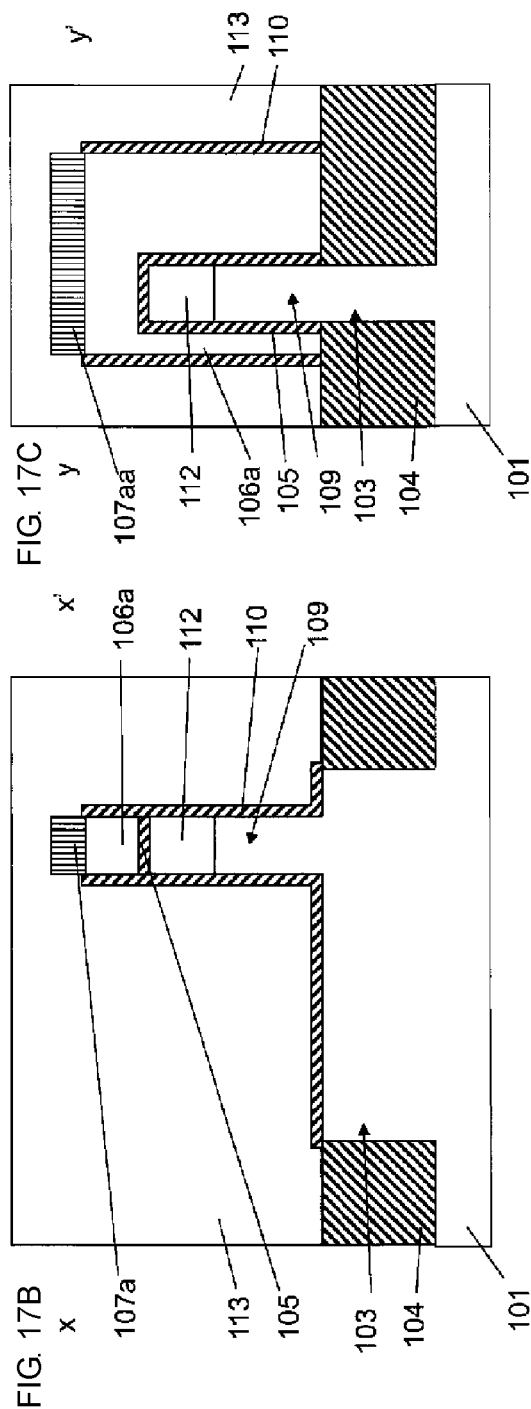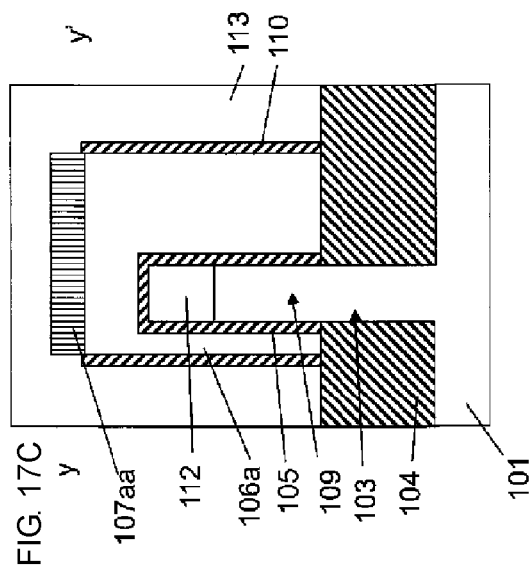

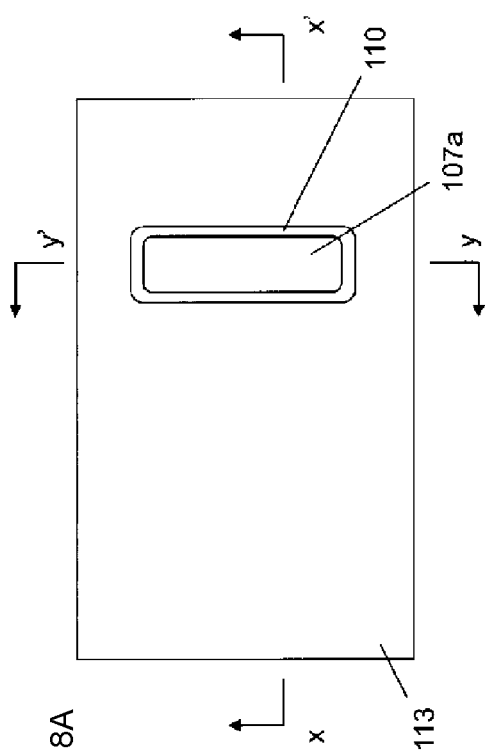
FIG. 18A
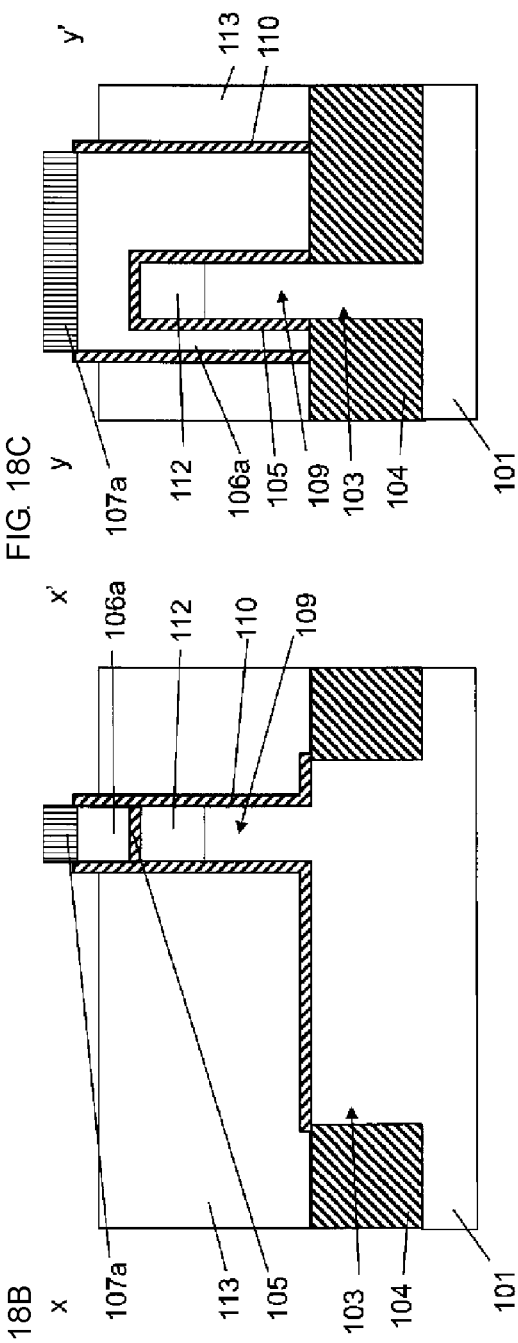
FIG. 18B
FIG. 18C

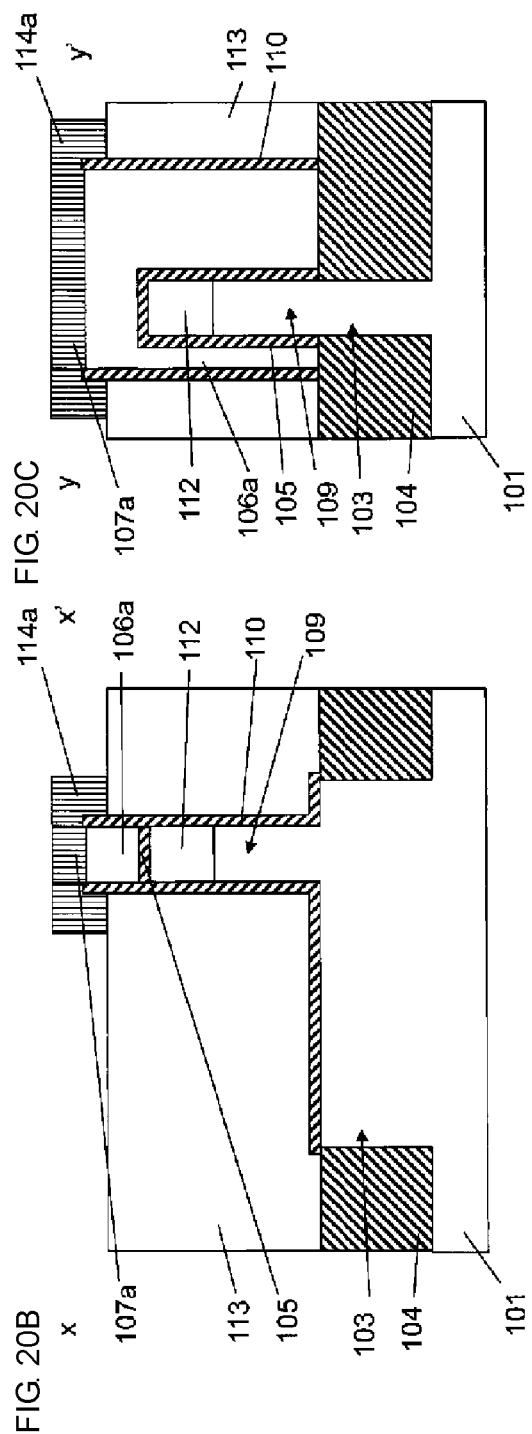

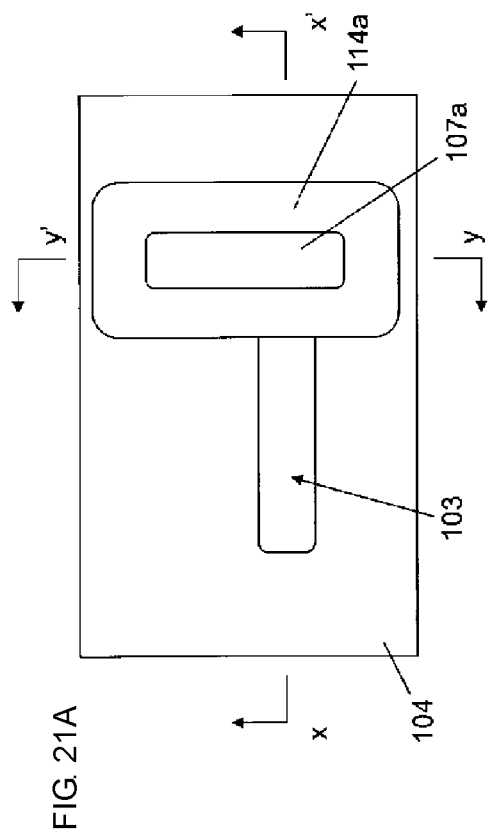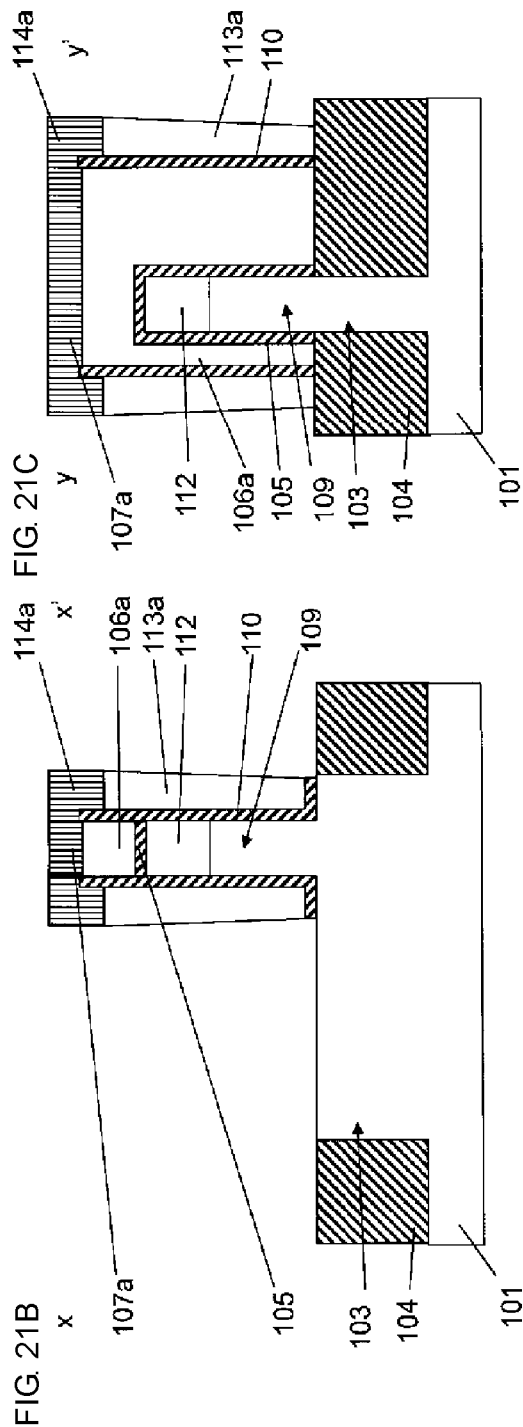

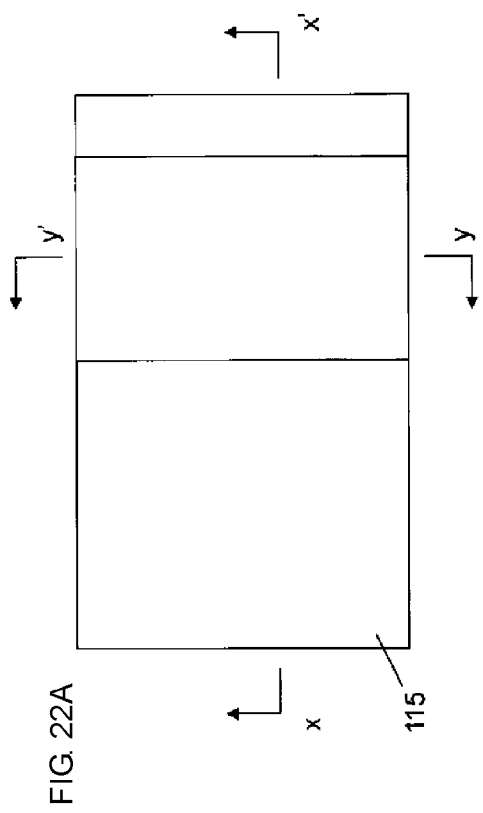
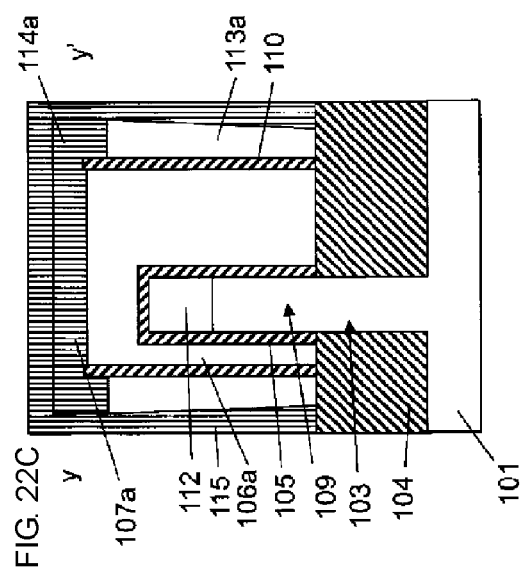
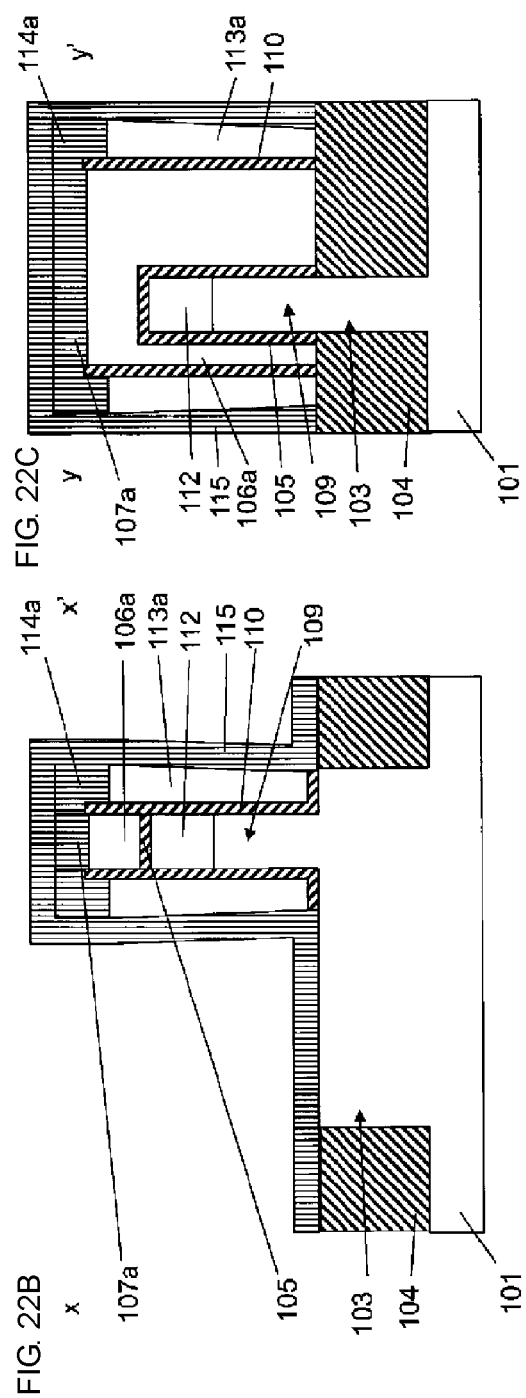
FIG. 22A
FIG. 22B
FIG. 22C

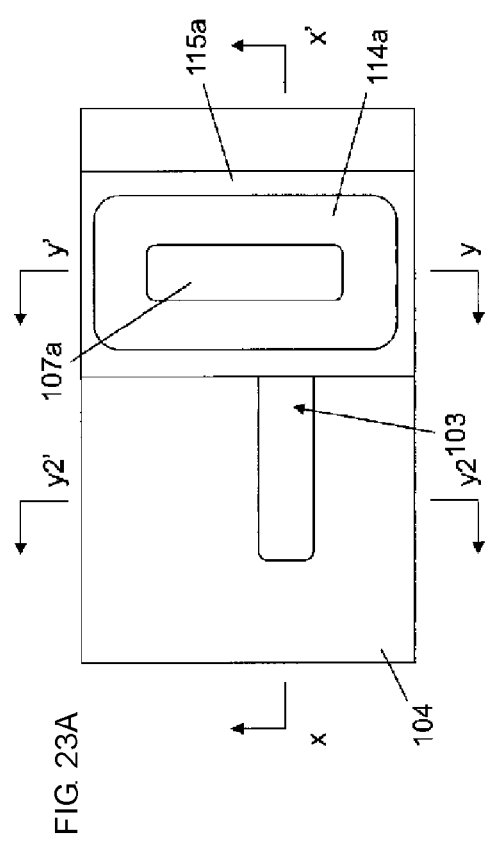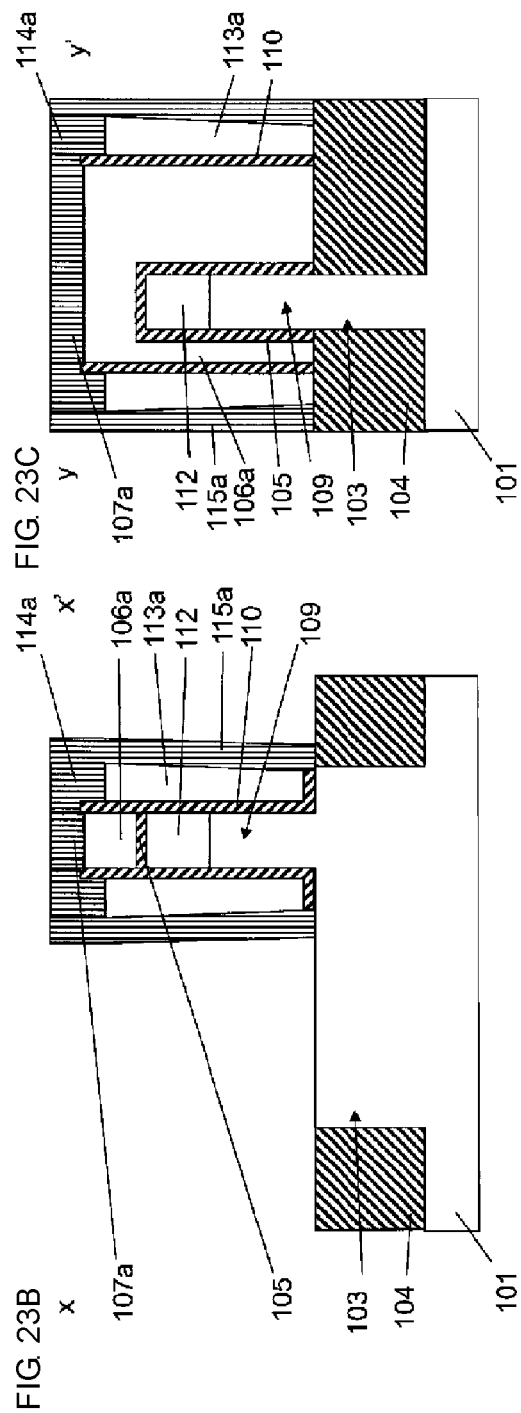

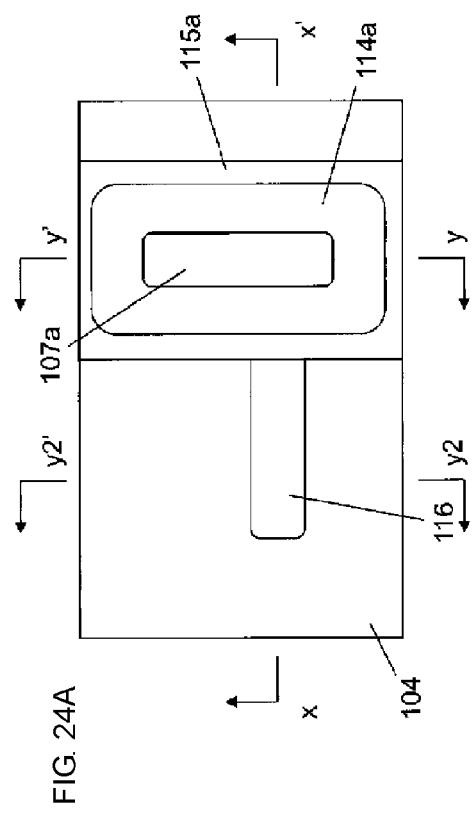
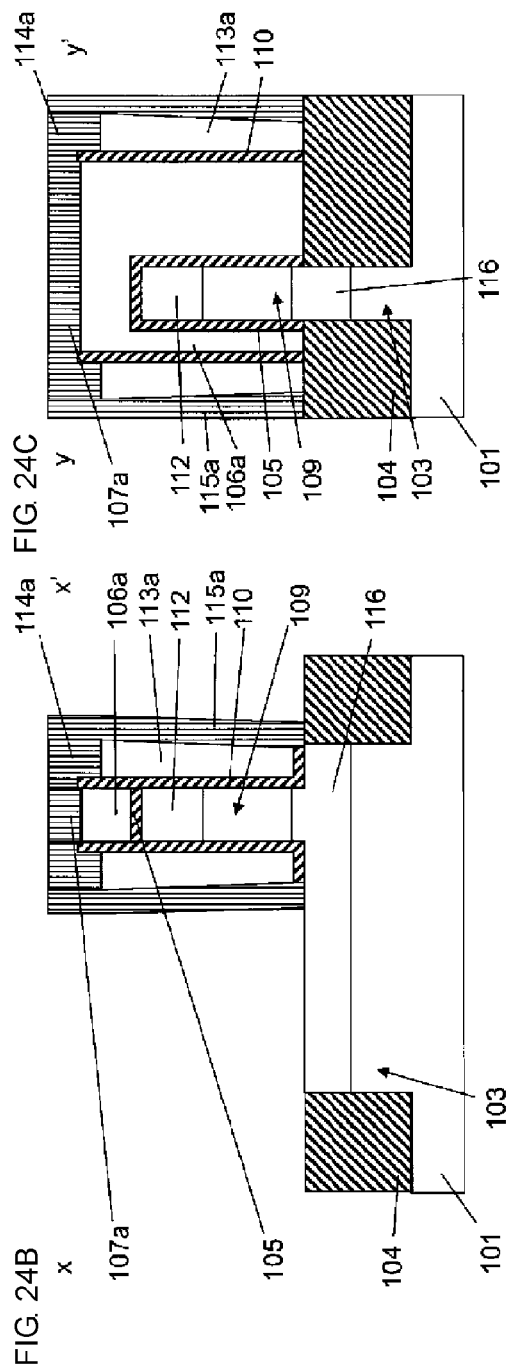

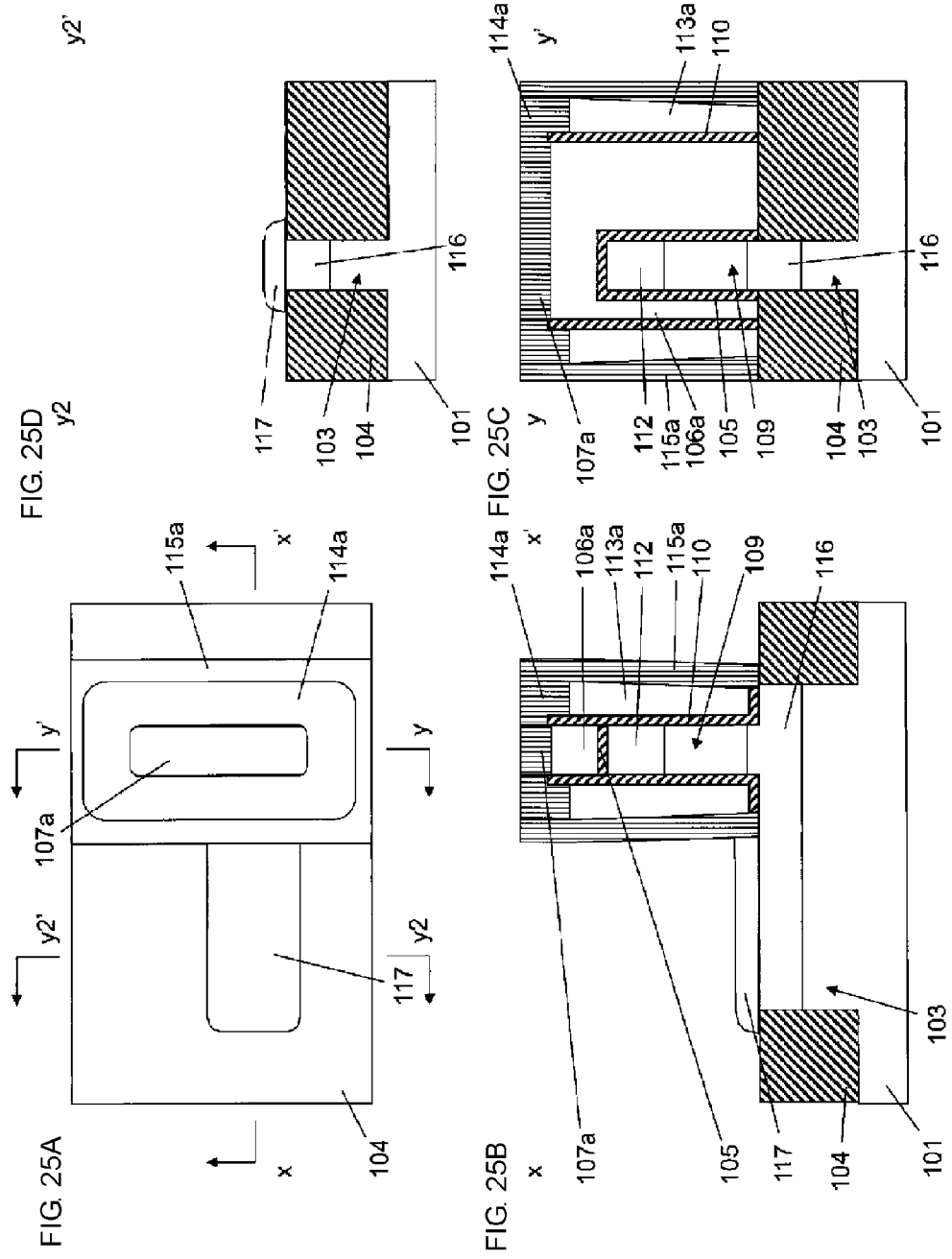

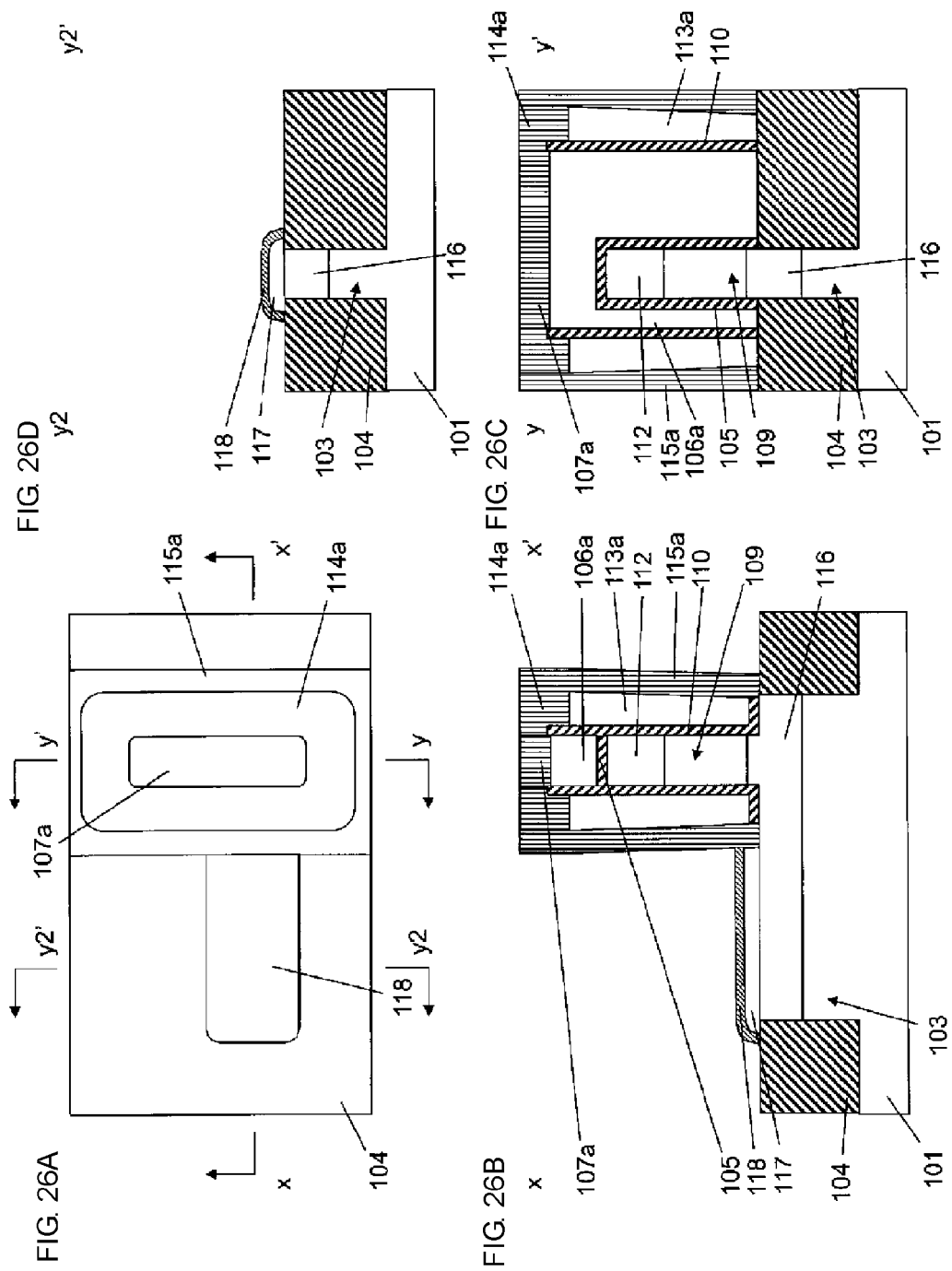

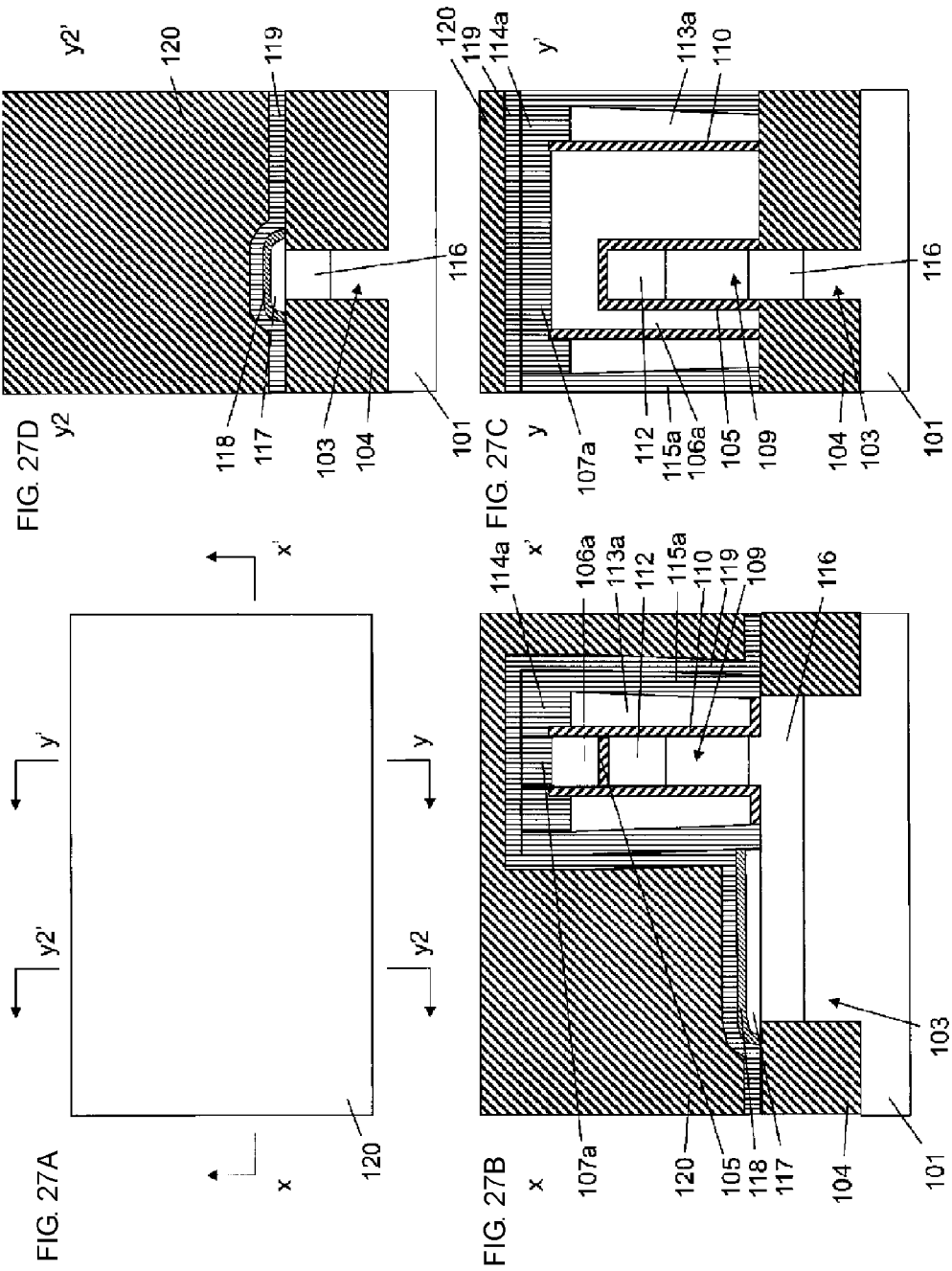

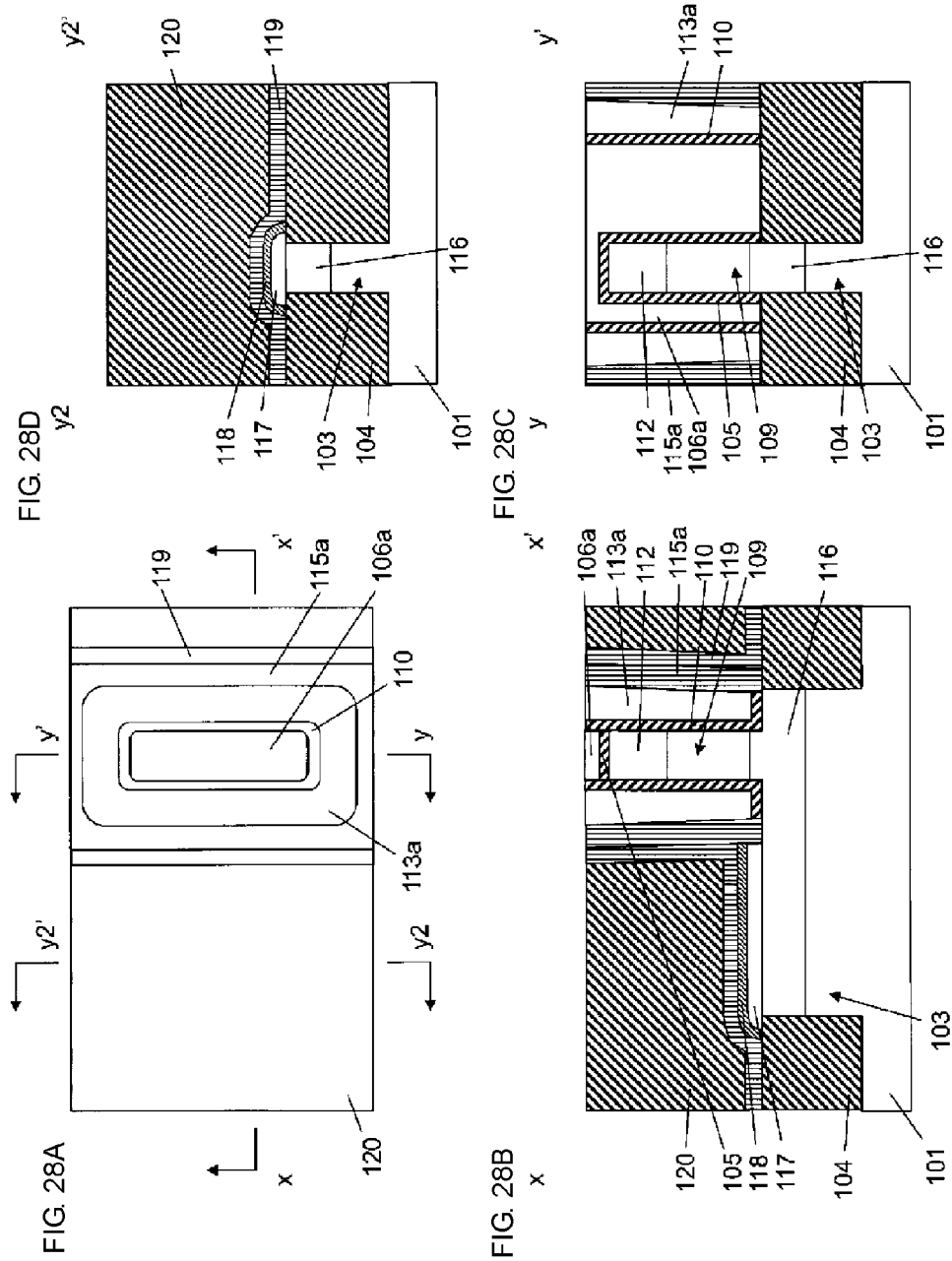

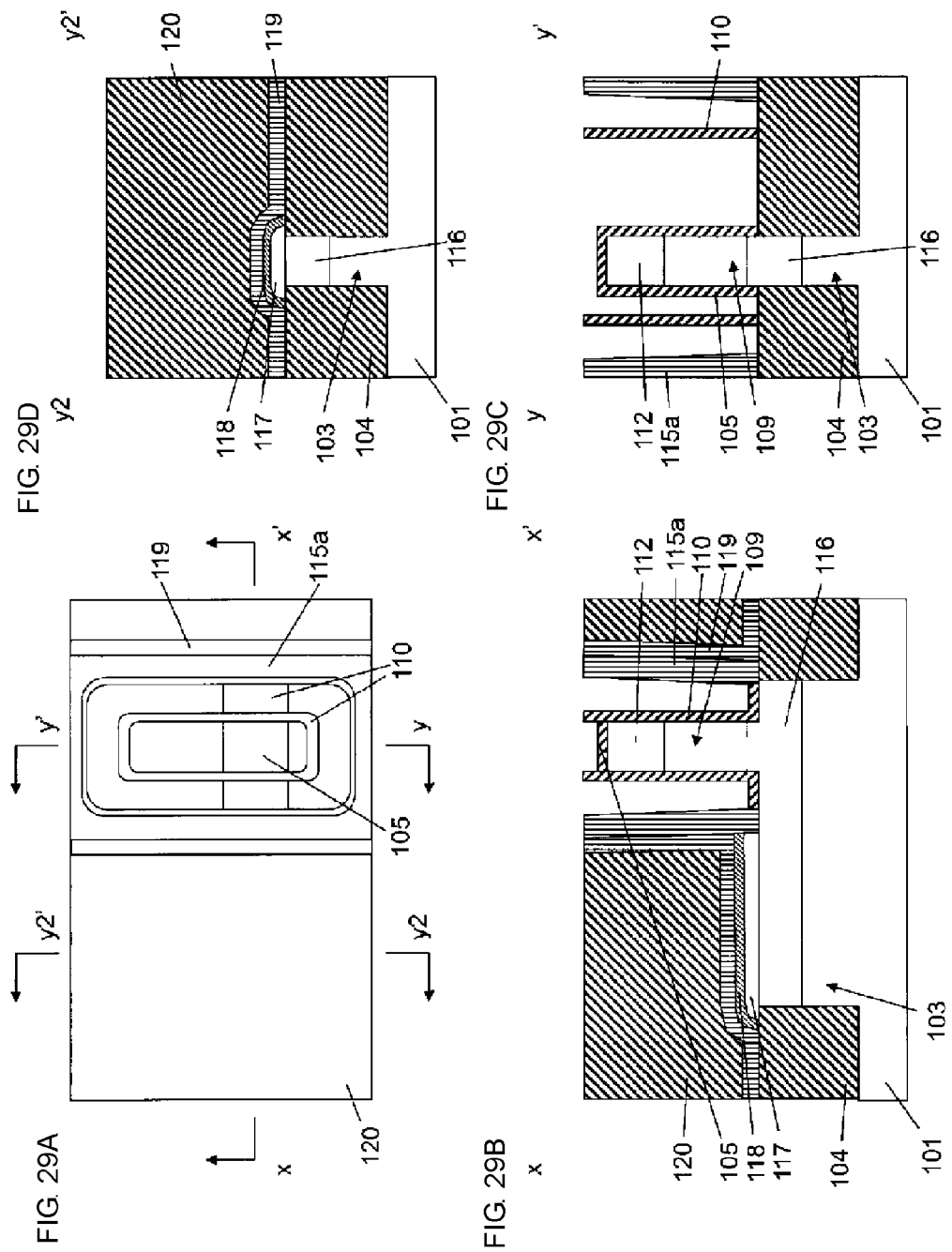

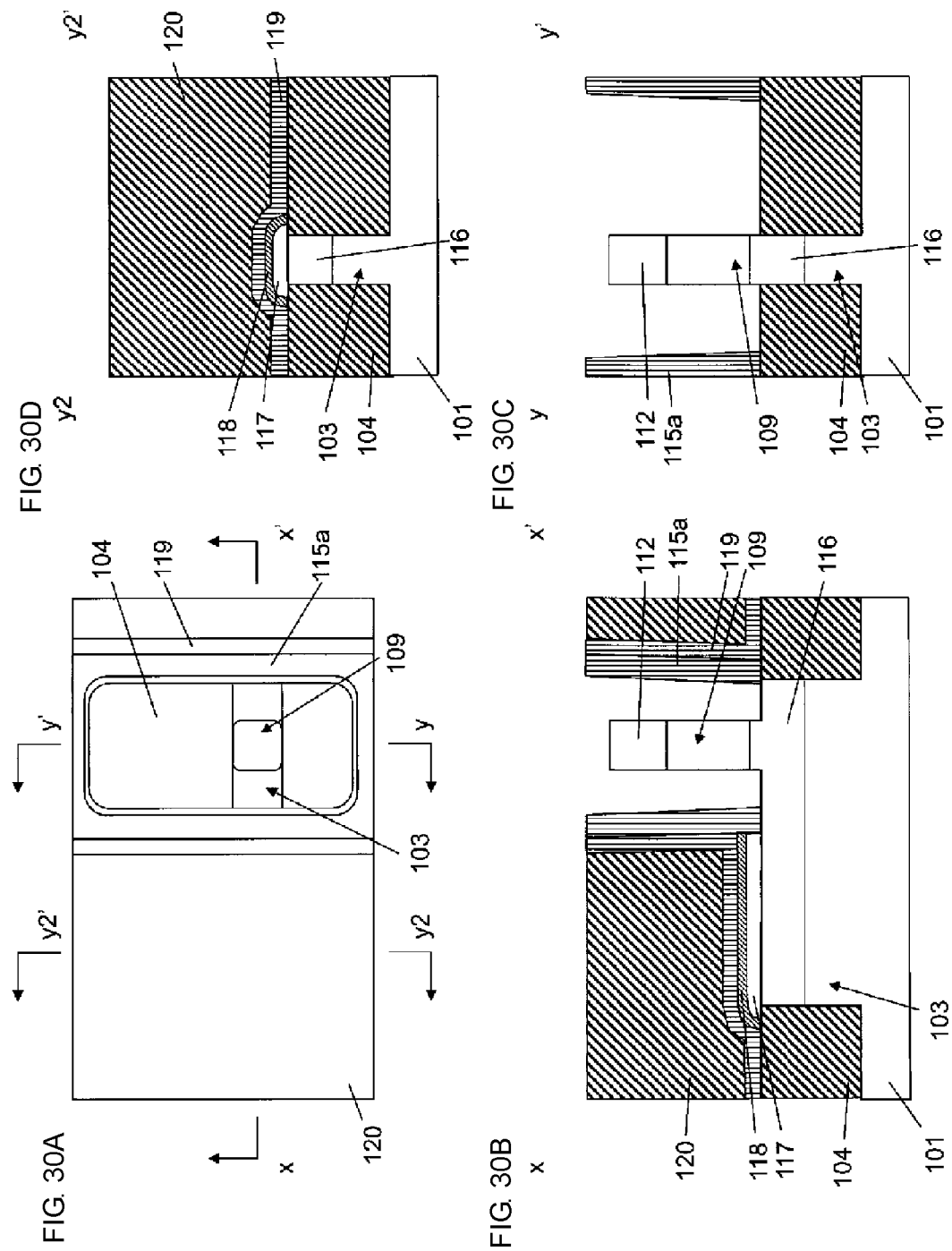

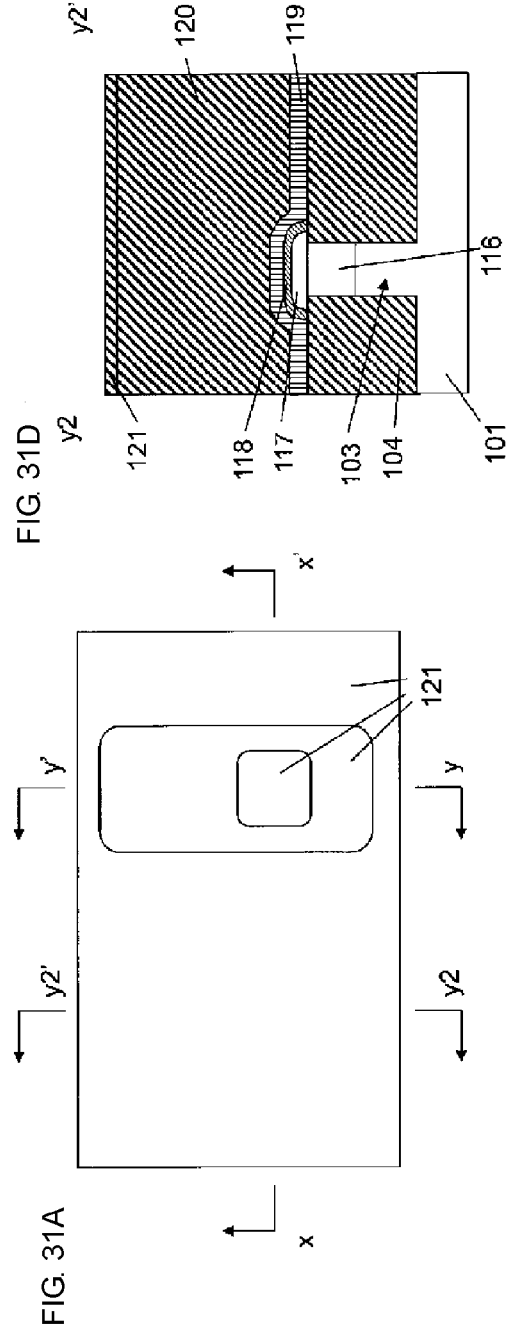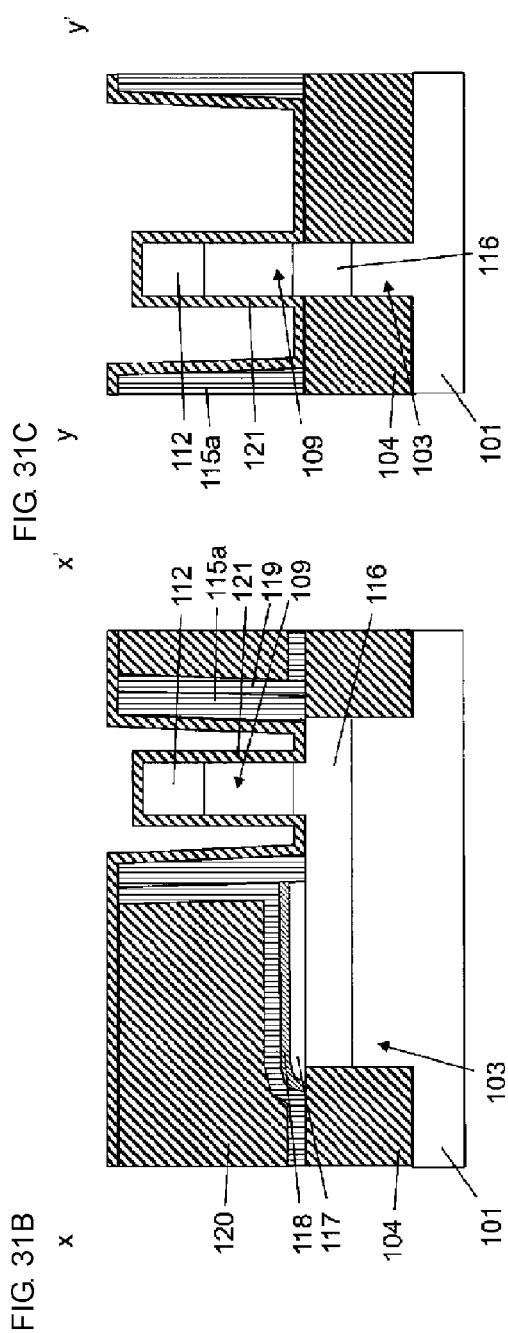

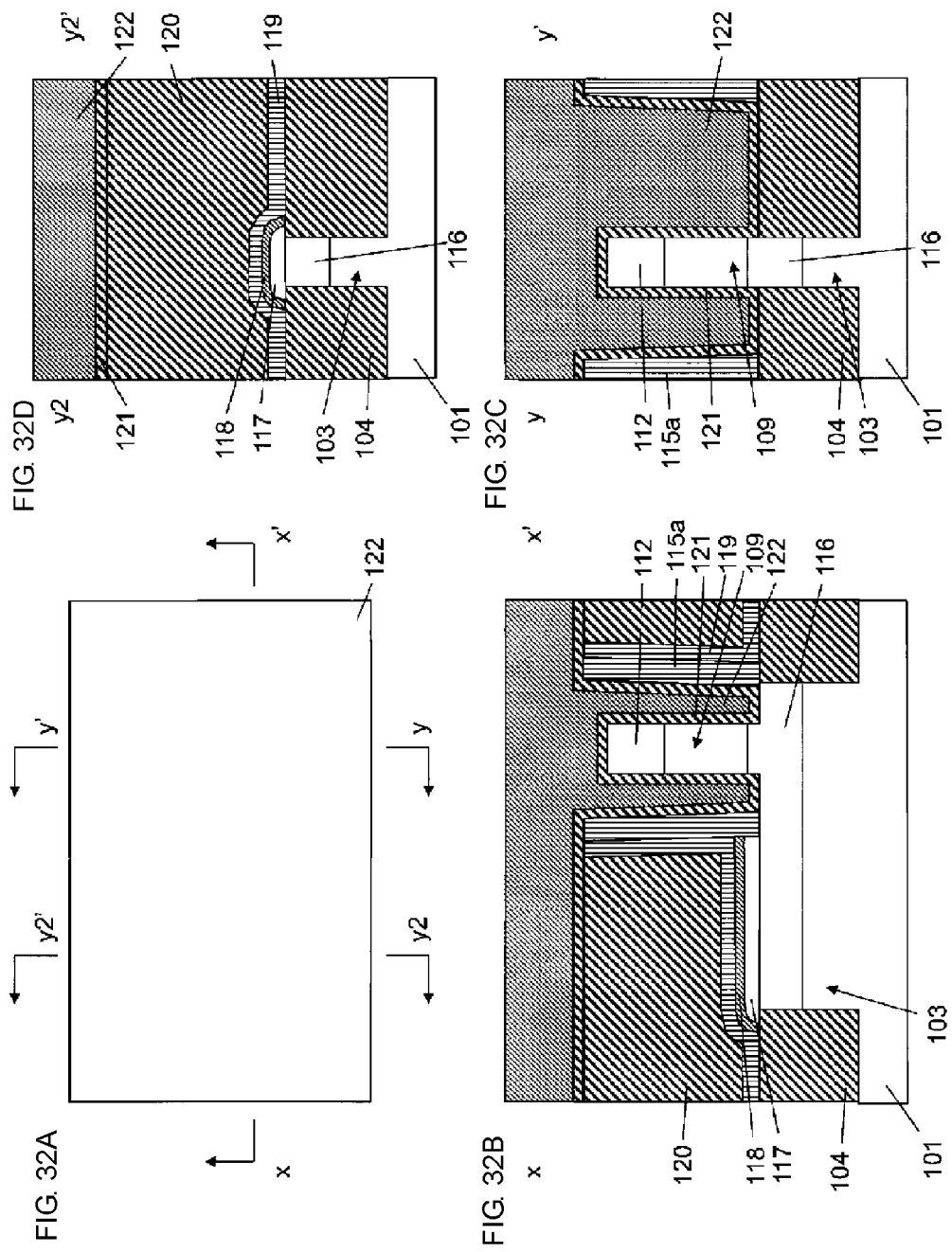

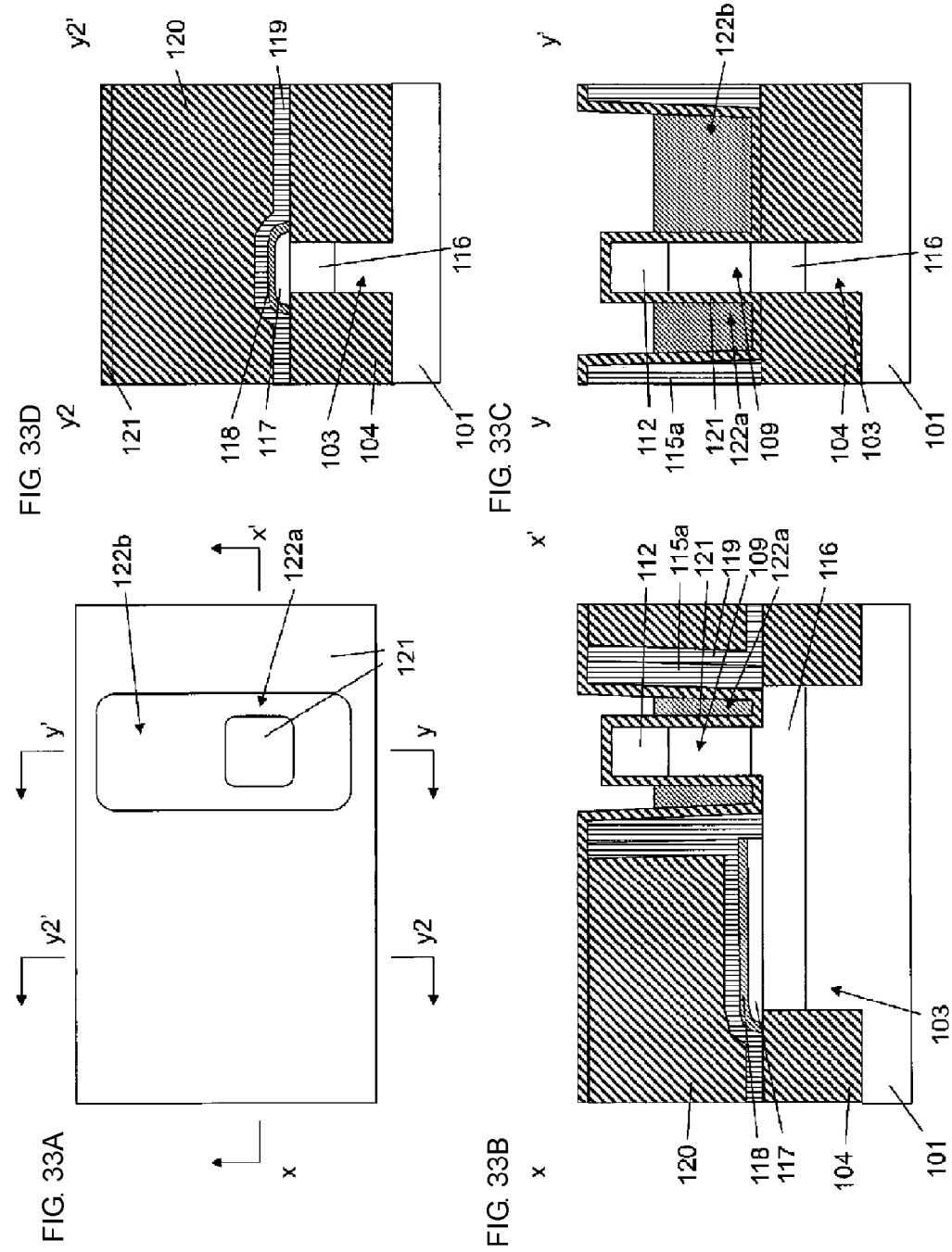

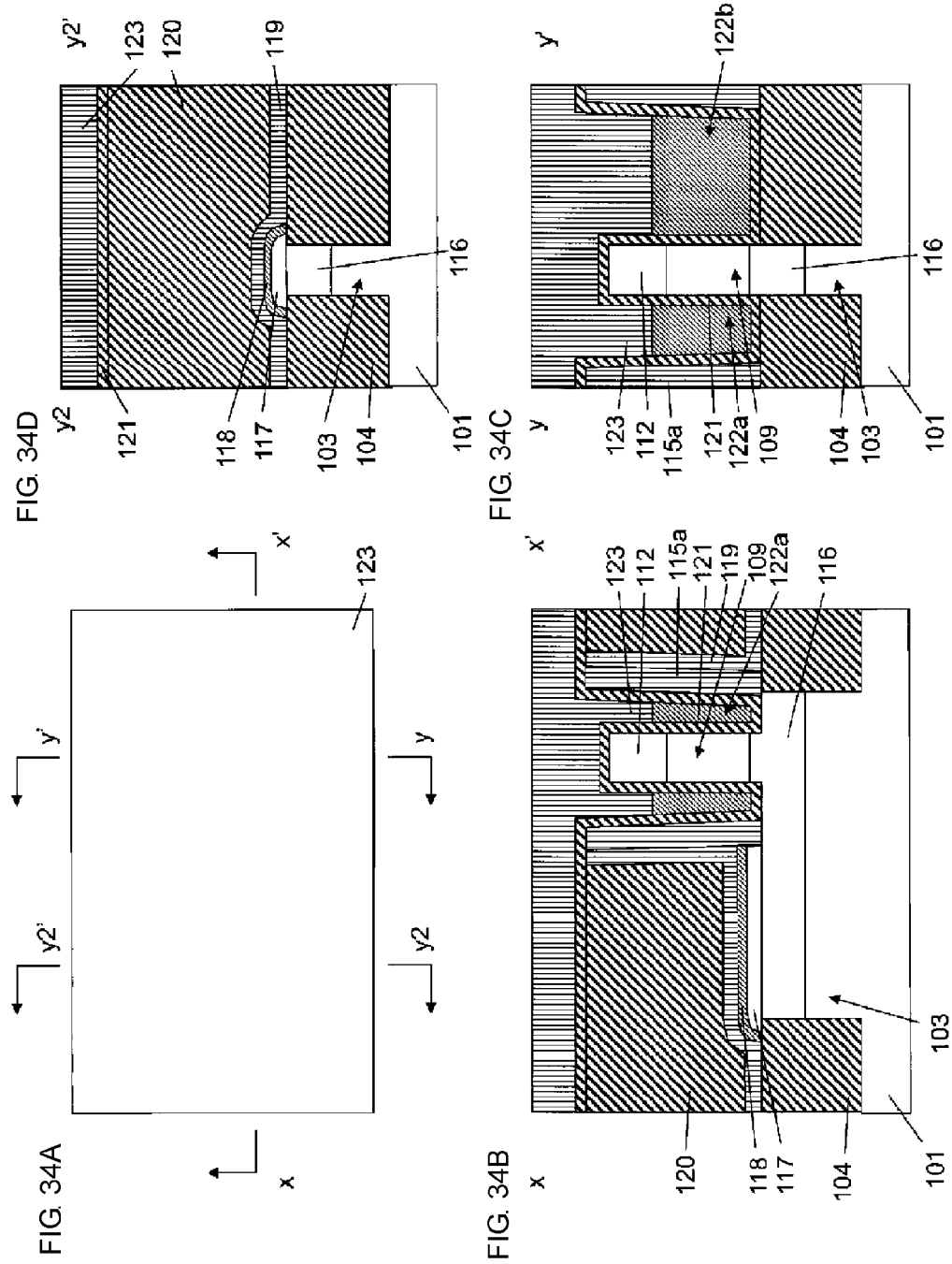

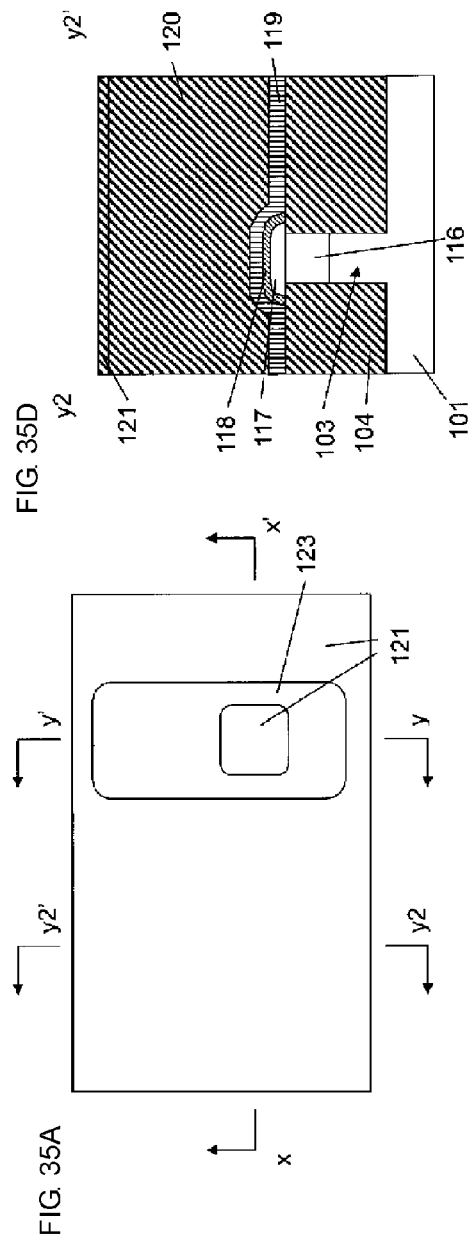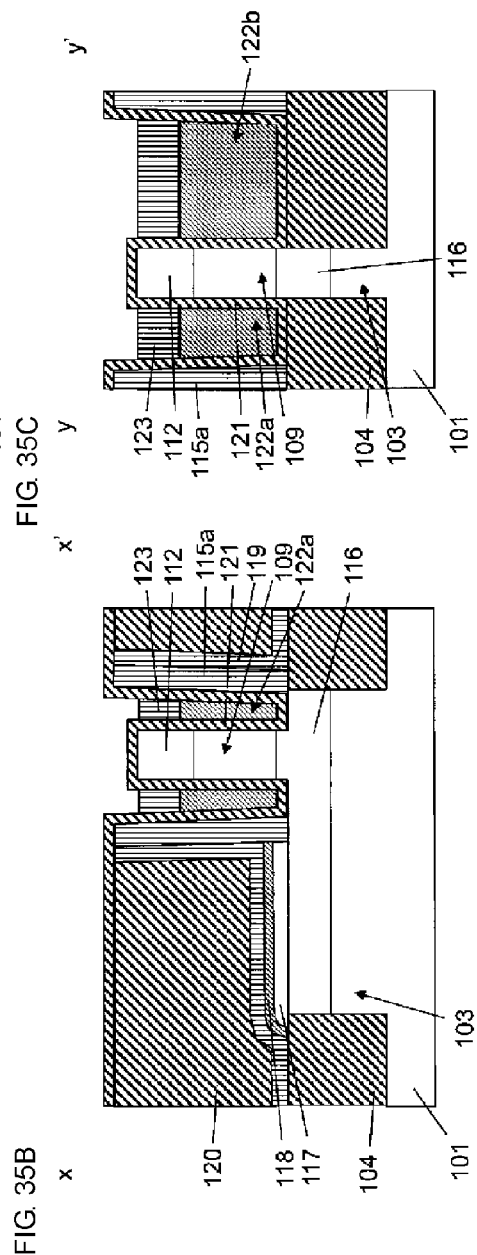

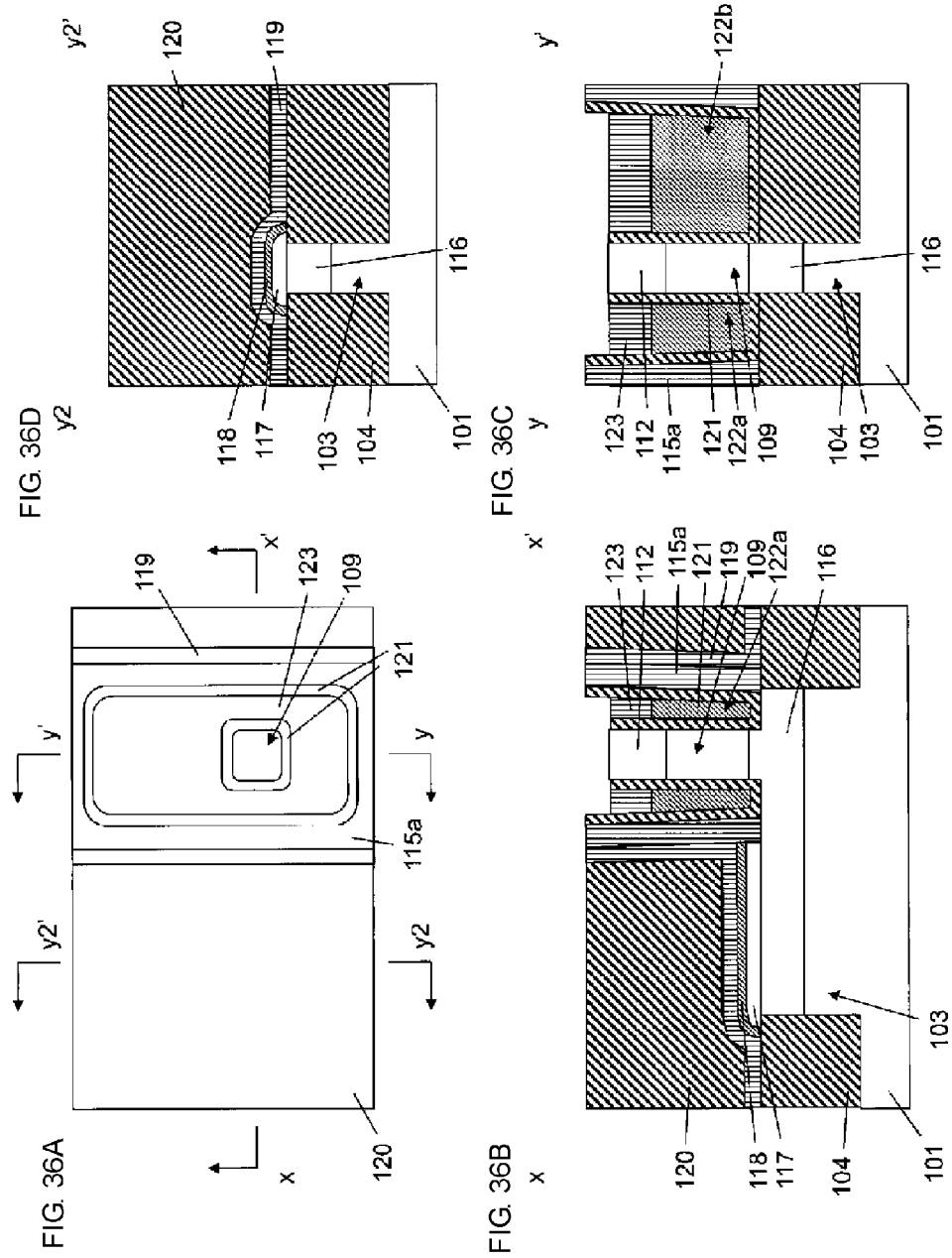

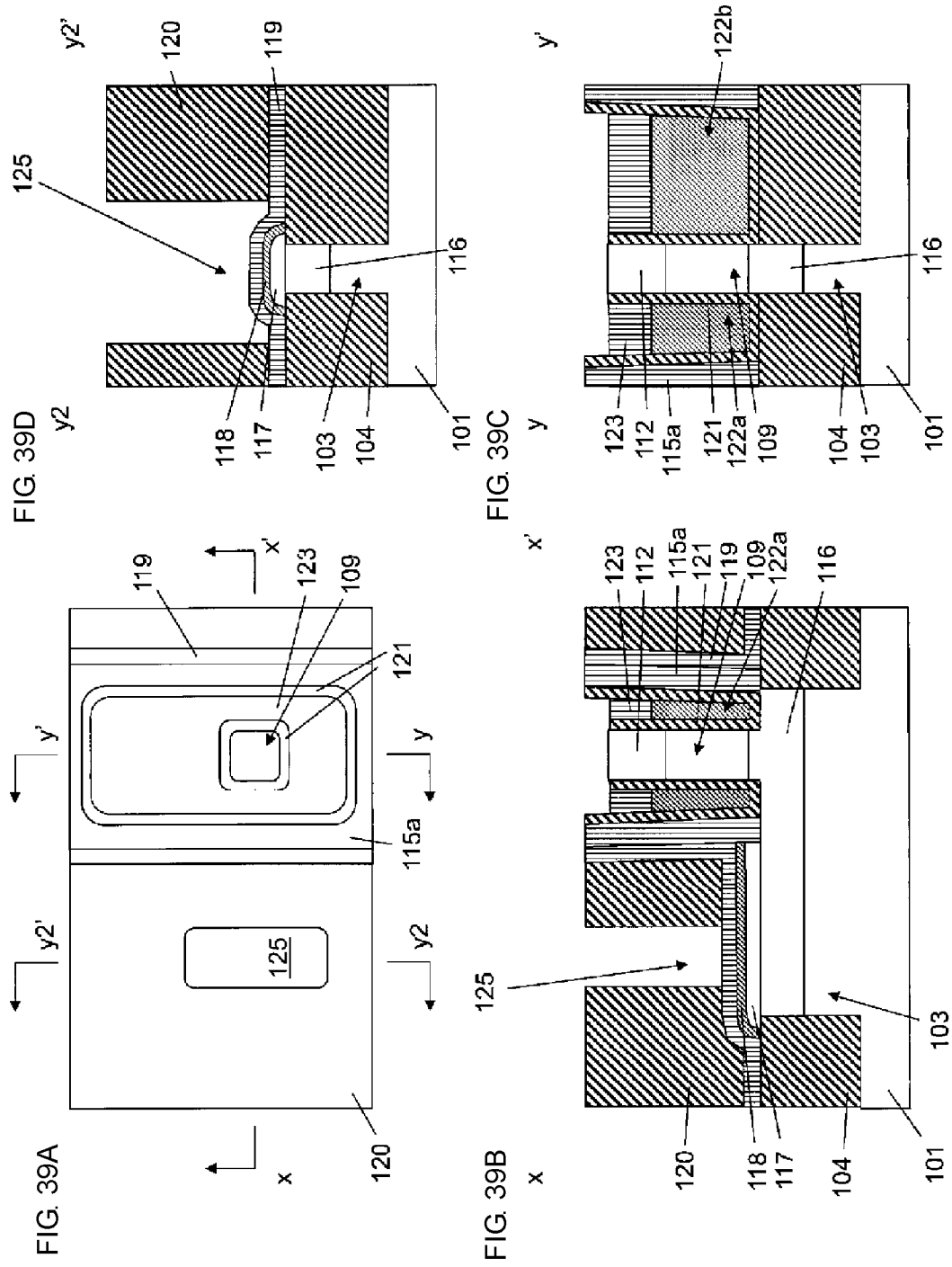

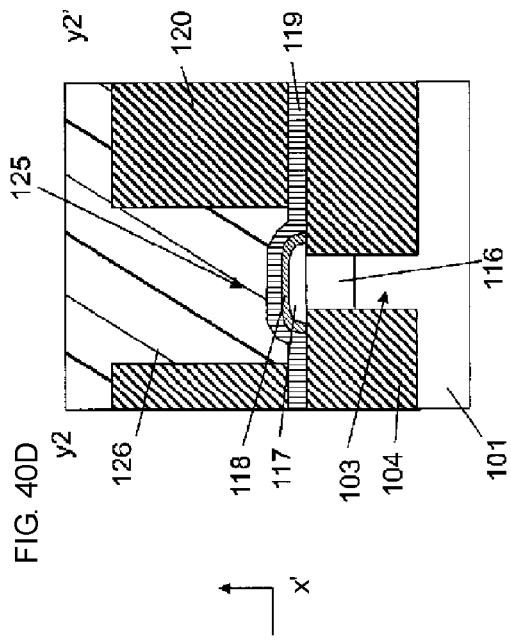
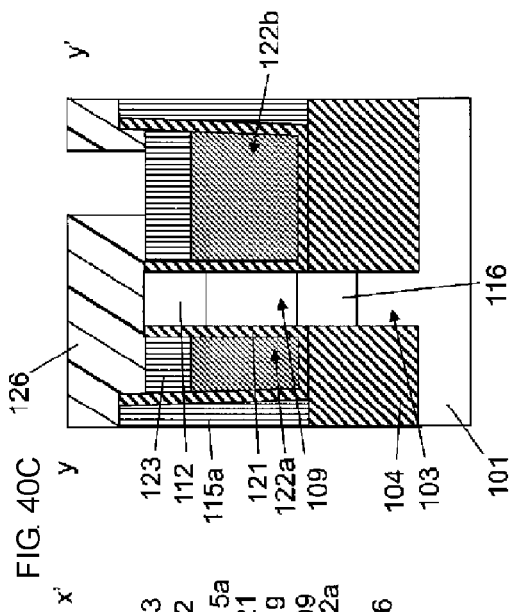
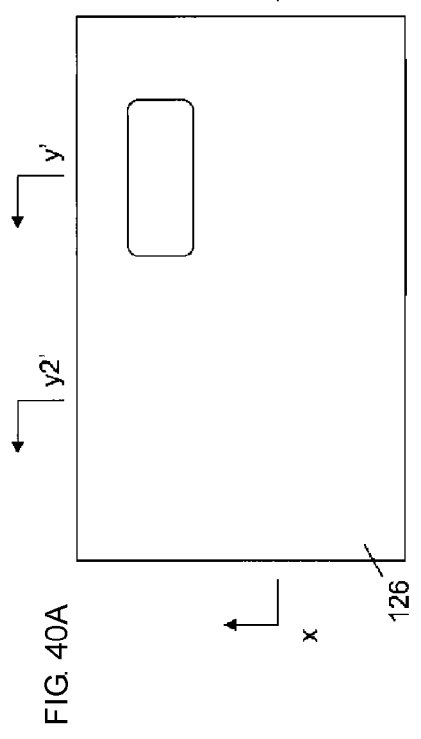
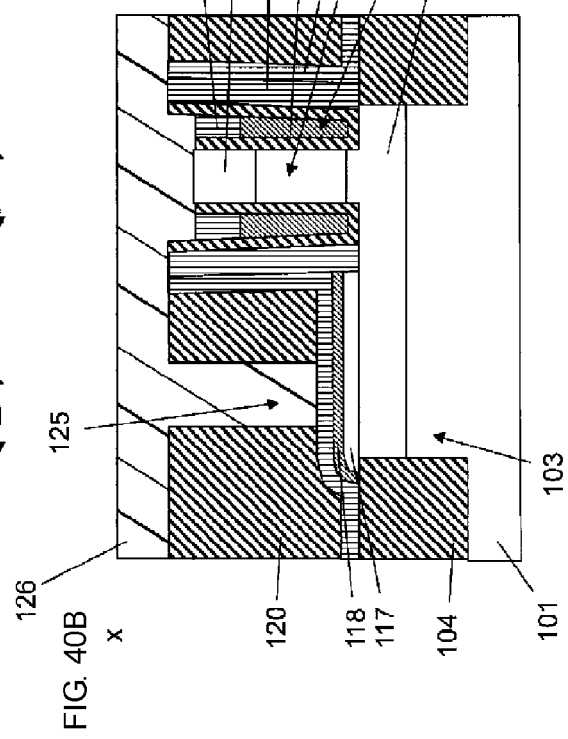

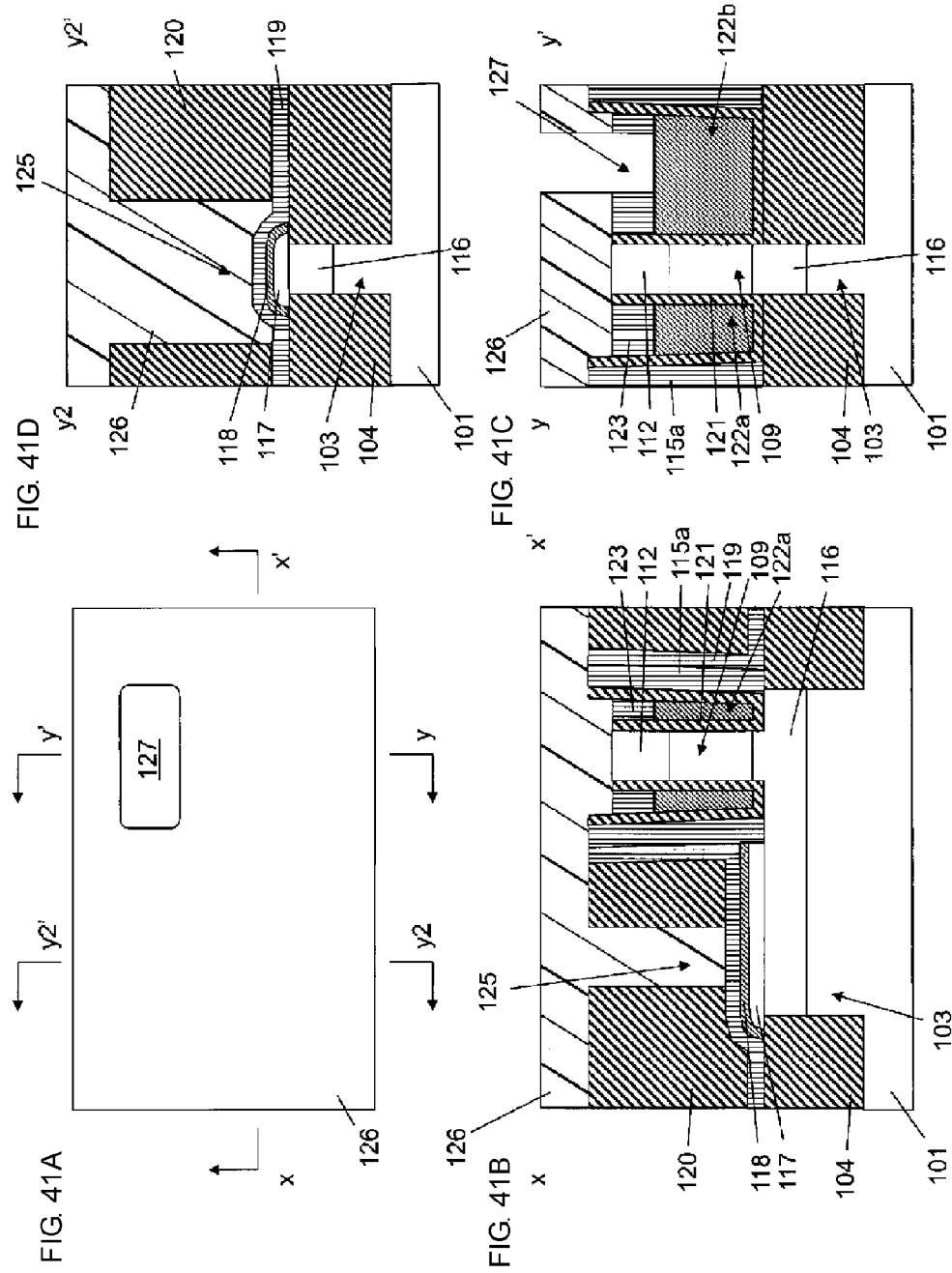

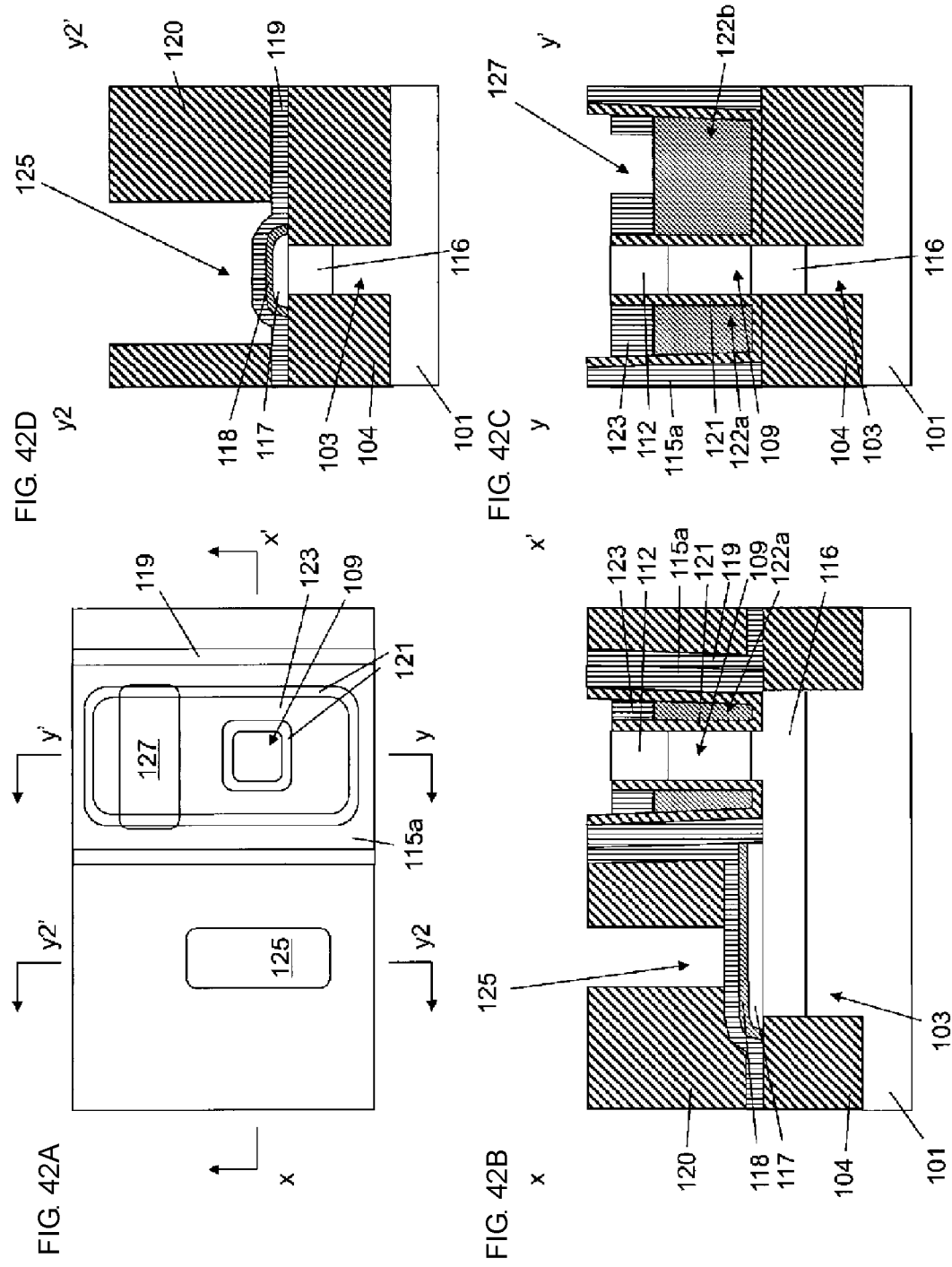

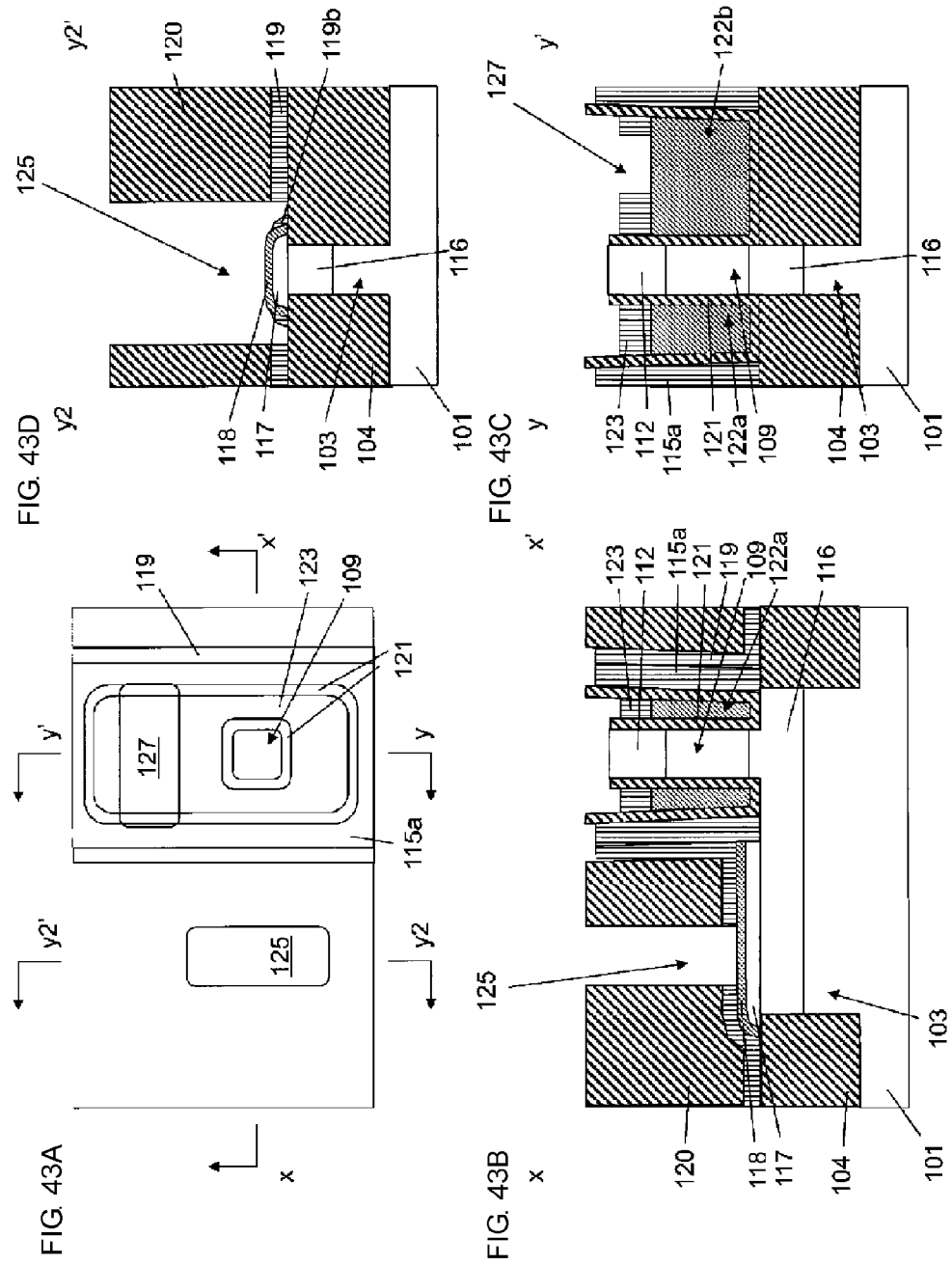

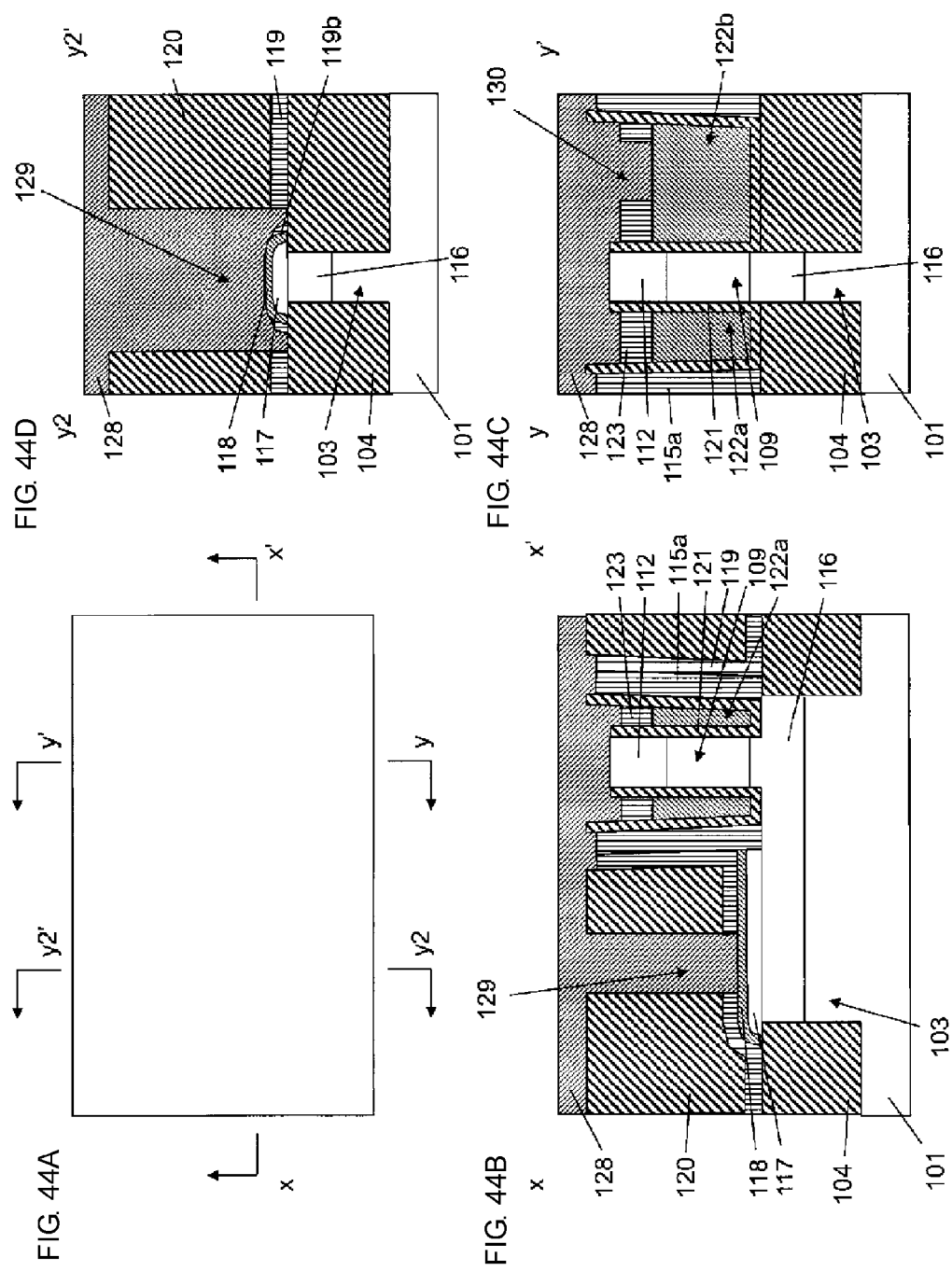

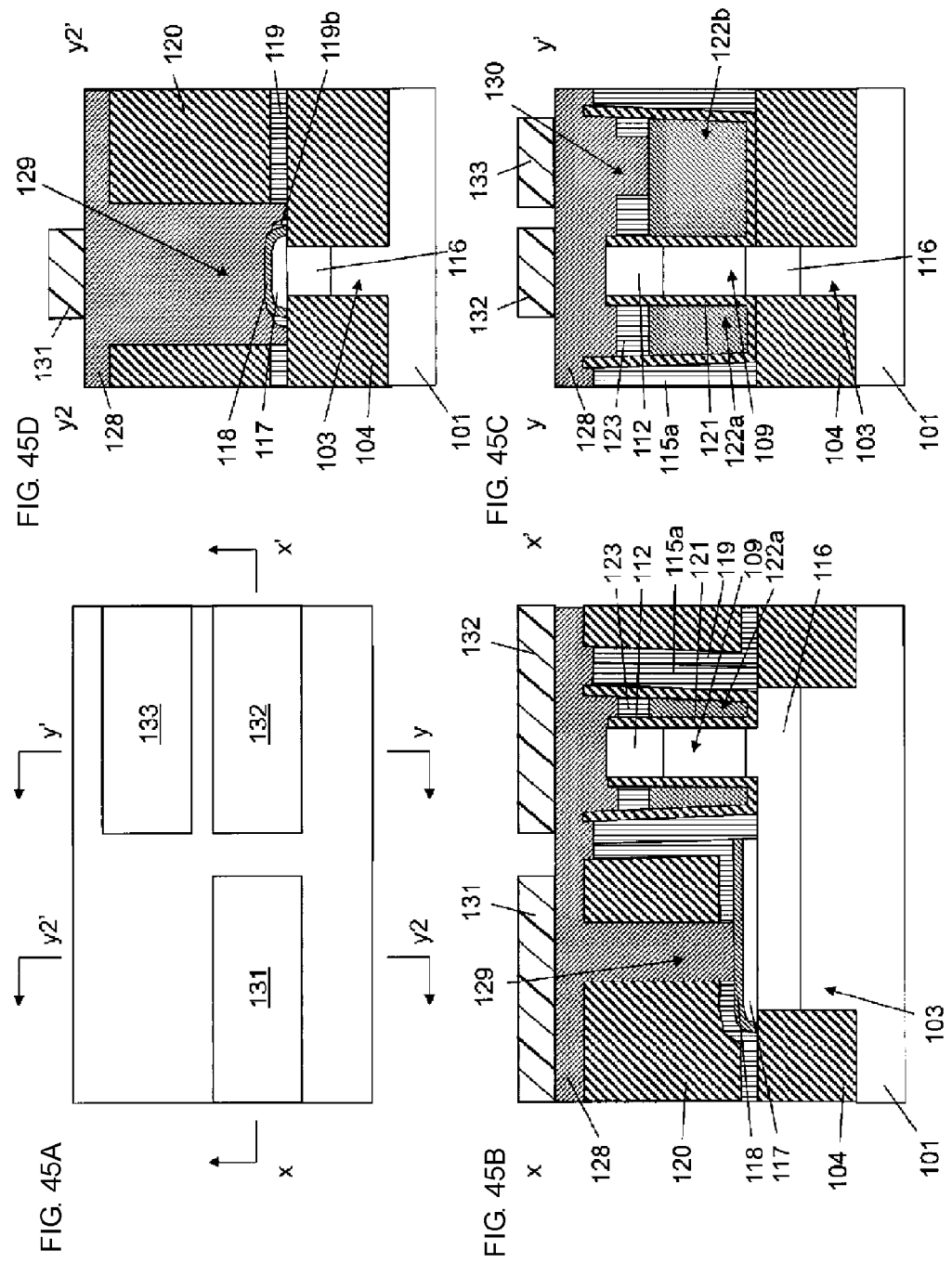

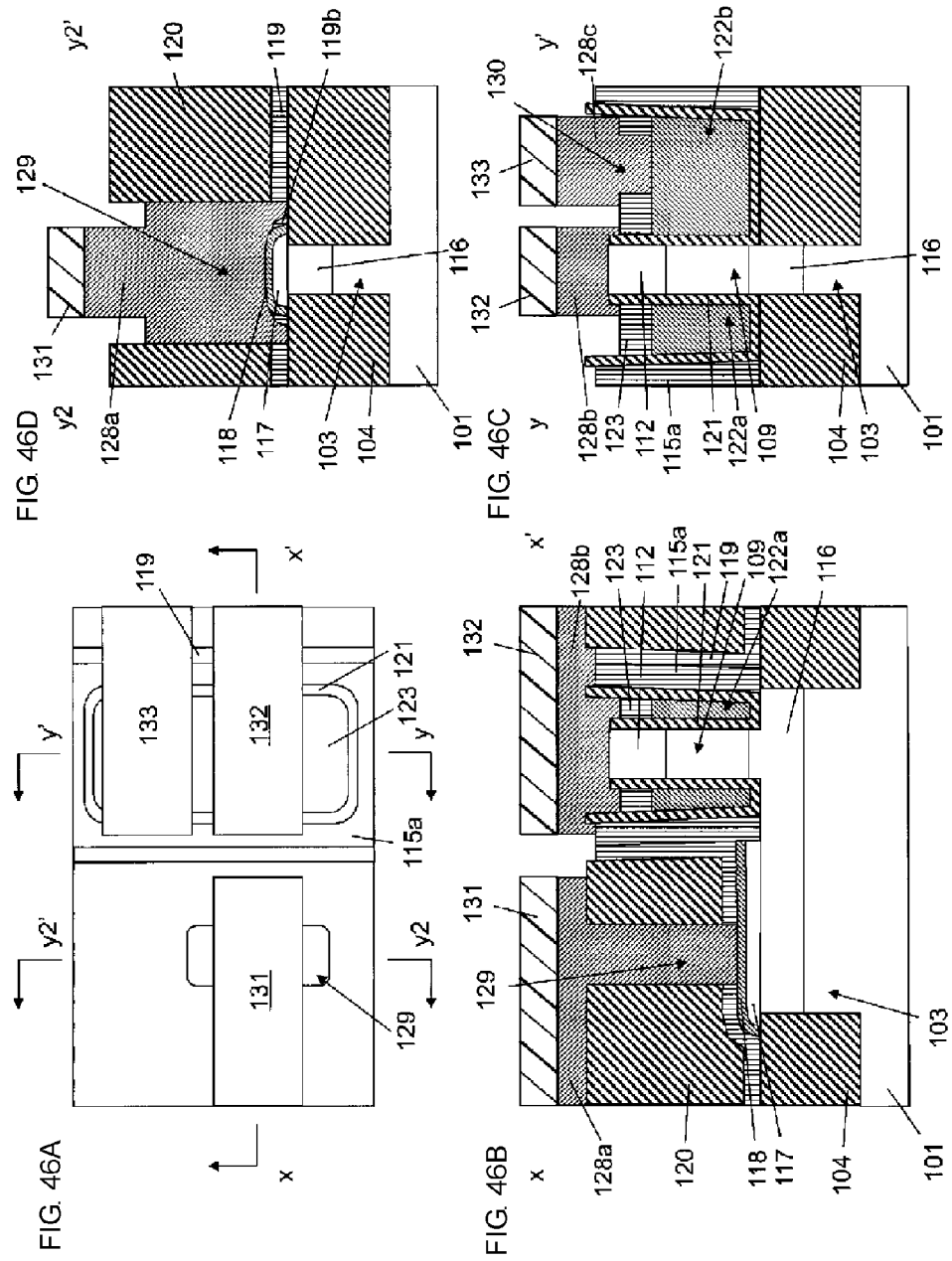

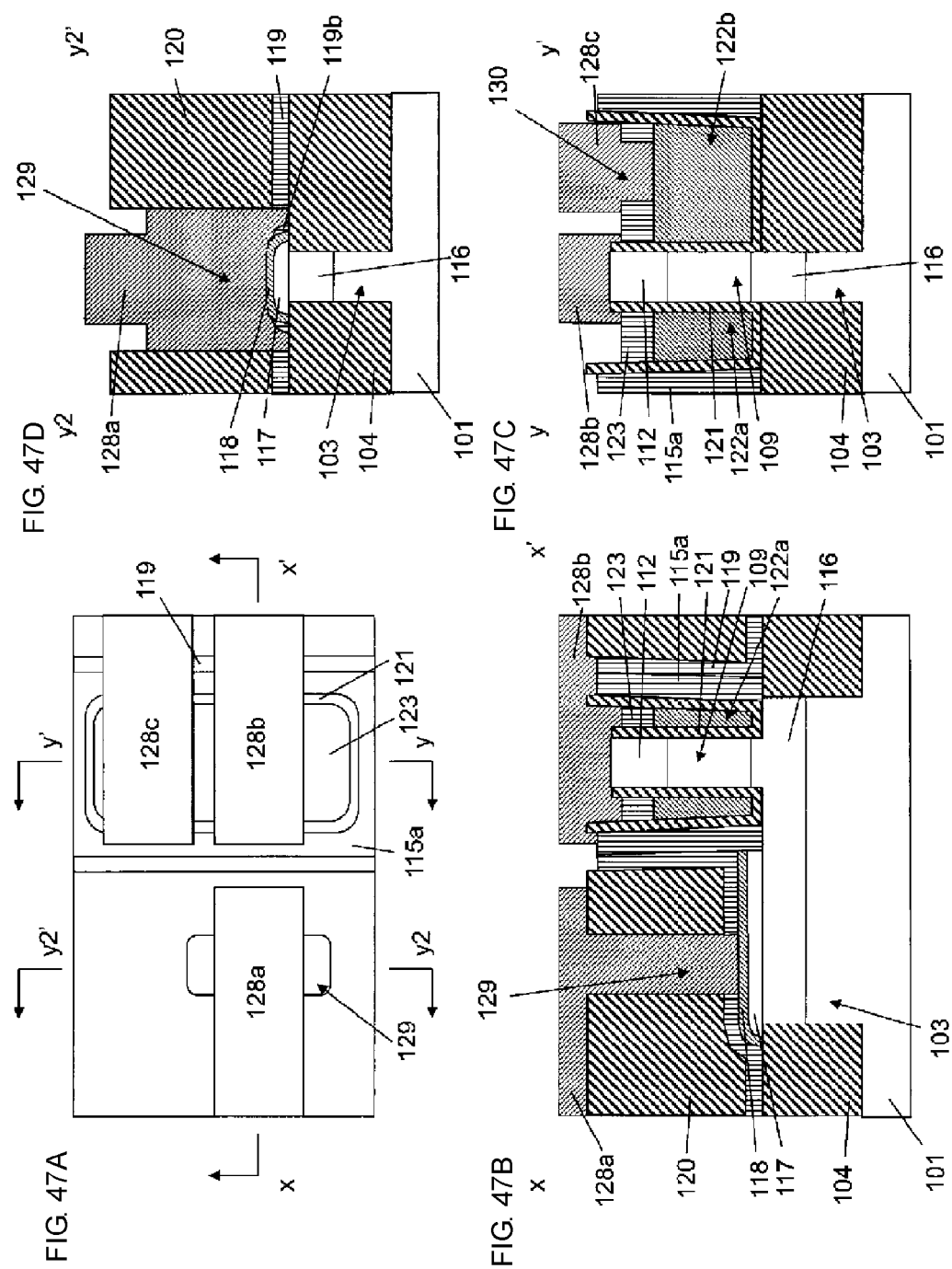

METHOD FOR PRODUCING SEMICONDUCTOR DEVICE AND SEMICONDUCTOR DEVICE

CROSS REFERENCE TO RELATED APPLICATION

This application is a continuation of international patent application PCT/JP2014/069611, filed Jul. 24, 2014, the entire contents of which are incorporated herein by reference.

BACKGROUND OF THE INVENTION

Field of the Invention

The present invention relates to a method for producing a semiconductor device and a semiconductor device.

Description of the Related Art

For semiconductor integrated circuits, in particular, integrated circuits employing MOS transistors, the degree of integration has been continuously increased. With this increase in the degree of integration, the size of MOS transistors in such integrated circuits has been reduced to the order of nanometers. In such small MOS transistors, leak current is difficult to suppress. Thus, from the standpoint of ensuring a sufficiently large current, reduction in the circuit area is difficult to achieve, which has been problematic. In order to address this problem, a Surrounding Gate Transistor (hereafter, referred to as an "SGT") has been proposed, the SGT having a structure in which a source, a gate, and a drain are disposed so as to be perpendicular to a substrate and a gate electrode is disposed so as to surround a pillar-shaped semiconductor layer (for example, refer to Japanese Unexamined Patent Application Publication Nos. 2-71556, 2-188966, and 3-145761).

In existing SGT production methods, a mask for defining a silicon pillar is used to form the silicon pillar including a pillar-shaped nitride-film hard mask; a mask for defining a planar silicon layer is used to form the planar silicon layer under the silicon pillar; and a mask for defining a gate line is used to form the gate line (for example, refer to Japanese Unexamined Patent Application Publication No. 2009-182317). In other words, three masks are used to form the silicon pillar, the planar silicon layer, and the gate line.

In production of existing MOS transistors, in order to successfully perform a metal-gate process and a high-temperature process, a metal-gate last process of performing the high-temperature process and subsequently forming a metal gate is employed for actual products (IEDM2007 K. Mistry et. al, pp 247-250). Specifically, a gate is formed of polysilicon; an interlayer insulating film is then deposited; chemical mechanical polishing is then performed to expose the polysilicon gate; the polysilicon gate is etched; and metal is then deposited. Thus, also for SGTs, in order to successfully perform the metal-gate process and the high-temperature process, the metal-gate last process of performing the high-temperature process and subsequently forming the metal gate needs to be employed.

When metal is deposited to fill a hole in which the upper portion is narrower than the lower portion, the upper portion of the hole is first filled with the metal, so that the lower portion is left unfilled.

Existing MOS transistors employ a first insulating film in order to decrease the parasitic capacitance between the gate line and the substrate. For example, in FINFET (IEDM2010 C C. Wu, et. al, 27.1.1-27.1.4), a first insulating film is formed around a fin-shaped semiconductor layer and the first insulating film is subjected to etch back to expose the fin-shaped semiconductor layer, so that the parasitic capacitance between the gate line and the substrate is decreased. Thus, SGTs also need to employ a first insulating film in order to decrease the parasitic capacitance between the gate line and the substrate. Since SGTs include a fin-shaped semiconductor layer and also a pillar-shaped semiconductor layer, how to form the pillar-shaped semiconductor layer needs to be considered.

When the fin-shaped semiconductor layer has high parasitic resistance, the current driving force of the transistor decreases.

BRIEF SUMMARY OF THE INVENTION

Accordingly, an object is to provide a method for producing an SGT having a structure with a low parasitic resistance, the method employing a gate last process, in which two masks are used to form a fin-shaped semiconductor layer, a pillar-shaped semiconductor layer, a gate electrode, and a gate line; and to provide the resultant SGT structure.

A method for producing a semiconductor device according to an embodiment of the present invention includes a first step of forming a fin-shaped semiconductor layer on a semiconductor substrate, and forming a first insulating film around the fin-shaped semiconductor layer; a second step of, after the first step, forming a second insulating film around the fin-shaped semiconductor layer, depositing a first polysilicon on the second insulating film and planarizing the first polysilicon, forming a third insulating film on the first polysilicon, forming a second resist for forming a gate line and a pillar-shaped semiconductor layer, in a direction perpendicular to a direction the fin-shaped in which the semiconductor layer extends, etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; a third step of, after the second step, forming a fourth insulating film around the pillar-shaped semiconductor layer and the first dummy gate, depositing a second polysilicon around the fourth insulating film and planarizing the second polysilicon, performing etch back to expose the first hard mask, depositing a sixth insulating film, etching the sixth insulating film to form a second hard mask on a side wall of the first hard mask, and etching the second polysilicon so as to be left on side walls of the first dummy gate and the pillar-shaped semiconductor layer to form a second dummy gate; and a fourth step of forming a fifth insulating film around the second dummy gate, etching the fifth insulating film so as to have a sidewall shape to form a sidewall formed of the fifth insulating film, and forming a first epitaxially grown layer on the fin-shaped semiconductor layer.

The second dummy gate may have a top surface and a bottom surface, the top surface having a larger area than the bottom surface.

The method may further include, after formation of the fourth insulating film around the pillar-shaped semiconductor layer and the first dummy gate, forming a third resist, performing etch back to expose an upper portion of the pillar-shaped semiconductor layer, and forming a first diffusion layer in an upper portion of the pillar-shaped semiconductor layer.

The method may further include, after formation of the sidewall formed of the fifth insulating film, forming a second diffusion layer in an upper portion of the fin-shaped semiconductor layer and a lower portion of the pillar-shaped semiconductor layer.

The method may further include forming a metal-semiconductor compound on the first epitaxially grown layer.

The method may further include a fifth step of, after the fourth step, depositing a contact stopper film, depositing an interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer and on an inner side of the fifth insulating film, depositing metal, and performing etch back to form a gate electrode and a gate line.

A semiconductor device according to an embodiment of the present invention includes a fin-shaped semiconductor layer formed on a semiconductor substrate; a pillar-shaped semiconductor layer formed on the fin-shaped semiconductor layer; a gate insulating film formed around the pillar-shaped semiconductor layer; a gate electrode formed around the gate insulating film and formed of metal; a gate line formed of metal connected to the gate electrode; and a first epitaxially grown layer formed on the fin-shaped semiconductor layer. The gate electrode and the gate line have a top surface and a bottom surface, the top surface having a larger area than the bottom surface, and a width of the first epitaxially grown layer in a direction perpendicular to the fin-shaped semiconductor layer is larger than a width of the fin-shaped semiconductor layer in the direction perpendicular to the fin-shaped semiconductor layer.

A semiconductor device according to a further embodiment of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer; a gate insulating film formed around the pillar-shaped semiconductor layer; a gate electrode formed around the gate insulating film and formed of metal; a gate line connected to the gate electrode, formed of metal, and extending in a direction perpendicular to the fin-shaped semiconductor layer; and a first epitaxially grown layer formed on the fin-shaped semiconductor layer, wherein the gate electrode and the gate line have a top surface and a bottom surface, the top surface having a larger area than the bottom surface, and a width of the first epitaxially grown layer in a direction perpendicular to the fin-shaped semiconductor layer is larger than a width of the fin-shaped semiconductor layer in the direction perpendicular to the fin-shaped semiconductor layer.

The semiconductor device may further include a first diffusion layer formed in an upper portion of the pillar-shaped semiconductor layer; and a second diffusion layer formed in an upper portion of the fin-shaped semiconductor layer and a lower portion of the pillar-shaped semiconductor layer.

The semiconductor device may further include the gate insulating film formed around and under the gate electrode and the gate line.

Embodiments of the present invention can provide a method for producing an SGT having a structure with a low parasitic resistance, the method employing a gate last process, in which two masks are used to form a fin-shaped semiconductor layer, a pillar-shaped semiconductor layer, a gate electrode, and a gate line; and can provide the resultant SGT structure.

A method for producing a semiconductor device according to an embodiment of the present invention includes a first step of forming a fin-shaped semiconductor layer on a semiconductor substrate, and forming a first insulating film around the fin-shaped semiconductor layer; a second step of, after the first step, forming a second insulating film around the fin-shaped semiconductor layer, depositing a first polysilicon on the second insulating film and planarizing the first polysilicon, forming a third insulating film on the first polysilicon, forming a second resist for forming a gate line and a pillar-shaped semiconductor layer, in a direction perpendicular to a direction the fin-shaped in which the semiconductor layer extends, etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film and planarizing the second polysilicon, performing etch back to expose the first hard mask, depositing a sixth insulating film, etching the sixth insulating film to form a second hard mask on a side wall of the first hard mask, and etching the second polysilicon so as to be left on side walls of the first dummy gate and the pillar-shaped semiconductor layer to form a second dummy gate. As a result, two masks are used to form the fin-shaped semiconductor layer, the pillar-shaped semiconductor layer, and the first dummy gate and the second dummy gate that are to provide a gate electrode and a gate line. Thus, the number of steps can be reduced.

The method further includes forming a fifth insulating film around the second dummy gate, etching the fifth insulating film so as to have a sidewall shape to form a sidewall formed of the fifth insulating film. Thus, the first dummy gate and the second dummy gate are covered by the first and second hard masks and the sidewall formed of the fifth insulating film, so that an upper portion of the fin-shaped semiconductor layer alone can be exposed. As a result, the first epitaxially grown layer can be formed only on the fin-shaped semiconductor layer, to thereby achieve a decrease in the parasitic resistance. The first and second hard masks and the sidewall formed of the fifth insulating film prevent formation of a metal-semiconductor compound on the first and second dummy gates and enable formation of a metal-semiconductor compound only on the first epitaxially grown layer on the fin-shaped semiconductor layer.

The second polysilicon may be etched so as to have an inversely tapering shape, so that the second dummy gate has a top surface and a bottom surface, the top surface having a larger area than the bottom surface. As a result, when metal is deposited to fill the hole for forming a gate, the hole is prevented from being partially unfilled.

The misalignment between the pillar-shaped semiconductor layer and the gate line can be eliminated.

An existing metal-gate last process can be employed in which a first dummy gate and a second dummy gate are formed of polysilicon; an interlayer insulating film is then deposited; chemical mechanical polishing is then performed to expose the first dummy gate and the second dummy gate; the polysilicon gates are etched; and metal is then deposited. Thus, metal-gate SGTs can be easily formed.

The gate insulating film formed around and under the gate electrode and the gate line enables insulation of the gate electrode and the gate line from the pillar-shaped semiconductor layer and the fin-shaped semiconductor layer.

BRIEF DESCRIPTION OF THE SEVERAL VIEWS OF THE DRAWING

FIG. 1A is a plan view of a semiconductor device according to an embodiment of the present invention; FIG. 1B is a sectional view taken along line x-x' in FIG. 1A; FIG. 1C is a sectional view taken along line y-y' in FIG. 1A; and FIG. 1D is a sectional view taken along line y2-y2' in FIG. 1A.

FIG. 2A is a plan view for explaining a method for producing a semiconductor device according to an embodiment of the present invention; FIG. 2B is a sectional view taken along line x-x' in FIG. 2A; and FIG. 2C is a sectional view taken along line y-y' in FIG. 2A.

FIG. 3A is a plan view for explaining a method for producing a semiconductor device according to an embodiment of the present invention; FIG. 3B is a sectional view taken along line x-x' in FIG. 3A; and FIG. 3C is a sectional view taken along line y-y' in FIG. 3A.

FIG. 4A is a plan view for explaining a method for producing a semiconductor device according to an embodiment of the present invention; FIG. 4B is a sectional view taken along line x-x' in FIG. 4A; and FIG. 4C is a sectional view taken along line y-y' in FIG. 4A.

FIG. 5A is a plan view for explaining a method for producing a semiconductor device according to an embodiment of the present invention; FIG. 5B is a sectional view taken along line x-x' in FIG. 5A; and FIG. 5C is a sectional view taken along line y-y' in FIG. 5A.

FIG. 6A is a plan view for explaining a method for producing a semiconductor device according to an embodiment of the present invention; FIG. 6B is a sectional view taken along line x-x' in FIG. 6A; and FIG. 6C is a sectional view taken along line y-y' in FIG. 6A.

FIG. 7A is a plan view for explaining a method for producing a semiconductor device according to an embodiment of the present invention; FIG. 7B is a sectional view taken along line x-x' in FIG. 7A; and FIG. 7C is a sectional view taken along line y-y' in FIG. 7A.

FIG. 10A is a plan view for explaining a method for producing a semiconductor device according to an embodiment of the present invention; FIG. 10B is a sectional view taken along line x-x' in FIG. 10A; and FIG. 10C is a sectional view taken along line y-y' in FIG. 10A.

FIG. 11A is a plan view for explaining a method for producing a semiconductor device according to an embodiment of the present invention; FIG. 11B is a sectional view taken along line x-x' in FIG. 11A; and FIG. 11C is a sectional view taken along line y-y' in FIG. 11A.

FIG. 12A is a plan view for explaining a method for producing a semiconductor device according to an embodiment of the present invention; FIG. 12B is a sectional view taken along line x-x' in FIG. 12A; and FIG. 12C is a sectional view taken along line y-y' in FIG. 12A.

FIG. 13A is a plan view for explaining a method for producing a semiconductor device according to an embodiment of the present invention; FIG. 13B is a sectional view taken along line x-x' in FIG. 13A; and FIG. 13C is a sectional view taken along line y-y' in FIG. 13A.

FIG. 14A is a plan view for explaining a method for producing a semiconductor device according to an embodiment of the present invention; FIG. 14B is a sectional view taken along line x-x' in FIG. 14A; and FIG. 14C is a sectional view taken along line y-y' in FIG. 14A.

FIG. 15A is a plan view for explaining a method for producing a semiconductor device according to an embodiment of the present invention; FIG. 15B is a sectional view taken along line x-x' in FIG. 15A; and FIG. 15C is a sectional view taken along line y-y' in FIG. 15A.

FIG. 16A is a plan view for explaining a method for producing a semiconductor device according to an embodiment of the present invention; FIG. 16B is a sectional view taken along line x-x' in FIG. 16A; and FIG. 16C is a sectional view taken along line y-y' in FIG. 16A.

FIG. 17A is a plan view for explaining a method for producing a semiconductor device according to an embodiment of the present invention; FIG. 17B is a sectional view taken along line x-x' in FIG. 17A; and FIG. 17C is a sectional view taken along line y-y' in FIG. 17A.

FIG. 18A is a plan view for explaining a method for producing a semiconductor device according to an embodiment of the present invention; FIG. 18B is a sectional view taken along line x-x' in FIG. 18A; and FIG. 18C is a sectional view taken along line y-y' in FIG. 18A.

FIG. 20A is a plan view for explaining a method for producing a semiconductor device according to an embodiment of the present invention; FIG. 20B is a sectional view taken along line x-x' in FIG. 20A; and FIG. 20C is a sectional view taken along line y-y' in FIG. 20A.

FIG. 21A is a plan view for explaining a method for producing a semiconductor device according to an embodiment of the present invention; FIG. 21B is a sectional view taken along line x-x' in FIG. 21A; and FIG. 21C is a sectional view taken along line y-y' in FIG. 21A.

FIG. 22A is a plan view for explaining a method for producing a semiconductor device according to an embodiment of the present invention; FIG. 22B is a sectional view taken along line x-x' in FIG. 22A; and FIG. 22C is a sectional view taken along line y-y' in FIG. 22A.

FIG. 23A is a plan view for explaining a method for producing a semiconductor device according to an embodiment of the present invention; FIG. 23B is a sectional view taken along line x-x' in FIG. 23A; and FIG. 23C is a sectional view taken along line y-y' in FIG. 23A.

FIG. 24A is a plan view for explaining a method for producing a semiconductor device according to an embodiment of the present invention; FIG. 24B is a sectional view taken along line x-x' in FIG. 24A; and FIG. 24C is a sectional view taken along line y-y' in FIG. 24A.

FIG. 25A is a plan view for explaining a method for producing a semiconductor device according to an embodiment of the present invention; FIG. 25B is a sectional view taken along line x-x' in FIG. 25A; FIG. 25C is a sectional view taken along line y-y' in FIG. 25A; and FIG. 25D is a sectional view taken along line y2-y2' in FIG. 25A.

FIG. 26A is a plan view for explaining a method for producing a semiconductor device according to an embodiment of the present invention; FIG. 26B is a sectional view taken along line x-x' in FIG. 26A; FIG. 26C is a sectional view taken along line y-y' in FIG. 26A; and FIG. 26D is a sectional view taken along line y2-y2' in FIG. 26A.

FIG. 27A is a plan view for explaining a method for producing a semiconductor device according to an embodiment of the present invention; FIG. 27B is a sectional view taken along line x-x' in FIG. 27A; FIG. 27C is a sectional view taken along line y-y' in FIG. 27A; and FIG. 27D is a sectional view taken along line y2-y2' in FIG. 27A.

FIG. 28A is a plan view for explaining a method for producing a semiconductor device according to an embodiment of the present invention; FIG. 28B is a sectional view taken along line x-x' in FIG. 28A; FIG. 28C is a sectional view taken along line y-y' in FIG. 28A; and FIG. 28D is a sectional view taken along line y2-y2' in FIG. 28A.

FIG. 29A is a plan view for explaining a method for producing a semiconductor device according to an embodiment of the present invention; FIG. 29B is a sectional view taken along line x-x' in FIG. 29A; FIG. 29C is a sectional view taken along line y-y' in FIG. 29A; and FIG. 29D is a sectional view taken along line y2-y2' in FIG. 29A.

FIG. 30A is a plan view for explaining a method for producing a semiconductor device according to an embodiment of the present invention; FIG. 30B is a sectional view taken along line x-x' in FIG. 30A; FIG. 30C is a sectional view taken along line y-y' in FIG. 30A; and FIG. 30D is a sectional view taken along line y2-y2' in FIG. 30A.

FIG. 31A is a plan view for explaining a method for producing a semiconductor device according to an embodiment of the present invention; FIG. 31B is a sectional view taken along line x-x' in FIG. 31A; FIG. 31C is a sectional view taken along line y-y' in FIG. 31A; and FIG. 31D is a sectional view taken along line y2-y2' in FIG. 31A.

FIG. 32A is a plan view for explaining a method for producing a semiconductor device according to an embodiment of the present invention; FIG. 32B is a sectional view taken along line x-x' in FIG. 32A; FIG. 32C is a sectional view taken along line y-y' in FIG. 32A; and FIG. 32D is a sectional view taken along line y2-y2' in FIG. 32A.

FIG. 33A is a plan view for explaining a method for producing a semiconductor device according to an embodiment of the present invention; FIG. 33B is a sectional view taken along line x-x' in FIG. 33A; FIG. 33C is a sectional view taken along line y-y' in FIG. 33A; and FIG. 33D is a sectional view taken along line y2-y2' in FIG. 33A.

FIG. 34A is a plan view for explaining a method for producing a semiconductor device according to an embodiment of the present invention; FIG. 34B is a sectional view taken along line x-x' in FIG. 34A; FIG. 34C is a sectional view taken along line y-y' in FIG. 34A; and FIG. 34D is a sectional view taken along line y2-y2' in FIG. 34A.

FIG. 35A is a plan view for explaining a method for producing a semiconductor device according to an embodiment of the present invention; FIG. 35B is a sectional view taken along line x-x' in FIG. 35A; FIG. 35C is a sectional view taken along line y-y' in FIG. 35A; and FIG. 35D is a sectional view taken along line y2-y2' in FIG. 35A.

FIG. 36A is a plan view for explaining a method for producing a semiconductor device according to an embodiment of the present invention; FIG. 36B is a sectional view taken along line x-x' in FIG. 36A; FIG. 36C is a sectional view taken along line y-y' in FIG. 36A; and FIG. 36D is a sectional view taken along line y2-y2' in FIG. 36A.

FIG. 39A is a plan view for explaining a method for producing a semiconductor device according to an embodiment of the present invention; FIG. 39B is a sectional view taken along line x-x' in FIG. 39A; FIG. 39C is a sectional view taken along line y-y' in FIG. 39A; and FIG. 39D is a sectional view taken along line y2-y2' in FIG. 39A.

FIG. 40A is a plan view for explaining a method for producing a semiconductor device according to an embodiment of the present invention; FIG. 40B is a sectional view taken along line x-x' in FIG. 40A; FIG. 40C is a sectional view taken along line y-y' in FIG. 40A; and FIG. 40D is a sectional view taken along line y2-y2' in FIG. 40A.

FIG. 41A is a plan view for explaining a method for producing a semiconductor device according to an embodiment of the present invention; FIG. 41B is a sectional view taken along line x-x' in FIG. 41A; FIG. 41C is a sectional view taken along line y-y' in FIG. 41A; and FIG. 41D is a sectional view taken along line y2-y2' in FIG. 41A.

FIG. 42A is a plan view for explaining a method for producing a semiconductor device according to an embodiment of the present invention; FIG. 42B is a sectional view taken along line x-x' in FIG. 42A; FIG. 42C is a sectional view taken along line y-y' in FIG. 42A; and FIG. 42D is a sectional view taken along line y2-y2' in FIG. 42A.

FIG. 43A is a plan view for explaining a method for producing a semiconductor device according to an embodiment of the present invention; FIG. 43B is a sectional view taken along line x-x' in FIG. 43A; FIG. 43C is a sectional view taken along line y-y' in FIG. 43A; and FIG. 43D is a sectional view taken along line y2-y2' in FIG. 43A.

FIG. 44A is a plan view for explaining a method for producing a semiconductor device according to an embodiment of the present invention; FIG. 44B is a sectional view taken along line x-x' in FIG. 44A; FIG. 44C is a sectional view taken along line y-y' in FIG. 44A; and FIG. 44D is a sectional view taken along line y2-y2' in FIG. 44A.

FIG. 45A is a plan view for explaining a method for producing a semiconductor device according to an embodiment of the present invention; FIG. 45B is a sectional view taken along line x-x' in FIG. 45A; FIG. 45C is a sectional view taken along line y-y' in FIG. 45A; and FIG. 45D is a sectional view taken along line y2-y2' in FIG. 45A.

FIG. 46A is a plan view for explaining a method for producing a semiconductor device according to an embodiment of the present invention; FIG. 46B is a sectional view taken along line x-x' in FIG. 46A; FIG. 46C is a sectional view taken along line y-y' in FIG. 46A; and FIG. 46D is a sectional view taken along line y2-y2' in FIG. 46A.

FIG. 47A is a plan view for explaining a method for producing a semiconductor device according to an embodiment of the present invention; FIG. 47B is a sectional view taken along line x-x' in FIG. 47A; FIG. 47C is a sectional view taken along line y-y' in FIG. 47A; and FIG. 47D is a sectional view taken along line y2-y2' in FIG. 47A.

DETAILED DESCRIPTION OF THE INVENTION

Figure 8A:
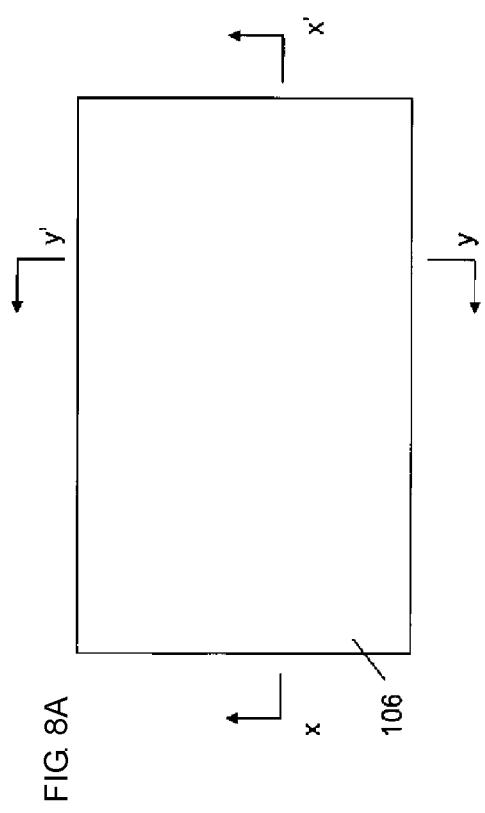
FIG. 8A is a plan view for explaining a method for producing a semiconductor device according to an embodiment of the present invention.

Hereinafter, production steps for forming an SGT structure according to an embodiment of the present invention will be described with reference to FIGS. 2A to 47D.

A first step will be first described, the first step including forming a fin-shaped semiconductor layer on a semiconductor substrate, and forming a first insulating film around the fin-shaped semiconductor layer. This embodiment employs a silicon substrate; alternatively, substrates formed of semiconductors other than silicon may be employed.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In this case, the resist is used as a mask to form the fin-shaped silicon layer; alternatively, a hard mask such as an oxide film or a nitride film may be used.

As illustrated in FIGS. 4A to 4C, the first resist 102 is removed.

As illustrated in FIGS. 5A to 5C, a first insulating film 104 is deposited around the fin-shaped silicon layer 103. As the first insulating film, an oxide film formed with high-density plasma or an oxide film formed by low-pressure CVD (Chemical Vapor Deposition) may be employed.

As illustrated in FIGS. 6A to 6C, the first insulating film 104 is subjected to etch back to expose an upper portion of the fin-shaped silicon layer 103. The procedures having been described are the same as the production method of a fin-shaped silicon layer described in IEDM2010 C C. Wu, et. al, 27.1.1-27.1.4.

Thus, the first step has been described, the first step including forming the fin-shaped silicon layer 103 on the silicon substrate 101, and forming the first insulating film 104 around the fin-shaped silicon layer 103.

Hereafter, a second step will be described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, in a direction perpendicular to a direction the fin-shaped in which the semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

As illustrated in FIGS. 7A to 7C, a second insulating film 105 is formed around the fin-shaped silicon layer 103. The second insulating film 105 is preferably an oxide film. Alternatively, the second insulating film 105 may be a nitride film.

Figure 8B:
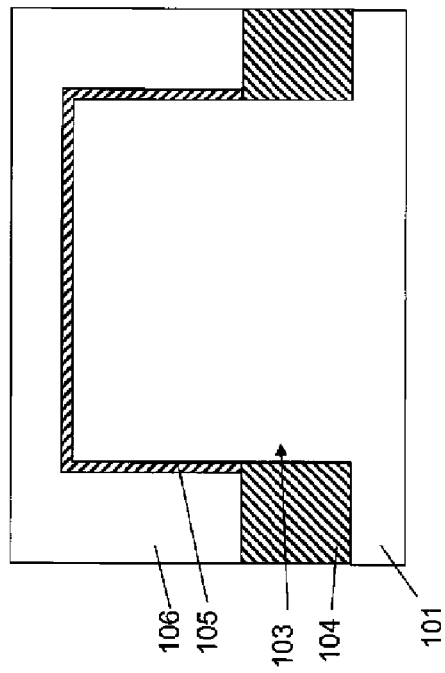
FIG. 8B is a sectional view taken along line x-x' in FIG. 8A.
Figure 8C:
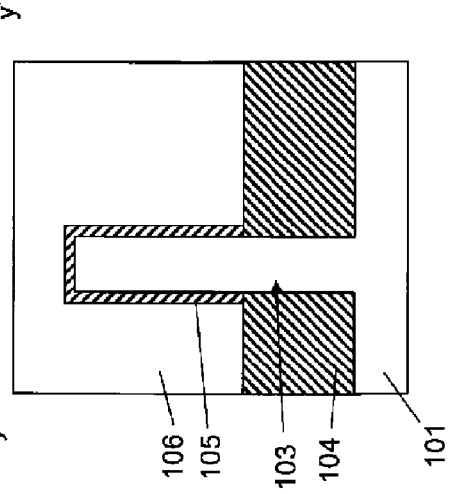
FIG. 8C is a sectional view taken along line y-y' in FIG. 8A.

As illustrated in FIGS. 8A to 8C, a first polysilicon 106 is deposited on the second insulating film 105 and planarized.

Figure 9C:
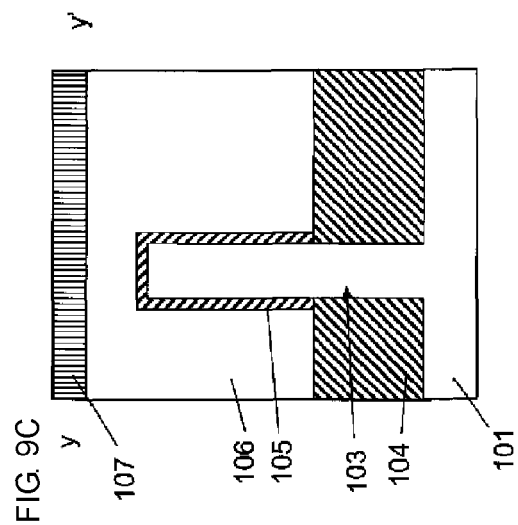
FIG. 9C is a sectional view taken along line y-y' in FIG. 9A.
Figure 9A:
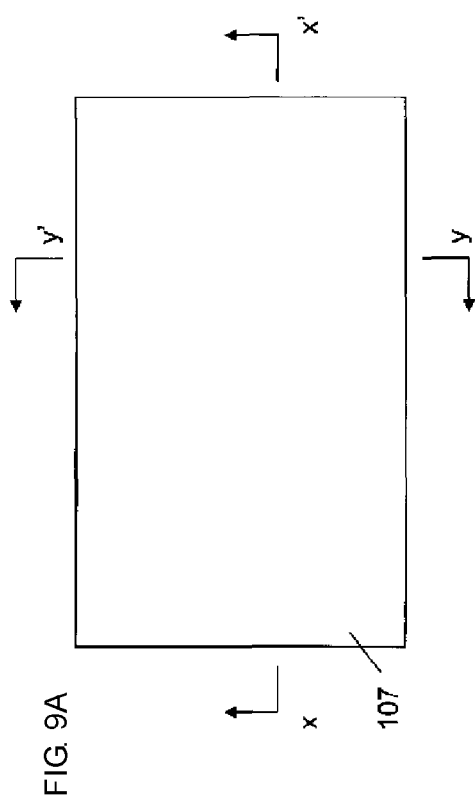
FIG. 9A is a plan view for explaining a method for producing a semiconductor device according to an embodiment of the present invention.
Figure 9B:
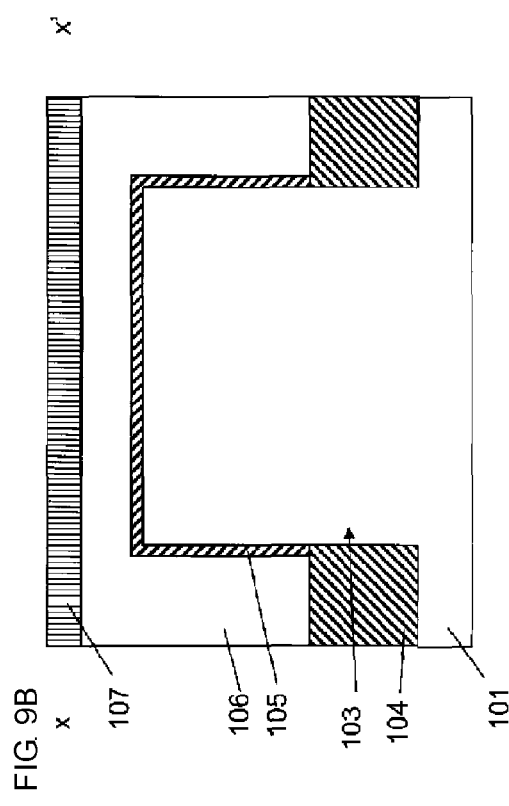
FIG. 9B is a sectional view taken along line x-x' in FIG. 9A.

As illustrated in FIGS. 9A to 9C, a third insulating film 107 is formed on the first polysilicon 106. The third insulating film 107 is preferably a nitride film.

As illustrated in FIGS. 10A to 10C, a second resist 108 for forming a gate line and a pillar-shaped silicon layer is formed in a direction perpendicular to the direction of the fin-shaped silicon layer 103. Alternatively, a hard mask may be employed instead of the second resist 108.

As illustrated in FIGS. 11A to 11C, the third insulating film 107, the first polysilicon 106, the second insulating film 105, and the fin-shaped silicon layer 103 are etched to form a pillar-shaped silicon layer 109, a first dummy gate 106a formed of the first polysilicon, and a first hard mask 107a formed of the third insulating film.

As illustrated in FIGS. 12A to 12C, the second resist 108 is removed.

Thus, the second step has been described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, in a direction perpendicular to a direction the fin-shaped in which the semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

Hereafter, a third step will be described, the third step including, after the second step, forming a fourth insulating film around the pillar-shaped semiconductor layer and the first dummy gate, depositing a second polysilicon around the fourth insulating film, planarizing the second polysilicon, performing etch back to expose the first hard mask, depositing a sixth insulating film, etching the sixth insulating film to form a second hard mask on a side wall of the first hard mask, and etching the second polysilicon so as to be left on side walls of the first dummy gate and the pillar-shaped semiconductor layer to form a second dummy gate.

As illustrated in FIGS. 13A to 13C, a fourth insulating film 110 is formed around the pillar-shaped silicon layer 109 and the first dummy gate 106a. The fourth insulating film 110 is preferably an oxide film. Alternatively, the fourth insulating film 110 may be a nitride film.

As illustrated in FIGS. 14A to 14C, a third resist 111 is formed and etch back is performed to expose the upper portion of the pillar-shaped silicon layer 109. As the third resist 111, an organic material or an inorganic material may be employed.

As illustrated in FIGS. 15A to 15C, an impurity is introduced to form a first diffusion layer 112 in an upper portion of the pillar-shaped silicon layer 109. In the case of forming an n-type diffusion layer, arsenic or phosphorus is preferably introduced. In the case of forming a p-type diffusion layer, boron is preferably introduced.

As illustrated in FIGS. 16A to 16C, the third resist 111 is removed.

As illustrated in FIGS. 17A to 17C, a second polysilicon 113 is deposited around the fourth insulating film 110 and planarized.

As illustrated in FIGS. 18A to 18C, the second polysilicon 113 is subjected to etch back to expose the first hard mask 107a.

Figure 19A:
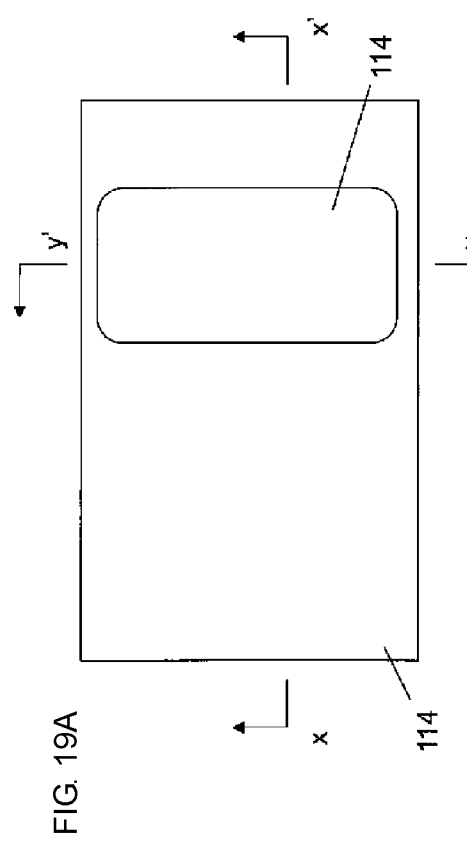
FIG. 19A is a plan view for explaining a method for producing a semiconductor device according to an embodiment of the present invention.
Figure 19C:
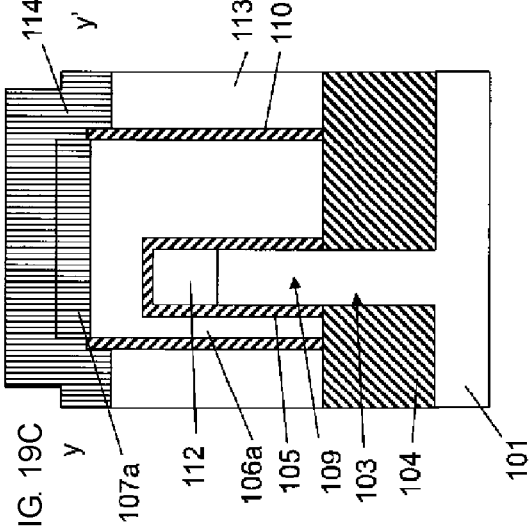
FIG. 19C is a sectional view taken along line y-y' in FIG. 19A.
Figure 19B:
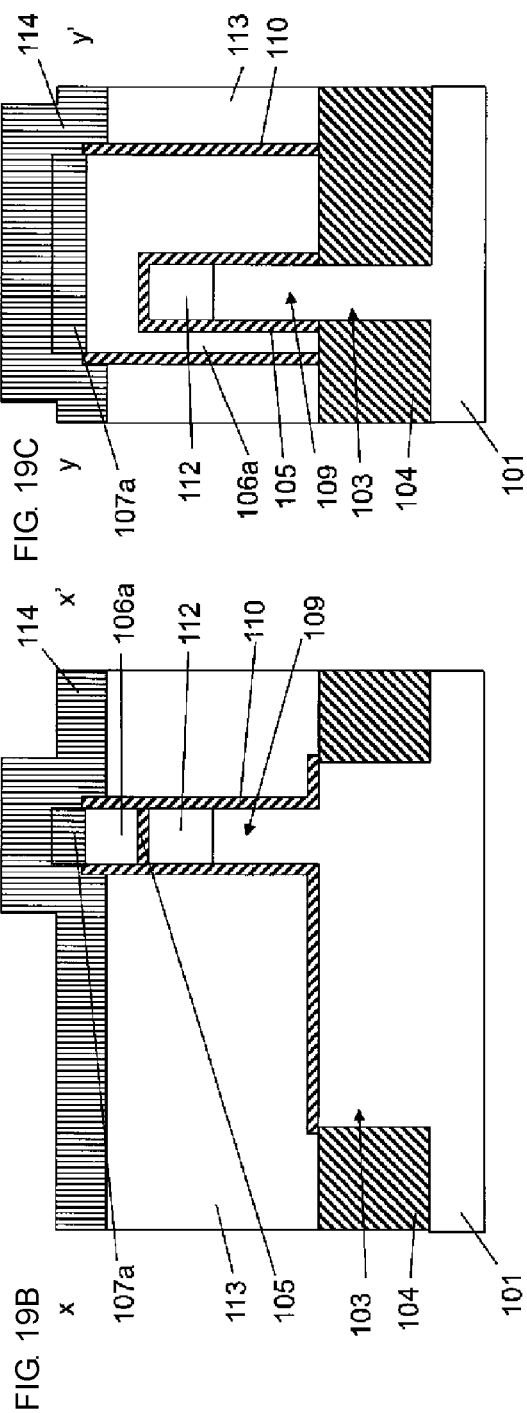
FIG. 19B is a sectional view taken along line x-x' in FIG. 19A.
Figure 37A:
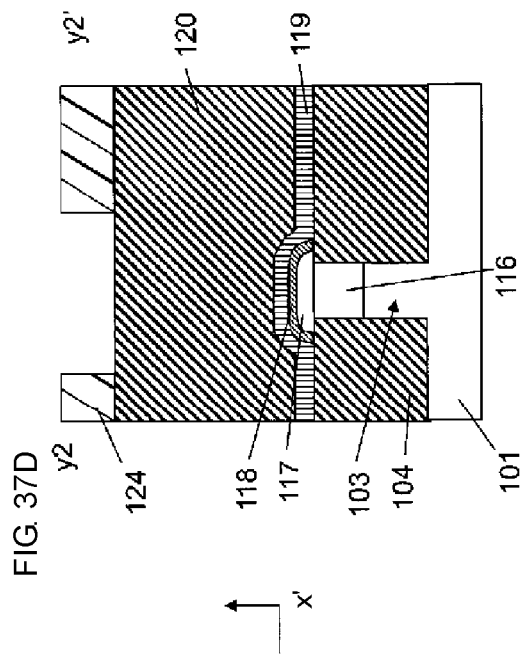
FIG. 37A is a plan view for explaining a method for producing a semiconductor device according to an embodiment of the present invention.
Figure 37D:
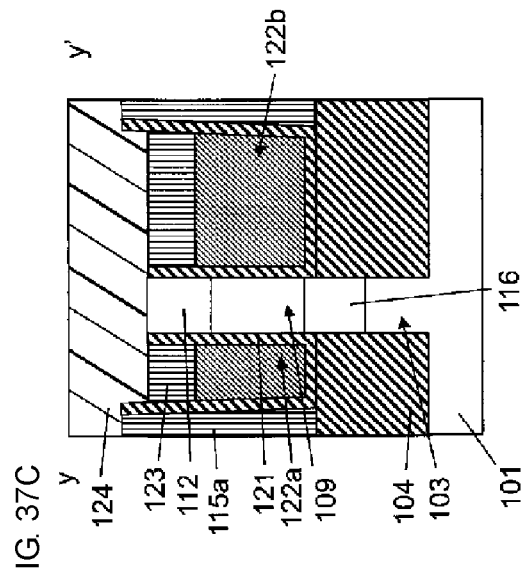
FIG. 37D is a sectional view taken along line y2-y2' in FIG. 37A.
Figure 37B:
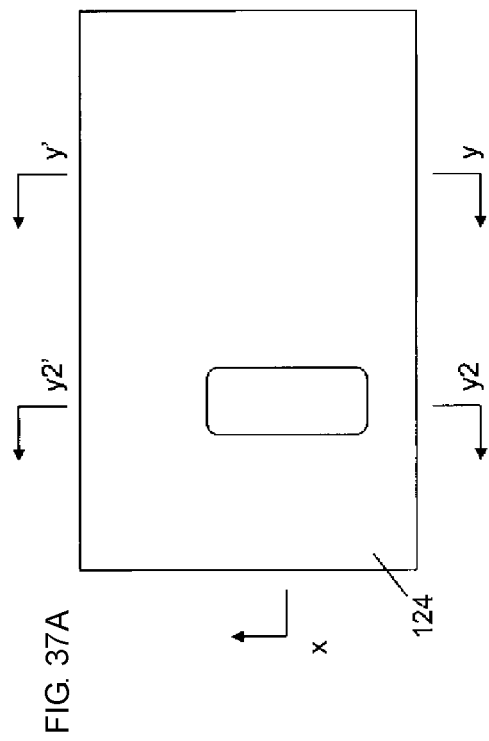
FIG. 37B is a sectional view taken along line x-x' in FIG. 37A.
Figure 37C:
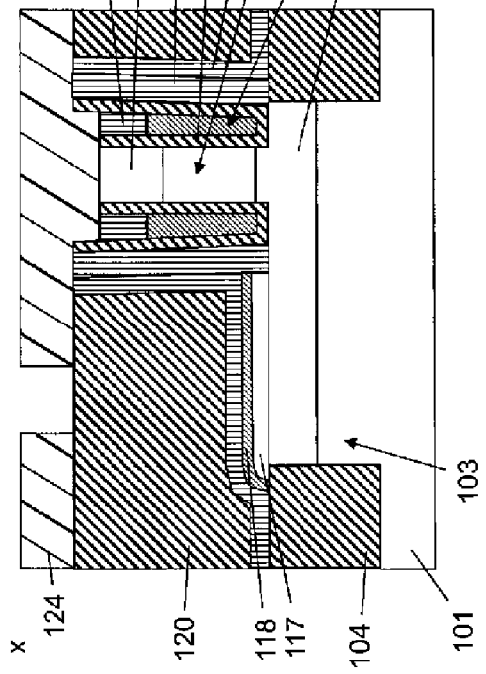
FIG. 37C is a sectional view taken along line y-y' in FIG. 37A.
Figure 38A:
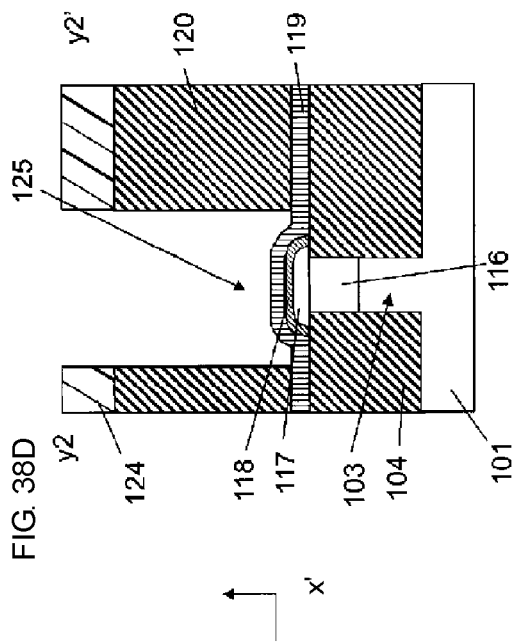
FIG. 38A is a plan view for explaining a method for producing a semiconductor device according to an embodiment of the present invention.
Figure 38D:
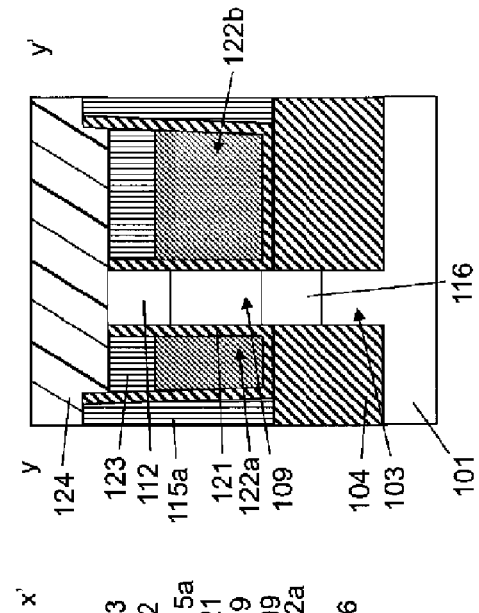
FIG. 38D is a sectional view taken along line y2-y2' in FIG. 38A.
Figure 38B:
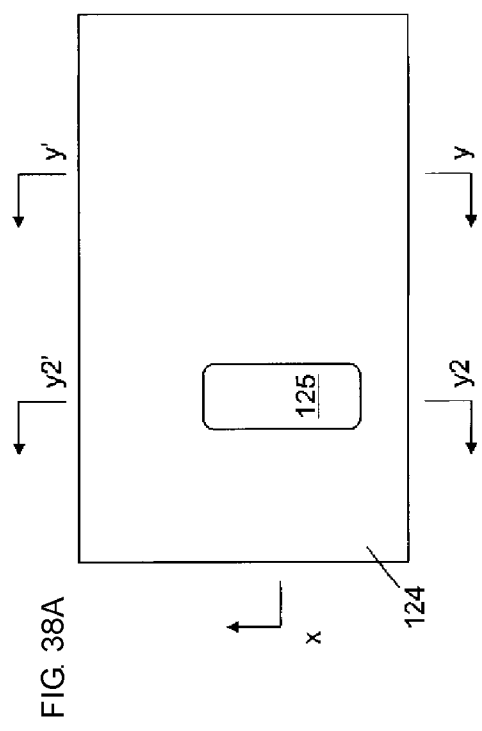
FIG. 38B is a sectional view taken along line x-x' in FIG. 38A.
Figure 38C:
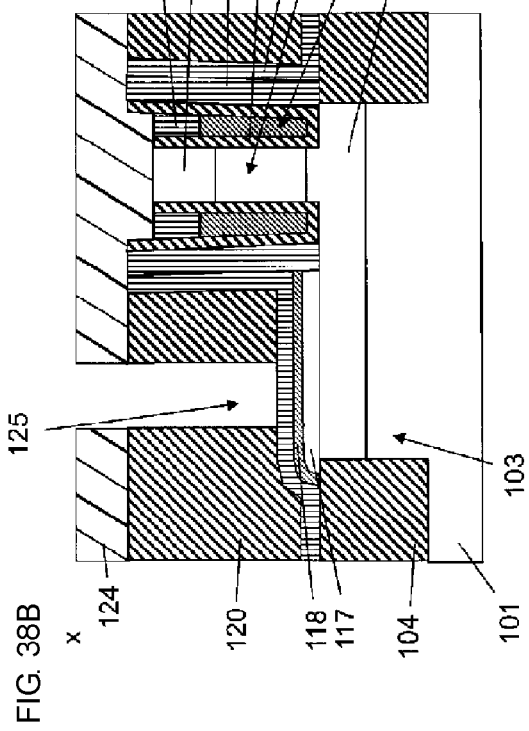
FIG. 38C is a sectional view taken along line y-y' in FIG. 38A.

As illustrated in FIGS. 19A to 19C, a sixth insulating film 114 is deposited. The sixth insulating film 114 is preferably a nitride film.

As illustrated in FIGS. 20A to 20C, the sixth insulating film 114 is etched to form a second hard mask 114a on the side wall of the first hard mask 107a.

As illustrated in FIGS. 21A to 21C, the second polysilicon 113 is etched so as to be left on the side walls of the first dummy gate 106a and the pillar-shaped semiconductor layer 109 to form a second dummy gate 113a. The second polysilicon 113 is etched so as to have an inversely tapering shape, so that the second dummy gate 113a has a top surface and a bottom surface, the top surface having a larger area than the bottom surface. As a result, when metal is deposited to fill the hole for forming a gate, the hole is prevented from being partially unfilled.

Thus, the third step has been described, the third step including, after the second step, forming a fourth insulating film around the pillar-shaped semiconductor layer and the first dummy gate, depositing a second polysilicon around the fourth insulating film, planarizing the second polysilicon, performing etch back to expose the first hard mask, depositing a sixth insulating film, etching the sixth insulating film to form a second hard mask on a side wall of the first hard mask, and etching the second polysilicon so as to be left on side walls of the first dummy gate and the pillar-shaped semiconductor layer to form a second dummy gate.

Hereafter, a fourth step will be described, the fourth step including forming a fifth insulating film around the second dummy gate, etching the fifth insulating film so as to have a sidewall shape to form a sidewall formed of the fifth insulating film, and forming a first epitaxially grown layer on the fin-shaped semiconductor layer.

As illustrated in FIGS. 22A to 22C, a fifth insulating film 115 is formed around the second dummy gate 113a. The fifth insulating film 115 is preferably a nitride film. Alternatively, the fifth insulating film 115 may have a multilayer structure of an oxide film and a nitride film.

As illustrated in FIGS. 23A to 23C, the fifth insulating film 115 is etched so as to have a sidewall shape to form a sidewall 115a formed of the fifth insulating film.

As illustrated in FIGS. 24A to 24C, an impurity is introduced to form a second diffusion layer 116 in an upper portion of the fin-shaped silicon layer 103 and a lower portion of the pillar-shaped silicon layer 109. In the case of forming an n-type diffusion layer, arsenic or phosphorus is preferably introduced. In the case of forming a p-type diffusion layer, boron is preferably introduced.

As illustrated in FIGS. 25A to 25D, a selective epitaxial growth is performed to form a first epitaxially grown layer 117 on the fin-shaped semiconductor layer 103. The first epitaxially grown layer 117 is preferably formed of silicon. Alternatively, a silicon-germanium compound layer may be grown. The width of the first epitaxially grown layer 117 in the direction perpendicular to the fin-shaped semiconductor layer 103 is larger than the width of the fin-shaped semiconductor layer 103 in the direction perpendicular to the fin-shaped semiconductor layer 103. The first dummy gate and the second dummy gate are covered by the first and second hard masks and the sidewall formed of the fifth insulating film, so that an upper portion of the fin-shaped semiconductor layer alone can be exposed. As a result, the first epitaxially grown layer can be formed only on the fin-shaped semiconductor layer, to thereby achieve a decrease in the parasitic resistance.

As illustrated in FIGS. 26A to 26D, a metal-semiconductor compound 118 is formed on the first epitaxially grown layer 117. The metal-semiconductor compound 118 may be formed over the entirety of the first epitaxially grown layer 117. The first and second hard masks and the sidewall formed of the fifth insulating film prevent formation of a metal-semiconductor compound on the first and second dummy gates and enable formation of a metal-semiconductor compound only on the first epitaxially grown layer on the fin-shaped semiconductor layer.

Thus, the fourth step has been described, the fourth step including forming a fifth insulating film around the second dummy gate, etching the fifth insulating film so as to have a sidewall shape to form a sidewall formed of the fifth insulating film, and forming a first epitaxially grown layer on the fin-shaped semiconductor layer.

Hereafter, a fifth step will be described, the fifth step including, after the fourth step, depositing a contact stopper film, depositing an interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer and on an inner side of the fifth insulating film, depositing metal, and performing etch back to form a gate electrode and a gate line.

As illustrated in FIGS. 27A to 27D, a contact stopper film 119 is deposited and an interlayer insulating film 120 is deposited. The contact stopper film 119 is preferably a nitride film.

As illustrated in FIGS. 28A to 28D, chemical mechanical polishing is performed to expose upper portions of the second dummy gate 113a and the first dummy gate 106a.

As illustrated in FIGS. 29A to 29D, the second dummy gate 113a and the first dummy gate 106a are removed.

As illustrated in FIGS. 30A to 30D, the second insulating film 105 and the fourth insulating film 110 are removed.

As illustrated in FIGS. 31A to 31D, a gate insulating film 121 is formed around the pillar-shaped silicon layer 109 and on the inner side of the fifth insulating film 115a. The gate insulating film 121 is preferably a high-K dielectric film. Alternatively, the gate insulating film 121 may be an oxide film, an oxynitride film, or a nitride film.

As illustrated in FIGS. 32A to 32D, a metal 122 is deposited.

As illustrated in FIGS. 33A to 33D, the metal 122 is subjected to etch back to expose an upper portion of the pillar-shaped silicon layer 109. As a result, a gate electrode 122a is formed around the pillar-shaped silicon layer 109. Also, a gate line 122b is formed. The gate insulating film 121 formed around and under the gate electrode 122a and the gate line 122b enables insulation of the gate electrode 122a and the gate line 122b from the pillar-shaped silicon layer 109 and the fin-shaped silicon layer 103.

Thus, the fifth step has been described, the fifth step including, after the fourth step, depositing a contact stopper film, depositing an interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer and on an inner side of the fifth insulating film, depositing metal, and performing etch back to form a gate electrode and a gate line.

As illustrated in FIGS. 34A to 34D, a seventh insulating film 123 is deposited. The seventh insulating film 123 is preferably a nitride film.

As illustrated in FIGS. 35A to 35D, the seventh insulating film 123 is subjected to etch back to expose the gate insulating film 121.

As illustrated in FIGS. 36A to 36D, the exposed gate insulating film 121 is removed.

As illustrated in FIGS. 37A to 37D, a fourth resist 124 for forming a contact hole is formed.

As illustrated in FIGS. 38A to 38D, the interlayer insulating film 120 is etched to form a contact hole 125.

As illustrated in FIGS. 39A to 39D, the fourth resist 124 is removed.

As illustrated in FIGS. 40A to 40D, a fifth resist 126 for forming a contact hole is formed.

As illustrated in FIGS. 41A to 41D, the seventh insulating film 123 is etched to form a contact hole 127.

As illustrated in FIGS. 42A to 42D, the fifth resist 126 is removed.

As illustrated in FIGS. 43A to 43D, the contact stopper film 119 below the contact hole 125 is removed.

As illustrated in FIGS. 44A to 44D, a metal 128 is deposited to form contacts 129 and 130.

As illustrated in FIGS. 45A to 45D, sixth resists 131, 132, and 133 for forming metal wires are formed.

As illustrated in FIGS. 46A to 46D, the metal 128 is etched to form metal wires 128a, 128b, and 128c.

As illustrated in FIGS. 47A to 47D, the sixth resists 131, 132, and 133 are removed.

Thus, the method for producing an SGT having structure with a low parasitic resistance, the method employing a gate last process, has been described in which two masks are used to form a fin-shaped semiconductor layer, a pillar-shaped semiconductor layer, a gate electrode, and a gate line.

FIGS. 1A to 1D illustrate the structure of the semiconductor device obtained by the above-described production method.

As illustrated in FIGS. 1A to 1D, the semiconductor device includes a fin-shaped silicon layer 103 formed on a silicon substrate 101, a first insulating film 104 formed around the fin-shaped silicon layer 103, a pillar-shaped silicon layer 109 formed on the fin-shaped silicon layer 103, a gate insulating film 121 formed around the pillar-shaped silicon layer 109, a gate electrode 122a formed around the gate insulating film 121 and formed of metal, a gate line 122b connected to the gate electrode 122a, formed of metal, and extending in a direction perpendicular to the fin-shaped silicon layer 103, and a first epitaxially grown layer 117 formed on the fin-shaped silicon layer 103, wherein the gate electrode 122a has a top surface and a bottom surface, the top surface having a larger area than the bottom surface, the gate line 122b has a top surface and a bottom surface, the top surface having a larger area than the bottom surface, and a width of the first epitaxially grown layer 117 in a direction perpendicular to the fin-shaped silicon layer 103 is larger than a width of the fin-shaped silicon layer 103 in the direction perpendicular to the fin-shaped silicon layer 103.

The semiconductor device further includes a first diffusion layer 112 formed in an upper portion of the pillar-shaped silicon layer 109 and a second diffusion layer 116 formed in an upper portion of the fin-shaped silicon layer 103 and a lower portion of the pillar-shaped silicon layer 109.

The semiconductor device further includes the gate insulating film 121 formed around and under the gate electrode 122a and the gate line 122b.

The first epitaxially grown layer 117 having a larger width than the fin-shaped silicon layer 103 is formed on the fin-shaped silicon layer 103. As a result, the parasitic resistance can be decreased. In addition, the metal-semiconductor compound layer also has an increased width accordingly, to thereby achieve a further decrease in the parasitic resistance. In addition, the area in contact with contacts is increased, to thereby achieve a decrease in the contact resistance with contacts.

Since the pillar-shaped silicon layer 109 and the gate line 122b are formed in a self-alignment manner, misalignment therebetween can be eliminated.

The gate insulating film 121 formed around and under the gate electrode 122a and the gate line 122b enables insulation of the gate electrode 122a and the gate line 122b from the pillar-shaped silicon layer 109 and the fin-shaped silicon layer 103.

Note that the present invention encompasses various embodiments and modifications without departing from the broad spirit and scope of the present invention. The above-described embodiments are used to describe examples of the present invention and do not limit the scope of the present invention.

For example, a method for producing a semiconductor device in which the p-type (including $p^+$ type) and the n-type (including $n^+$ type) in the above-described embodiment are changed to the opposite conductivity types and a semiconductor device produced by this method are obviously within the technical scope of the present invention.

The invention claimed is:

1. A method for producing a semiconductor device, the method comprising:
    a first step of forming a fin-shaped semiconductor layer on a semiconductor substrate, and forming a first insulating film around the fin-shaped semiconductor layer;
    a second step, after the first step, of forming a second insulating film around the fin-shaped semiconductor layer, depositing a first polysilicon on the second insulating film and planarizing the first polysilicon, forming a third insulating film on the first polysilicon, forming a second resist for forming a gate line and a pillar-shaped semiconductor layer, in a direction perpendicular to a direction the fin-shaped in which the semiconductor layer extends, etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film;
    a third step, after the second step, of forming a fourth insulating film around the pillar-shaped semiconductor layer and the first dummy gate, depositing a second polysilicon around the fourth insulating film and planarizing the second polysilicon, performing etch back to expose the first hard mask, depositing a sixth insulating film, etching the sixth insulating film to form a second hard mask on a side wall of the first hard mask, and etching the second polysilicon so as to be left on side walls of the first dummy gate and the pillar-shaped semiconductor layer to form a second dummy gate; and
    a fourth step of forming a fifth insulating film around the second dummy gate, etching the fifth insulating film so as to have a sidewall shape to form a sidewall formed of the fifth insulating film, and forming a first epitaxially grown layer on the fin-shaped semiconductor layer.

2. The method for producing a semiconductor device according to claim 1, wherein the second dummy gate has a top surface and a bottom surface, and the top surface has a larger area than the bottom surface.

3. The method for producing a semiconductor device according to claim 1, further comprising, after forming the fourth insulating film around the pillar-shaped semiconductor layer and the first dummy gate, forming a third resist, performing etch back to expose an upper portion of the pillar-shaped semiconductor layer, and forming a first diffusion layer in an upper portion of the pillar-shaped semiconductor layer.

4. The method for producing a semiconductor device according to claim 1, further comprising, after forming the sidewall formed of the fifth insulating film, forming a second diffusion layer in an upper portion of the fin-shaped semiconductor layer and a lower portion of the pillar-shaped semiconductor layer.

5. The method for producing a semiconductor device according to claim 1, further comprising forming a metal-semiconductor compound on the first epitaxially grown layer.

6. The method for producing a semiconductor device according to claim 1, further comprising a fifth step, after the fourth step, of depositing a contact stopper film, depositing an interlayer insulating film, performing chemical mechanical polishing to expose upper portions of the second dummy gate and the first dummy gate, removing the second dummy gate and the first dummy gate, removing the second insulating film and the fourth insulating film, forming a gate insulating film around the pillar-shaped semiconductor layer and on an inner side of the fifth insulating film, depositing metal, and performing etch back to form a gate electrode and a gate line.

7. A semiconductor device, comprising:
   a fin-shaped semiconductor layer formed on a semiconductor substrate;
   a pillar-shaped semiconductor layer formed on the fin-shaped semiconductor layer;
   a gate insulating film formed around the pillar-shaped semiconductor layer;
   a gate electrode of metal formed around the gate insulating film;
   a gate line formed of metal connected to the gate electrode; and
   a first epitaxially grown layer formed on the fin-shaped semiconductor layer,
   wherein the gate electrode and the gate line have a top surface and a bottom surface, the top surface having a larger area than the bottom surface, and a width of the first epitaxially grown layer in a direction perpendicular to the fin-shaped semiconductor layer is greater than a width of the fin-shaped semiconductor layer in the direction perpendicular to the fin-shaped semiconductor layer.

8. The semiconductor device according to claim 7, which further comprises a first insulating film formed around the fin-shaped semiconductor layer, and wherein said gate line of metal extends in a direction perpendicular to the fin-shaped semiconductor layer.

9. The semiconductor device according to claim 8, further comprising:
   a first diffusion layer formed in an upper portion of the pillar-shaped semiconductor layer; and
   a second diffusion layer formed in an upper portion of the fin-shaped semiconductor layer and a lower portion of the pillar-shaped semiconductor layer.

10. The semiconductor device according to claim 8, wherein the gate insulating film is also formed around and under the gate electrode and the gate line.

\* \* \* \* \*